United States Patent
Qian et al.

(10) Patent No.: US 10,567,004 B2
(45) Date of Patent: Feb. 18, 2020

(54) METHOD AND APPARATUS FOR CONSTRUCTING INTERLEAVING SEQUENCE IN A WIRELESS COMMUNICATION SYSTEM

(71) Applicant: Samsung Electronics Co., Ltd., Suwon-si, Gyeonggi-do (KR)

(72) Inventors: Chen Qian, Beijing (CN); Bin Yu, Beijing (CN); Chenxi Hao, Beijing (CN); Qi Xiong, Beijing (CN); Jingxing Fu, Beijing (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 43 days.

(21) Appl. No.: 15/680,093

(22) Filed: Aug. 17, 2017

(65) Prior Publication Data

US 2018/0054219 A1 Feb. 22, 2018

(30) Foreign Application Priority Data

Aug. 17, 2016 (CN) .......................... 2016 1 0683370

(51) Int. Cl.
*H03M 13/27* (2006.01)
*H03M 13/00* (2006.01)
*H04L 1/00* (2006.01)

(52) U.S. Cl.
CPC ... *H03M 13/2746* (2013.01); *H03M 13/2789* (2013.01); *H03M 13/6561* (2013.01);
(Continued)

(58) Field of Classification Search
CPC .. H04L 5/0073; H04L 1/0071; H04W 74/002; H04N 21/64322; H03M 13/2746;
(Continued)

(56) References Cited

U.S. PATENT DOCUMENTS

| | | | | |
|---|---|---|---|---|
| 4,047,013 A | * | 9/1977 | Milewski | .......... H04L 25/03038 333/166 |
| 8,447,708 B2 | * | 5/2013 | Sabe | .................... G06N 99/005 706/12 |

(Continued)

OTHER PUBLICATIONS

International Search Report and Written Opinion regarding International Application No. PCT/KR2017/008943, dated Dec. 5, 2017, 10 pages.

(Continued)

*Primary Examiner* — Phung M Chung

(57) ABSTRACT

The present disclosure relates to a pre-5th-Generation (5G) or 5G communication system to be provided for supporting higher data rates Beyond 4th-Generation (4G) communication system such as Long Term Evolution (LTE). Method and apparatus for interleaving is provided. The method includes the following steps: constructing a plurality of pseudorandom sequences according to a pre-defined length of an interleaving sequence to be constructed; for each of the constructed pseudorandom sequences, constructing at least one corresponding numerical digit random sequence according to a number of more than two types of numerical values in this pseudorandom sequence; and, for each of the constructed pseudorandom sequences and the at least one corresponding numerical digit random sequence thereof, constructing a corresponding interleaving sequence according to a mapping relation between this pseudorandom sequence and the numerical digit random sequence, so that a plurality of interleaving sequences are allocated and indicated as multiple access signatures.

18 Claims, 32 Drawing Sheets

(52) U.S. Cl.
CPC ...... *H03M 13/275* (2013.01); *H03M 13/6508* (2013.01); *H04L 1/0071* (2013.01)

(58) Field of Classification Search
CPC ......... H03M 13/6561; H03M 13/2789; H03M 13/275
See application file for complete search history.

(56) References Cited

U.S. PATENT DOCUMENTS

| | | | | |
|---|---|---|---|---|
| 8,923,249 | B2* | 12/2014 | Kim | H04L 25/03866 370/208 |
| 2005/0154954 | A1 | 7/2005 | Maru | |
| 2009/0110197 | A1 | 4/2009 | Michaels | |
| 2010/0098180 | A1 | 4/2010 | Wennstrom et al. | |
| 2010/0111210 | A1 | 5/2010 | Tsai et al. | |
| 2011/0182421 | A1 | 7/2011 | Lablans | |
| 2016/0323056 | A1* | 11/2016 | Park | H04J 13/0011 |
| 2016/0337159 | A1* | 11/2016 | Seo | H04W 56/002 |
| 2018/0302202 | A1* | 10/2018 | Kim | H04L 5/00 |
| 2018/0309612 | A1* | 10/2018 | Kim | H04W 56/00 |

OTHER PUBLICATIONS

3GPP TR 38.802 V14.1.0 (Jun. 2017), 3rd Generation Partnership Project; Technical Specification Group Radio Access Network; Study on New Radio Access Technology Physical Layer Aspects (Release 14), 143 pages.

International Telecommunication Union, ITU-R Radiocommunication Sector of ITU, Recommendation ITU-R M.2083-0 (Sep. 2015), IMT Vision—Framework and overall objectives of the future development of IMT for 2020 and beyond, M Series, Mobile, radiodetermination, amateur and related satellite services, 21 pages.

International Telecommunicationunion, ITU-R Radiocommunicaiton Sector of ITU, Report ITU-R 11.2320-0 (Nov. 2014), Future technology trends of terrestrial IMT systems, M Series, Mobile, radiodetermination, amateur and related satellite services, 32 pages.

International Telecommunication Union, Radiocommunication Study Groups, Document 5D/TEMP/466-E, Oct. 21, 2014, SWG Traffic, Working Document Towards a Preliminary Draft New Report ITU-R M.[IMT.Beyond2020.Traffic], IMT Traffic estimates beyond year 2020, 35 pages.

Pupeza, Ioachim, et al., "Efficient Generation of Interleavers for IDMA," IEEE Communications Society, IEEE ICC 2006 proceedings, pp. 1508-1513.

* cited by examiner

METHOD AND APPARATUS FOR CONSTRUCTING INTERLEAVING SEQUENCE IN A WIRELESS COMMUNICATION SYSTEM

CROSS-REFERENCE TO RELATED APPLICATION AND CLAIM OF PRIORITY

The present application is related to and claims priority under 35 U.S.C. § 119 to Chinese Patent Application No. 201610683370.9, filed on Aug. 17, 2016, the contents of which are incorporated herein by reference.

TECHNICAL FIELD

The present disclosure relates to wireless communications, and more specifically, relates to a method for constructing an interleaving sequence in a wireless communication system.

BACKGROUND

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

SUMMARY

To address the above-discussed deficiencies, it is a primary object to provide a method for constructing an interleaving sequence, an information processing method based on interleaving, a transmitter and a receiver, in order to solve the high difficulty in standardization of multiple access in the art.

According to a one aspect, an embodiment of the present disclosure provides a method for constructing an interleaving sequence, comprising the following steps of: constructing a plurality of pseudorandom sequences according to a pre-defined length of an interleaving sequence to be constructed; for each of the constructed pseudorandom sequences, constructing at least one corresponding numerical digit random sequence according to the number of more than two types of numerical values in this pseudorandom sequence, the type of numerical values in the numerical digit random sequence being corresponding to that of numerical values in the pseudorandom sequence, and the number of numerical values of a corresponding type being equal; and for each of the constructed pseudorandom sequences and the corresponding numerical digit random sequence thereof, constructing a corresponding interleaving sequence according to a mapping relation between this pseudorandom sequence and the at least one numerical digit random sequence, so that a plurality of interleaving sequences are allocated and indicated as multiple access signatures.

According to another aspect, an embodiment of the present disclosure further provides an information processing method based on interleaving, comprising the following steps of: constructing a plurality of the following sequences according to a pre-defined length of an interleaving sequence to be constructed: interleaving sequences, or a combination of pseudorandom sequences and numerical digit random sequences, the type of numerical values in the numerical digit random sequences corresponding to that of numerical values in the pseudorandom sequences and the number of numerical values of a corresponding type being equal; allocating and then indicating sequence information of the constructed sequences; and processing an information sequence to be transmitted or a received information sequence according to the allocated interleaving sequence or a combination of pseudorandom sequences and numerical digit random sequences.

According to another aspect, an embodiment of the present disclosure further provides an information processing method based on interleaving, comprising the following steps of: receiving sequence information indicated to the present apparatus; constructing an interleaving sequence or a combination of pseudorandom sequences and numerical digit random sequences according to the sequence information, the type of numerical values in the numerical digit random sequences being corresponding to the type of numerical values in the pseudorandom sequences, and the number of numerical values of a corresponding type being equal; and processing a received information sequence or an information sequence to be transmitted according to the constructed interleaving sequence or a combination of pseudorandom sequences and numerical digit random sequences.

Preferably, the sequence information comprises: a pre-defined length of an interleaving sequence, a pre-defined M-ary of a pseudorandom sequence, generator polynomials, and initial states of a shift register; and the sequence information further comprises at least one of the following: the number of cyclic shifts performed on the pseudorandom sequences and/or the interleaving sequences; an arrangement order of numerical values in the numerical digit random sequences; and starting positions from which the pseudorandom sequences are cut out from the original sequences.

Preferably, the constructing an interleaving sequence according to the sequence information specifically comprises: constructing pseudorandom sequences according to the sequence information; constructing corresponding numerical digit random sequences according to the number of numerical values of more than two types in the constructed pseudorandom sequences; and constructing a corresponding interleaving sequence according to a mapping relation between the constructed pseudorandom sequences and the numerical digit random sequences.

Preferably, the constructing pseudorandom sequences according to the sequence information specifically comprises: generating pseudorandom pre-defined M-ary sequences according to the pre-defined M-ary sequences mechanism of the pseudorandom sequences, the generator polynomials and the initial states of the shift register in the sequence information; and using the generated pseudorandom pre-defined M-ary sequences as the constructed pseudorandom sequences; or, determining sequences having the pre-defined length from the generated pseudorandom pre-defined M-ary sequences to serve as the constructed pseudorandom sequences.

Preferably, the information processing method based on interleaving provided further comprises the following steps of: performing cyclic shifts on numerical values in the generated pseudorandom pre-defined M-ary sequences or performing cyclic shifts on numerical values in the constructed pseudorandom sequences, according to the number of cyclic shifts performed on the pseudorandom sequences in the sequence information; or, cutting out sequences having the pre-defined length from corresponding starting positions of the generated pseudorandom pre-defined M-ary sequences, according to the starting positions from which the pseudorandom sequences are cut out from the original sequences in the sequence information; or, adjusting the order of numerical values in the constructed numerical digit random sequences, according to the arrangement order of numerical values in the numerical digit random sequences in the sequence information; or, performing cyclic shifts on numerical values in the constructed interleaving sequence according to the number of cyclic shifts performed on the interleaving sequence in the sequence information.

Preferably, the step of processing a received information sequence or an information sequence to be transmitted according to the constructed interleaving sequence or a combination of pseudorandom sequences and numerical digit random sequences specifically comprises: de-interleaving the received interleaved information sequence according to the constructed interleaving sequence or a combination of pseudorandom sequences and numerical digit random sequences; and/or interleaving the information sequence to be transmitted according to the constructed interleaving sequence or a combination of pseudorandom sequences and numerical digit random sequences.

Preferably, the de-interleaving the received interleaved information sequence according to the constructed interleaving sequence or a combination of pseudorandom sequences and numerical digit random sequences specifically comprises: for one of the constructed pseudorandom sequence and the corresponding numerical digit random sequence thereof, dividing the interleaved information sequence into interleaved information subsequences of a same number as the number of types of numerical values, according to the type and position of numerical values in the one sequence; determining a correspondence between each numerical value type in the other sequence and each interleaved information subsequence; and successively acquiring and outputting numerical values from an interleaved information subsequence corresponding to each numerical value type according to the type and position order of numerical values in the other sequence, to obtain a de-interleaved information sequence.

Preferably, the dividing the interleaved information sequence into interleaved information subsequences of a same number as the number of types of numerical values according to the type and position of numerical values in the one sequence specifically comprises: for each numerical value type in the one sequence, mapping the positions of numerical values of this numerical value type in the one sequence to corresponding positions in the interleaved information sequence; and acquiring numerical values at the corresponding positions one by one according to the order of the corresponding positions in the interleaved information sequence, to form an interleaved information subsequence corresponding to this numerical value type.

Preferably, the successively acquiring and outputting numerical values from an interleaved information subsequence corresponding to each numerical value type according to the type and position order of numerical values in the other sequence specifically comprises: pointing to the last bit from the first bit in the other sequence, determining the type of a numerical value at this position; and then determining an information subsequence corresponding to this numerical value type, and acquiring and outputting a first numerical value which has not been acquired from the information subsequence.

Preferably, the de-interleaving the received interleaved information sequence according to the combination of constructed pseudorandom sequences and numerical digit random sequences further comprises: for one of the constructed pseudorandom sequence and the corresponding numerical digit random sequence thereof, constructing each divided sequence according to the position of each numerical value in the one sequence, each numerical value type of the one sequence being corresponding to one divided sequence, and the number of numerical values of this type being equal to the number of numerical values in the corresponding divided sequence; constructing each combined sequence according to the position of each numerical value in the other sequence, each numerical value type of the other sequence being corresponding to one combined sequence, and the number of numerical values of this type being equal to the number of numerical values in the corresponding combined sequence; dividing the interleaved information subsequence into interleaved information subsequences of a same number as the number of the divided sequences, according to the numerical values in each divided sequence; determining an output order of numerical values in each of the interleaved information subsequences according to the numerical values in each combined subsequence; and outputting numerical values of each of the interleaved information subsequences according to the determined output order to obtain a de-interleaved information sequence.

Preferably, the constructing each divided sequence according to the position of each numerical value in the one sequence specifically comprises: for each numerical value in the one sequence, using the position number of this numerical value in the one sequence as a numerical value in the corresponding divided sequence; and the constructing each combined sequence according to the position of each numerical value in the other sequence specifically comprises: for each numerical value in the other sequence, using the position number of this numerical value in the other sequence as a numerical value of the corresponding combined sequence.

Preferably, the information processing method based on interleaving provided further comprises the following steps of: simply interleaving at least one of the following sequences: the received interleaved information sequence, the interleaved information subsequences, and the de-interleaved information sequence, wherein the simple interleaving comprises at least one of the following operations: block de-interleaving and convolution de-interleaving.

Preferably, the step of interleaving the information sequence to be transmitted according to the combination of constructed pseudorandom sequences and numerical digit random sequences specifically comprises: for one of the constructed pseudorandom sequence and the corresponding numerical digit random sequence thereof, dividing the information sequence to be transmitted into information subsequences of a same number as the number of types of numerical values, according to the type and position of numerical values in the one sequence; determining a correspondence between each numerical value type in the other sequence and each information subsequence; and successively acquiring and outputting numerical values from an information subsequence corresponding to each numerical value type according to the type and position order of numerical values in the other sequence, to obtain an interleaved information sequence.

According to another aspect, an embodiment of the present disclosure provides a device for constructing an interleaving sequence, comprising: a pseudorandom sequence construction module, configured to construct a plurality of pseudorandom sequences according to a pre-defined length of an interleaving sequence to be constructed; a numerical digit random sequence construction module, configured to, for each of the constructed pseudorandom sequences, construct at least one corresponding numerical digit random sequence according to the number of numerical values of more than two types in this pseudorandom sequence, the type of numerical values in the numerical digit random sequence being corresponding to that of numerical values in the pseudorandom sequence, and the number of numerical values of a corresponding type being equal; and an interleaving sequence construction module, configured to, for each of the constructed pseudorandom sequences and the corresponding numerical digit random sequence thereof, construct a corresponding interleaving sequence according to a mapping relation between this pseudorandom sequence and the numerical digit random sequence, so that a plurality of interleaving sequences are allocated and indicated as multiple access signatures.

According to another aspect, an embodiment of the present disclosure further provides a transmitter, comprising: a sequence construction module, configured to construct a plurality of the following sequences according to a pre-defined length of an interleaving sequence to be constructed: an interleaving sequence, or a combination of pseudorandom sequences and numerical digit random sequences, the type of numerical values in the numerical digit random sequences being corresponding to that of numerical values in the pseudorandom sequences and the number of numerical values of a corresponding type being equal; a sequence information allocation and indicating module, configured to allocate and then indicate sequence information of the constructed sequences; and an information processing module, configured to process an information sequence to be transmitted or a received information sequence according to the allocated interleaving sequence or a combination of interleaving sequences or pseudorandom sequences and numerical digit random sequences.

According to another aspect, an embodiment of the present disclosure further provides a receiver, comprising: a sequence information receiving module, configured to receive sequence information indicated to the present apparatus; a sequence construction module, configured to construct an interleaving sequence or a combination of pseudorandom sequences and numerical digit random sequences according to the sequence information, the type of numerical values in the numerical digit random sequences being corresponding to the type of numerical values in the pseudorandom sequences, and the number of numerical values of a corresponding type being equal; and an information processing module, configured to process a received information sequence or an information sequence to be transmitted according to the constructed interleaving sequence or a combination of pseudorandom sequences and numerical digit random sequences.

In the embodiments of the present disclosure, the construction method of an interleaving sequence, or a combination of pseudorandom sequences and numerical digit random sequences has a small amount of computations and a small time delay; and, the interleaving sequence, or the combination of pseudorandom sequences and numerical digit random sequences are used as user identifiers for multiple access, so that it is convenient for allocation to receivers on a user side and it is easier to realize standardization.

Additional aspects and advantages of the present disclosure will be partially appreciated and become apparent from the descriptions below, or will be well learned from the practice of the present disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
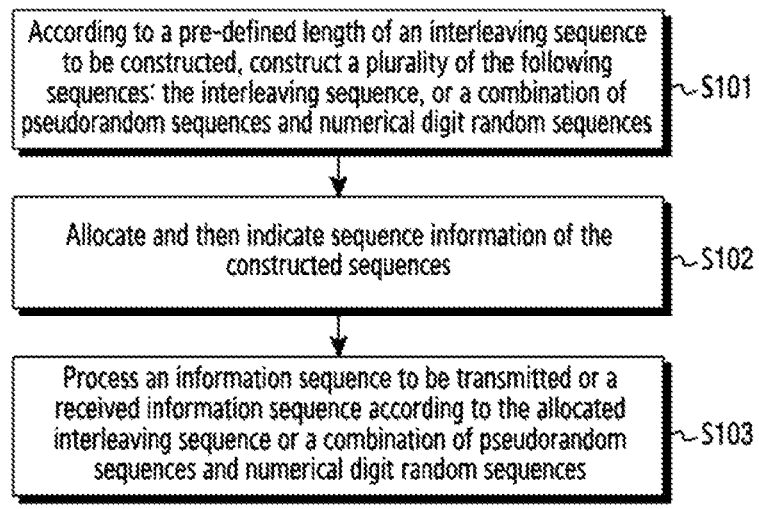
FIG. 1 illustrates a schematic flow diagram of an information processing method based on interleaving, according to an embodiment of the present disclosure.

FIGS. 1 through 25, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

It should be understood by a person of ordinary skill in the art that singular forms "a", "an", "the", and "said" can be intended to include plural forms as well, unless otherwise stated. It should be further understood that terms "include/ including" used in this specification specify the presence of the stated features, integers, steps, operations, elements and/or components, but not exclusive of the presence or addition of one or more other features, integers, steps, operations, elements, components, and/or combinations thereof. It should be understood that, when a component is referred to as being "connected to" or "coupled to" another component, it can be directly connected or coupled to other elements or provided with intervening elements therebetween. In addition, "connected to" or "coupled to" as used herein can include wireless connection or coupling. As used herein, term "and/or" includes all or any of one or more associated listed items or combinations thereof.

It should be understood by a person of ordinary skill in the art that, unless otherwise defined, all terms (including technical and scientific terms) used herein have the same meaning as commonly understood by a person of ordinary skill in the art to which the present disclosure belongs. It shall be further understood that terms, such as those defined in commonly used dictionaries, should be interpreted as having a meaning that is consistent with their meanings in the context of the art and will not be interpreted in an idealized or overly formal sense unless expressly so defined herein.

It should be understood by a person of ordinary skill in the art that term "terminal" and "terminal equipment" as used herein compasses not only devices with a wireless signal receiver having no emission capability but also devices with receiving and emitting hardware capable of carrying out bidirectional communication over a bidirectional communication link. Such devices can include cellular or other communication devices with a single-line display or multi-line display or without a multi-line display: Personal Communication Systems (PCSs) with combined functionalities of speech, data processing, facsimile and/or data communication; Personal Digital Assistants (PDAs), which can include RF receivers, pagers, internet networks/intranet accesses, web browsers, notepads, calendars and/or global positioning system (GPS) receivers; and/or conventional laptop and/or palmtop computers or other devices having and/or including a RF receiver. The "terminal" and "terminal equipment" as used herein can be portable, transportable, mountable in transportations (air, sea and/or land transportations), or suitable and/or configured to run locally and/or distributed in other places in the earth and/or space for running. The "terminal" or "terminal equipment" as used herein can be a communication terminal, an internet terminal, a music/video player terminal. For example, it can be a PDA, a Mobile Internet Device (MID) and/or a mobile phone with a music/video playback function, or can be equipment such as a smart TV and a set-top box.

The rapid development of information industry, particularly the increasing demand from the mobile Internet and the Internet of Things (IoT), brings about unprecedented challenges in the future mobile communications technology. According to the *ITU-R M. [IMT BEYOND 2020. TRAFFIC]* issued by the International Telecommunication Union (ITU), it can be expected that, by 2020, mobile services traffic will grow nearly 1,000 times as compared with that in 2010 (4G era), and the number of user device connections will also be over 17 billion, and with a vast number of IoT devices gradually expanding into the mobile communication network, the number of connected devices will be even more astonishing. In response to this unprecedented challenge, the communications industry and academia have prepared for the 2020s by launching an extensive study of the fifth generation of mobile communications technology (5G). Currently, in ITU-R M. [IMT.VISION] from ITU, the framework and overall objectives of the future 5G have been discussed, where the demands outlook, application scenarios and various important performance indexes of 5G have been described in detail. In terms of new demands in 5G, the ITU-R M. [IMT. FUTURE TECHNOLOGY TRENDS] from ITU provides information related to the 5G technology trends, which is intended to address prominent issues such as significant improvement on system throughput, consistency of the user experience, scalability so as to support IoT, time delay, energy efficiency, cost, network flexibility, support for new services and flexible spectrum utilization, etc.

The demand of supporting massive Machine-Type Communication (mMTC) is proposed for 5G. The connection density will reach millions of connections per square kilometer, considerably higher than the link density supported by the existing standards. The existing orthogonal multiple access modes, for example, Orthogonal Frequency Division Multiple Access (OFDMA), cannot satisfy the demand of millions of connections to be achieved by mMTC in 5G. To improve the capacity of the multiple access technology, some Non-orthogonal Multiple Access (NoMA) technologies have been proposed, and discussed as the potential 5G key technologies in the 3GPP standard conferences. Among those technologies, Sparse Code Multiple Access (SCMA), Pattern Defined Multiple Access (PDMA), Multi-user Shared Access (MUSA) or more are included. All these technologies are based on code division multiple access. The number of accessed users is increased by spreading, at the cost of losing a certain coding gain. Meanwhile, the above technical solutions need to define different codebooks or sequences for a different number of accessed users, and it is thus relatively difficult to realize standardization.

Hence, it is necessary to provide, in accordance with the non-orthogonal multiple access technologies based on interleaving, a method for constructing an interleaving sequence which is easier for standardization, an information processing method based on interleaving, a transmitter and a receiver, in order to enhance the competitiveness of the non-orthogonal multiple access technology for interleaving in the 5G standardization.

In the non-orthogonal multiple access technologies based on interleaving, for example, Interleave Division Multiple Access (IDMA), Interleave-Grid Multiple Access (IGMA)

or more, the spreading operation of symbols is avoided by reducing the code rate. Accordingly, the coding gain of the system is increased, and better BER performance than the non-orthogonal multiple access technologies based on spreading can be obtained under the condition of the same accessed users.

In the non-orthogonal multiple access technologies based on interleaving, it is required to define different interleavers for different sequence lengths, including bit-level interleaving and symbol-level interleaving; meanwhile, it is also required to define a plurality of interleavers represented by interleaving sequences to distinguish different users, and to inform and transfer interleaver information of each accessed user. In the existing documents, there have been some descriptions on different methods of generating user's interleaving sequences, for example, generating an interleaver in a tree structure manner, generating an interleaver in a cyclic shift manner, or more.

However, these existing interleaving sequence generation methods usually require a mother interleaving sequence to generate interleaving sequences for users, and also need a time delay or computations to inform or allocate the interleaving sequences. This is disadvantageous for the standardization of the non-orthogonal multiple access technologies based on interleaving. The majority of interleaving sequence generation methods in the existing documents are complicated, and need a large amount of computations or a time delay to generate interleaving sequences for different users. In addition, there has not yet been an effective method for informing a user of the allocation of multiple access signatures at a lower overhead at present.

Therefore, in order to improve the competitiveness of the non-orthogonal multiple access technologies based on interleaving in the 5G standardization, a simple and effective method of generating and informing multiple access signatures is required. In the embodiments of the present disclosure, a plurality of pseudorandom sequences are constructed according to a pre-defined length of an interleaving sequence to be constructed; for each of the constructed pseudorandom sequences, at least one corresponding numerical digit random sequence is constructed according to the number of numerical values of more than two types in this pseudorandom sequence, the type of numerical values in the numerical digit random sequence being corresponding to that of numerical values in the pseudorandom sequence, and the number of numerical values of a corresponding type being equal; and, for each of the constructed pseudorandom sequences and the corresponding numerical digit random sequence thereof, a corresponding interleaving sequence is constructed according to a mapping relation between this pseudorandom sequence and the numerical digit random sequence, so that a plurality of interleaving sequences are allocated and indicated as multiple access signatures. In the embodiments of the present disclosure, an interleaving sequence, or a combination of pseudorandom sequences and numerical digit random sequences is used as a user identifier for multiple access signatures, for example, multiple access, and the method of generating and constructing the interleaving sequence or the combination of pseudorandom sequences and numerical digit random sequences has a small amount of computations and a small time delay, so that it is convenient for allocation to receivers on a user side and it is easier to realize standardization.

The technical solutions of the present disclosure will be specifically described with reference to the accompanying drawings.

The present disclosure provides an information processing systems based on interleaving, comprising a transmitter and a receiver.

Wherein, there can be a plurality of transmitters; and the transmitters specifically can be transmitters on a service, for example, transmitters in a central office of the communication system, or transmitters in a base station, or more.

There can also be a plurality of receivers; and the receivers specifically can be receivers in a terminal equipment of a user side, for example, receivers in a smart phone, or more.

The present disclosure provides an information processing method based on interleaving. The schematic flow diagram of the method is as shown in FIG. 1, comprising S101 to S103. S101: A plurality of the following sequences are constructed according to a pre-defined length of an interleaving sequence to be constructed: interleaving sequences, or a combination of pseudorandom sequences and numerical digit random sequences, wherein the type of numerical values in the numerical digit random sequences is corresponding to that of numerical values in the pseudorandom sequences, and the number of numerical values of a corresponding type is equal. S102: Sequence information of the constructed sequences are allocated and then indicated. Preferably, after the constructed sequences are allocated, the sequence information of the allocated sequences is indicated. S103: An information sequence to be transmitted or a received information sequence is processed according to the allocated interleaving sequence or a combination of pseudorandom sequences and numerical digit random sequences.

In the present disclosure, the transmitters can indicate the sequence information by, but not limited to, any one of the following: a physical broadcast channel, a physical downlink control channel and a high-layer signaling.

Figure 2:
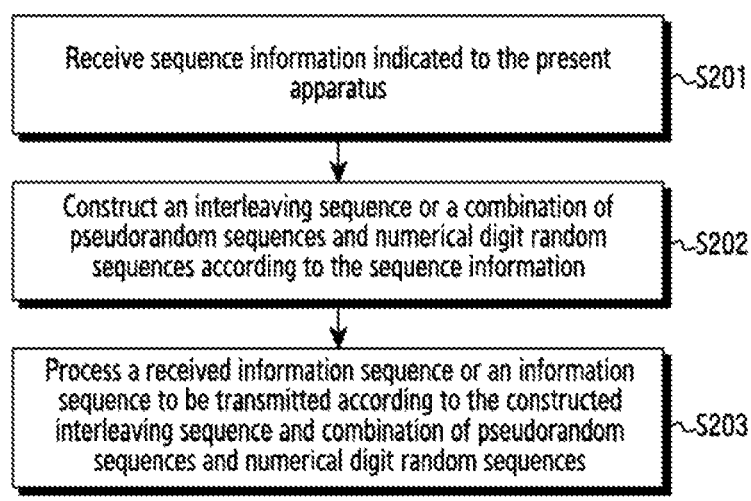
FIG. 2 illustrates a schematic flow diagram of another information processing method based on interleaving, according to an embodiment of the present disclosure.

The present disclosure provides another information processing method based on interleaving. The schematic flow diagram of the method is as shown in FIG. 2, comprising S201 to S203. S201: Sequence information indicated to the present apparatus is received. S202: An interleaving sequence or a combination of pseudorandom sequences and numerical digit random sequences is constructed according to the sequence information, wherein the type of numerical values in the numerical digit random sequences is corresponding to the type of numerical values in the pseudorandom sequences, and the number of numerical values of a corresponding type is equal. S203: A received information sequence or an information sequence to be transmitted is processed according to the constructed interleaving sequence or a combination of pseudorandom sequences and numerical digit random sequences.

Figure 3:
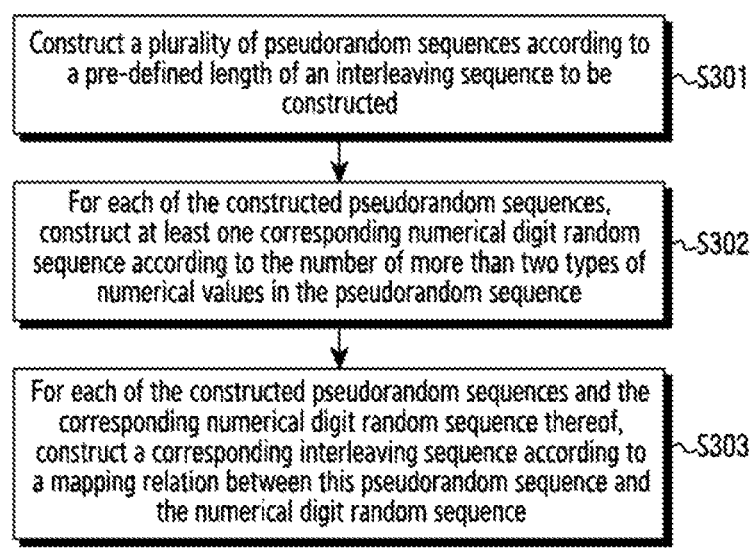
FIG. 3 illustrates a schematic flow diagram of a method for constructing an interleaving sequence, according to an embodiment of the present disclosure.

In the present disclosure, the schematic flow diagram of a method for constructing an interleaving sequence is as shown in FIG. 3, comprising the following steps S301 to S303.

S301: A plurality of pseudorandom sequences are constructed according to a pre-defined length of an interleaving sequence to be constructed.

The length of pseudorandom sequences to be generated is determined according to the pre-defined length.

A plurality of pseudorandom sequences are generated according to the length of the pseudorandom sequences to be generated.

Specifically, a plurality of generator polynomials and a plurality of initial states of a shift register are determined according to the length of the pseudorandom sequences to be generated. A plurality of pseudorandom pre-defined M-ary sequences are generated according to the following combinations of the generator polynomials and the initial states: a plurality of different generator polynomials and a plurality of same initial state; a plurality of same generator polynomials and a plurality of different initial states; a plurality of different generator polynomials and a plurality of different initial states; and a plurality of same generator polynomials and a plurality of same initial states.

Preferably, the pseudorandom pre-defined M-ary sequences can be specifically binary pseudorandom sequences or M-ary pseudorandom sequences. The binary pseudorandom sequences can be specifically M-sequences or Gold sequences. The M-ary pseudorandom sequences are specifically original M-ary pseudorandom sequences or synthesized M-ary pseudorandom sequences, wherein the synthesized M-ary pseudorandom sequences are generated by performing bitwise summation and then Bitwise modulo-M on more than two original M-ary pseudorandom sequences having the same length.

The generated pseudorandom sequences are used as the constructed pseudorandom sequences; or sequences having the pre-defined length are cut out from the generated pseudorandom sequences to serve as the constructed pseudorandom sequences.

S302: For each of the constructed pseudorandom sequences, at least one corresponding numerical digit random sequence is constructed according to the number of numerical values of more than two types in this pseudorandom sequence.

Wherein, the type of numerical values in the numerical digit random sequence is corresponding to that of numerical values in the pseudorandom sequence, and the number of numerical values of a corresponding type is equal.

S303: For each of the constructed pseudorandom sequences and the corresponding numerical digit random sequence thereof, a corresponding interleaving sequence is constructed according to a mapping relation between this pseudorandom sequence and the numerical digit random sequence.

In the present disclosure, a plurality of interleaving sequences or a combinations of a plurality of pseudorandom sequences and numerical digit random sequences, constructed by the method for constructing an interleaving sequence shown in FIG. 3, can be allocated and indicated as multiple access signatures to a plurality of terminal equipments, so that the plurality of terminal equipments access a base station according to the interleaving sequences or the combinations of pseudorandom sequences and numerical digit random sequences indicated by the base station and then interact with the base station, including: processing a received information sequence or an information sequence to be transmitted.

A receiver of a terminal equipment can de-interleave the received information sequences transmitted by a transmitter of the base station according to the interleaving sequence or the combination of pseudorandom sequences and numerical digit random sequences indicated to this terminal equipment.

The terminal equipment can interleave an information sequence to be transmitted according to the interleaving sequence or the combination of pseudorandom sequences and numerical digit random sequences indicated to this terminal equipment, and then transmit the information sequence to the base station.

Preferably, the base station can indicate sequence information of the constructed interleaving sequence or a combination of pseudorandom sequences and numerical digit random sequences. The terminal equipment can construct an interleaving sequence or a combination of pseudorandom sequences and numerical digit random sequences according to the indicated sequence information, and then process the information sequence.

As can be seen, in the embodiments of the present disclosure, an interleaving sequence or a combination of pseudorandom sequences and numerical digit random sequences is used as a user identifier for multiple access signatures, for example, multiple access, and the method of generating and constructing the interleaving sequence or the combination of pseudorandom sequences and numerical digit random sequences has a small amount of computations and a small time delay, so that it is convenient for allocation to receivers on a user side and it is easier to realize standardization.

The technical solutions of various embodiments of the present disclosure will be specifically described hereinafter.

In one embodiments of the present disclosure, a method for constructing an interleaving sequence based on M-sequences will be described.

An M-sequence is a basic Pseudo-Noise (PN) sequence used in a Code Division Multiple Access (CDMA) system, and is an abbreviation for maximum linear feedback shift register sequence. Due to simple definition, easiness to generate and good self-correlation and cross-correlation properties, pseudorandom sequences represented by M-sequences are widely applied in various communication systems. Pseudorandom sequences can also be used for generating interleaving sequences. Taking M-sequences as example, a method for generating an interleaving sequence based on pseudorandom sequences and a method for generating different interleaving sequences representing different users will be described hereinafter.

Figure 4:
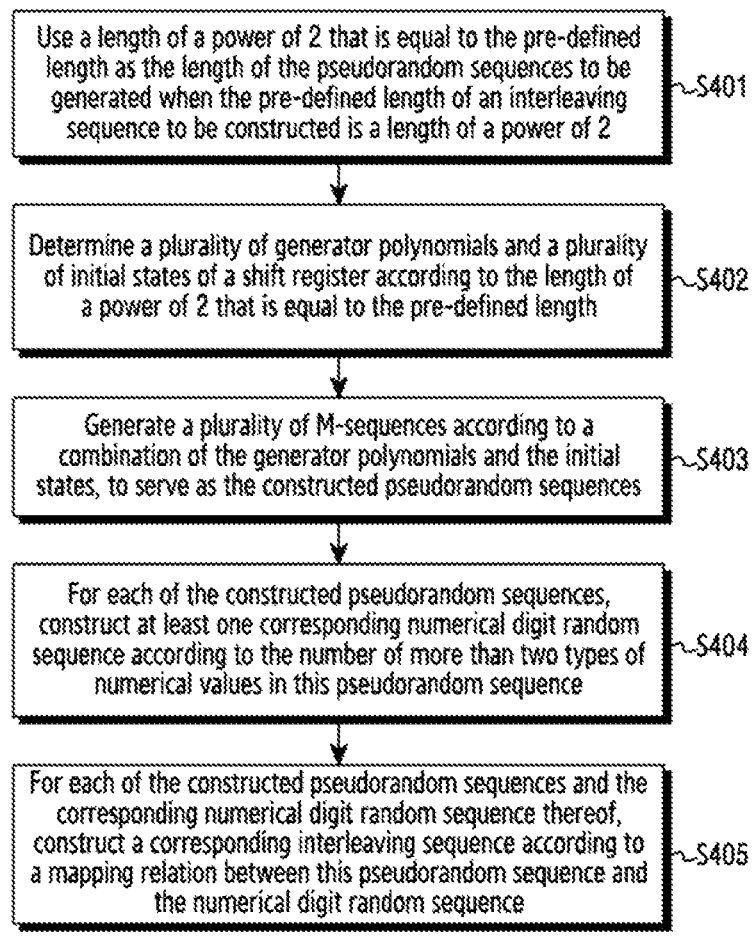
FIG. 4 illustrates a schematic flow diagram of a method for constructing an interleaving sequence based on M-sequences, according to an embodiment of the present disclosure.

Some embodiments of the present disclosure provide a method for constructing an interleaving sequence based on M-sequences. The schematic flow diagram of this method is as shown in FIG. 4, comprising the following steps S401 to S405.

S401: When a pre-defined length of an interleaving sequence to be constructed is a length of a power of 2, a length of a power of 2 that is equal to the pre-defined length is used as the length of pseudorandom sequences to be generated.

When the pre-defined length of the interleaving sequence to be constructed is a power of 2, a power of 2 corresponding to the pre-defined length of the interleaving sequence to be constructed is determined.

Preferably, an M-sequence is defined by a generator polynomial and an initial state, wherein the generator polynomial needs to be a primitive polynomial having a pre-defined length of $L=2^m-1$, where m is the degree of the polynomial, i.e., a power of 2, and is also the length of a shift register for generating the M-sequence.

Taking an M-sequence having a length of 7 as example, the generation and representation of the M-sequence will be described below. The power of 2 corresponding to the pre-defined length of the M-sequence is 3.

S402: A plurality of generator polynomials and a plurality of initial states of the shift register are determined according to the length of a power of 2 that is equal to the pre-defined length.

Preferably, for the length of a power of 2 that is equal to the pre-defined length, if the length of a power of 2 is $n=2^m-1$, the generator polynomial can be expressed by:

$$f(x)=\Sigma_{i=0}^{m}c_i x^i \qquad \text{(Formula 1)}$$

In Formula 1, $c_i$ is 0 or 1, and $c_0=1$. Usually, the generator polynomial is expressed by an octonary number expressed by $(c_0 c_1 \ldots c_m)$. The schematic diagram of the method of generating M-sequences by a shift register is as shown in FIG. 5A.

Figure 5A:
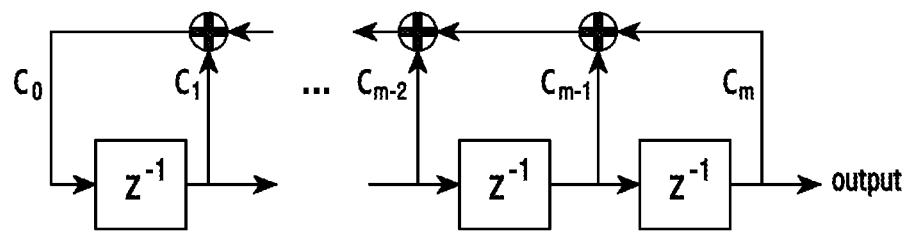
FIG. 5A illustrates a schematic diagram of an M-sequence generation method, according to an embodiment of the present disclosure.

In FIG. 5A, $z^{-1}$ represents a delay operation, where the stored initial value is the initial state in which this M-sequence is generated, and the summation represents modulo-2 summation. The above description can also be expressed by the following formula:

$$x[n+m]=(\Sigma_{i=1}^{m} c_i x[n+m-i]) \bmod 2, 0 \le n \le m \quad \text{(Formula 2)}$$

For example, the generator polynomial for the M-sequence having a length of 7 is as follows:

$$f(x)=1+x^2+x^3 \quad \text{(Formula 3)}$$

Figure 5B:
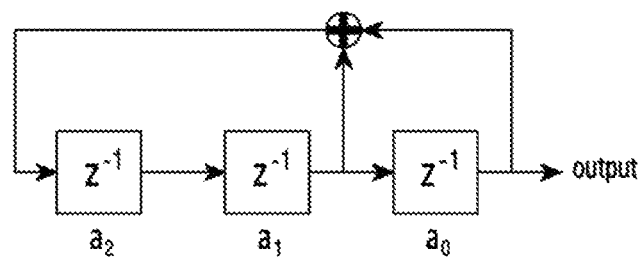
FIG. 5B illustrates a schematic diagram of an instance of the M-sequence generation method, according to an embodiment of the present disclosure.

The schematic diagram of generating an M-sequence having a pre-defined length of 7 by a shift register is as shown in FIG. 5B.

In FIG. 5B, $z^{-1}$ represents a delay operation, where the stored initial value, i.e., $[a_0 a_1 a_2]$, is an initial value. The initial state is $[a_0 a_1 a_2]=[1\ 1\ 1]$. The generation method can also be expressed by the following formula:

$$x[n+3]=(x[n+1]+x[n]) \bmod 2, 0 \le n \le 6 \quad \text{(Formula 4)}$$

In the Formula, the initial state is determined by $\{x[0]\ x[1]\ x[2]\}$. The octonary mechanism of the coefficient of the generator polynomial for the M-sequence having a length of 7 shown in Formula 3 is expressed by $(13)_8$.

S403: A plurality of M-sequences are generated according to a combination of generator polynomials and initial states to serve as the constructed pseudorandom sequences.

A plurality of pseudorandom pre-defined M-ary sequences are generated according to the following combinations of the generator polynomials and the initial states: a plurality of different generator polynomials and a plurality of same initial states; a plurality of same generator polynomials and a plurality of different initial states; a plurality of different generator polynomials and a plurality of different initial states; and a plurality of same generator polynomials and a plurality of same initial states.

Wherein, the pseudorandom pre-defined M-ary sequences in some embodiments of the present disclosure are specifically binary pseudorandom sequences. The binary pseudorandom sequences are specifically M-sequences.

Preferably, according to the Formula 2, $x[n]$ in the Formula 2 is an output M-sequence.

For example, according to the disclosure 3 or 4 and FIG. 5B, when the initial state is $[a_0 a_1 a_2]=[1\ 1\ 1]$, the generated M-sequence having a length of 7 is $[1\ 1\ 1\ 0\ 0\ 1\ 0]$.

Preferably, the generating a plurality of pseudorandom pre-defined M-ary sequences (M-sequences) according to a same generator polynomial and a same initial state can comprise: performing multiple cyclic shifts on numerical values in the M-sequences to obtain (generate) a plurality of M-sequences.

It should be understood by a person of ordinary skill in the art that, since the length of the M-sequences is the same as the pre-defined length of the interleaving sequence to be constructed in some embodiments, the generated M-sequences are directly used as the constructed pseudorandom sequences.

S404: For each of the constructed pseudorandom sequences, at least one corresponding numerical digit random sequence is constructed according to the number of numerical values of more than two types in this pseudorandom sequence.

For each of the constructed pseudorandom sequences, numerical values of this pseudorandom sequence are padded according to the difference in the number of numerical values of each type in this pseudorandom sequence when the pre-defined length is a length of a power of 2.

At least one numerical digit random sequence, having numerical values of a type corresponding to the type of numerical values in the pseudorandom sequence padded with numerical values and having an equal number of numerical values of a corresponding type, is generated.

Specifically, when the constructed pseudorandom sequences are specifically pseudorandom binary M-sequences, the pre-defined length is a power of 2 and the number of 0 in the M-sequences is less than that of 1, 0 is padded to the pseudorandom binary M-sequences.

According to the number of numerical values of each type in the pseudorandom sequences padded with numerical values, numerical values of a corresponding type and of a corresponding number are generated. At least one numerical digit random sequence is constructed according to at least one arrangement order of the numerical values.

Preferably, 0 is padded to an M-sequence having a length of $L=2^m-1$ to form a sequence having a length of $2^m$ and the same number of 1 and 0; and a numerical digit random sequence having a length of $2^m$ is constructed. The numerical digit random sequence includes +1 and −1, and the number of +1 is equal to that of −1.

S405: For each of the constructed pseudorandom sequences and the corresponding numerical digit random sequence thereof, a corresponding interleaving sequence is constructed according to a mapping relation between this pseudorandom sequence and the numerical digit random sequence.

For one of the numerical digit random sequence and the pseudorandom sequence, for each numerical value type in the one sequence, numerical values of this numerical value type are mapped to numerical values of a type corresponding to this numerical value type in the other sequence.

For each numerical value in the other sequence, this numerical value is replaced with the position number of a numerical value in the one sequence to which this numerical value is mapped, to obtain the interleaving sequence.

Preferably, reading from the first bit of the numerical digit random sequence, if the numerical value in this bit is +1, this numerical value is mapped to a first non-mapped 1 in the zero-padded M-sequence; and, if the numerical value is −1, this numerical value is mapped to a first non-mapped 0 in the zero-padded M-sequence. Subsequently, an interleaving sequence is obtained according to the mapping method of the numerical digit random sequence.

Figure 5C:
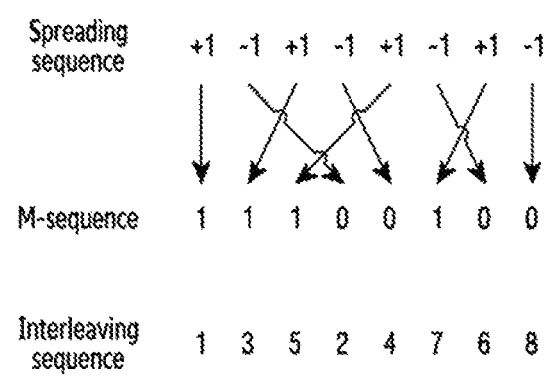
FIG. 5C illustrates a schematic diagram of an instance of generating an interleaving sequence based on M-sequences, according to an embodiment of the present disclosure.

For example, taking still an M-sequence having a length of 7 as example, by using a numerical digit random sequence in which +1 and −1 are alternated, the initial state of the M-sequence is 111, the generated M-sequence is $[1\ 1\ 1\ 0\ 0\ 1\ 0]$, and the schematic diagram of generating an interleaving sequence is as shown in FIG. 5C.

It is to be particularly noted that, the spreading sequence in the accompanying drawings (including FIG. 5C) of embodiments of the present disclosure is a numerical digit random sequence, and both belong to the same concept.

As shown in FIG. 5C, the generated final interleaving sequence is $[1\ 3\ 5\ 2\ 4\ 7\ 6\ 8]$. To ensure the randomness of an interleaved sequence, a simple interleaving operation can be performed on the generated interleaving sequence. For example, block interleaving having an interleaving depth of 2 is performed on the interleaving sequence to obtain an interleaving sequence $[1\ 5\ 4\ 6\ 3\ 2\ 7\ 8]$.

Figure 5D:
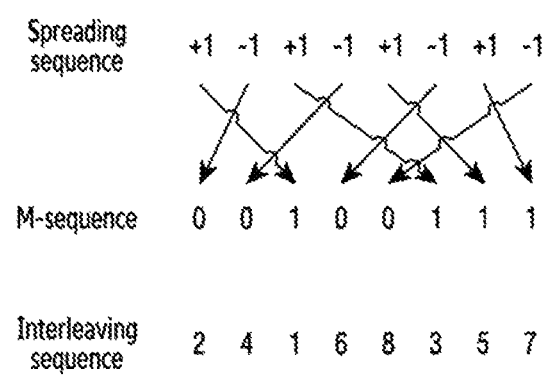
FIG. 5D illustrates a schematic diagram of an instance of generating an interleaving sequence based on cyclically-shifted M-sequences, according to an embodiment of the present disclosure.

More preferably, for the non-orthogonal multiple access technologies based on interleaving, it is required to define a plurality of different interleaving sequences to distinguish different users from each other. For the method of generating an interleaving sequence based on M-sequences, a plurality of interleaving sequences can be generated by using a same generator polynomial in the following several methods.

a. After the M-sequences are generated, cyclic shifts are performed on the M-sequences, and cyclically-shifted sequences are used to generate interleaving sequences. For example, the M-sequence generated in the above example is still used, and the M-sequence is padded with zeros and cyclically shifted three positions to the right to obtain a sequence [0 0 1 0 0 1 1 1]. The schematic diagram of generating an interleaving sequence is as shown in FIG. 5D.

It can be seen that the interleaving sequence generated after the cyclic shift is [2 4 1 6 8 3 5 7], which is completely different from the original interleaving sequence. In addition, it is to be noted that the zero padding operation can be performed before the cyclic shift, for example, in the example shown in FIG. 5D, or can be performed after the cyclic shift.

b. M-sequences are generated by using different initial states. When the used generator polynomial for generating M-sequences is fixed, different sequences can also be generated by changing an initial state. For example, still taking an M-sequence having a length of 7 and a generator polynomial for $f(x)=1+x^2+x^3$ as example, if the initial state is selected as $[a_0 a_1 a_2]=[0\ 0\ 1]$, the generated sequence is [0 0 1 0 1 1 1]. By using this sequence to generate an interleaving sequence, an interleaving sequence different from that in the example shown in FIG. 5C can be obtained.

It is to be noted that, as the M-sequences obtained by changing the initial state are equivalent to the cyclic shift of M-sequences in the fixed initial state, this method is equivalent to the method of performing cyclic shift and then padding with zeros as described in a.

c. Different numerical digit random sequences are used. By changing the numerical digit random sequence, i.e., by changing the positions of +1 and −1 in the numerical digit random sequence, the generated interleaving sequence can also be different. For example, in the example shown in 5C, the numerical digit random sequence in which +1 and −1 are alternated is used. If the used numerical digit random sequence is [−1 −1 +1 +1 −1 −1 +1 +1], the generated interleaving sequence is [3 4 7 1 2 8 5 6].

d. Different generator polynomials are used. When an M-sequence is long, the generator polynomial is not unique. For example, for an M-sequence having a length of 1023, the degree of generator polynomials is 10, and there are in total six different generator polynomials, which are expressed by (2011)8, (2033)8, (2157)8, (2443)8, (2745)8 and (3471)8 under the octonary mechanism, respectively. When different generator polynomials are used, the generated M-sequences are also different, so that the generated interleaving sequences are also different.

e. A combination of the above generation methods is used. More interleaving sequences can be generated by a combination of two or three of the four methods. For example, different generator polynomials are used, and different numerical digit random sequences are used for each of the generator polynomials; and, for each generator polynomial and each numerical digit random sequence, different cyclic shifts or initial states are used to obtain different interleaving sequences.

A transmitter allocates the constructed interleaving sequences or sequence information for constructing interleaving sequences to a plurality of receivers.

The transmitter indicates the sequence information by, but not limited to, any one of the following: a physical broadcast channel, a physical downlink control channel and a high-layer signaling.

And, the indicated sequence information comprises: a pre-defined length of the interleaving sequences, a pre-defined M-ary sequences mechanism of the pseudorandom sequences, generator polynomials and the initial states of the shift register.

Further, the indicated sequence information further comprises at least one of the following: the number of cyclic shifts performed on the pseudorandom sequences and/or the interleaving sequences; an arrangement order of numerical values in the numerical digit random sequences; and, starting positions from which the pseudorandom sequences are cut out from the original sequences.

Different combinations of the generation methods can be used for user groups. For example, user group 1 and user group 2 separately use different generator polynomials, different users in a same user group use different cyclic shifts or initial states to generate different interleaving sequences. The generated M-sequences and corresponding interleaving sequences thereof are different even if the same cyclic shift is used, when the generator polynomials are different. Therefore, users in different user groups can use the same cyclic shift or initial state. When the base station configures or informs a user of multiple access signatures, it is only required to inform the user group and the cyclic shift/initial state, so that the signaling overhead can be reduced correspondingly. And, during storage, the user only needs to store the generator polynomial and the cyclic shift/initial state corresponding to the user group, so that the storage demand is also small.

Further, when an M-sequence is long, there are more cyclic shifts or initial states which can be supported. For example, for an M-sequence having a length of 1023, there are total 1023 initial states, and there are total 1024 cyclic shifts when the above method is used to generate interleaving sequences. This number is much larger than the number of users which can be supported by the multiple access technology. In this case, fewer cyclic shifts or initial states can be selected to generate corresponding interleaving sequences. For example, when the supported number of users is 8, it is only required to select 8 different cyclic shifts or initial states. The 8 different cyclic shifts or initial states can be stored by the user, and the user can be informed of the configuration mode in a lookup table manner.

One possible method of selecting cyclic shifts or initial states is as follows: generating different interleaving sequences for different cyclic shifts or initial states, using a test sequence to interleave different interleaving sequences, and selecting cyclic shifts or initial states corresponding to interleaving sequences having a smaller correlation among the output interleaved sequences. Wherein, the test sequence can be a randomly generated binary sequence, or can be a randomly generated symbol modulation sequence, for example, a QPSK modulation sequence or more.

In some embodiments, the numerical digit random sequences, together with the binary pseudorandom sequences (M-sequences in in some embodiments), play a role of disturbing positions of numerical values in the sequences. In this embodiment, the mapping relation between +1 in the numerical digit random sequences and 1 in the pseudorandom sequences, and the mapping relation between −1 in the numerical digit random sequences and 0 in the pseudorandom sequences are established. The mapping relation can be changed. For example, +1 in a numerical digit random sequence is mapped to 0 in a pseudorandom sequence, and −1 in a numerical digit random sequence is mapped to 1 in a pseudorandom sequence. The method in this embodiment is still applicable.

In some embodiments of the present disclosure, for sequences having a same pre-defined length, different M-sequences can be generated by different generator polynomials and/or different initial states of a shift register; different M-sequences are obtained by performing cyclic shifts on a same M-sequence; different numerical digit random sequences can be generated for a same M-sequence; and a plurality of interleaving sequences having a same pre-defined length can be constructed according to M-sequences and corresponding numerical digit random sequences thereof. During the construction process, a small amount of computations is required, the time delay is small, and the efficiency is high.

Moreover, in some embodiments of the present disclosure, different interleaving sequences are used as identifiers of different users for multiple access, so that the requirements of terminal equipments of a plurality of users for multiple access are met. Further, when the base station configures or informs a user of multiple access signatures, the generator polynomials for M-sequences and the cyclic shifts/initial states can be transmitted to the terminal equipment of the user for storage, so that the signaling overhead for data transmission is reduced greatly, the data to be stored by the terminal equipment is also less, and a convenient standardization prospect is provided. Meanwhile, the terminal equipment can generate sequences representing the terminal equipment according to the stored generator polynomials and cyclic shifts/initial states.

It is to be particularly noted that, the spreading sequence in the accompanying drawing of each embodiment of the present disclosure is a numerical digit random sequence, and each belong to the same concept.

In one embodiment, a method for constructing an interleaving sequence based on Gold sequences and generalized pseudorandom sequences will be described.

Figure 6:
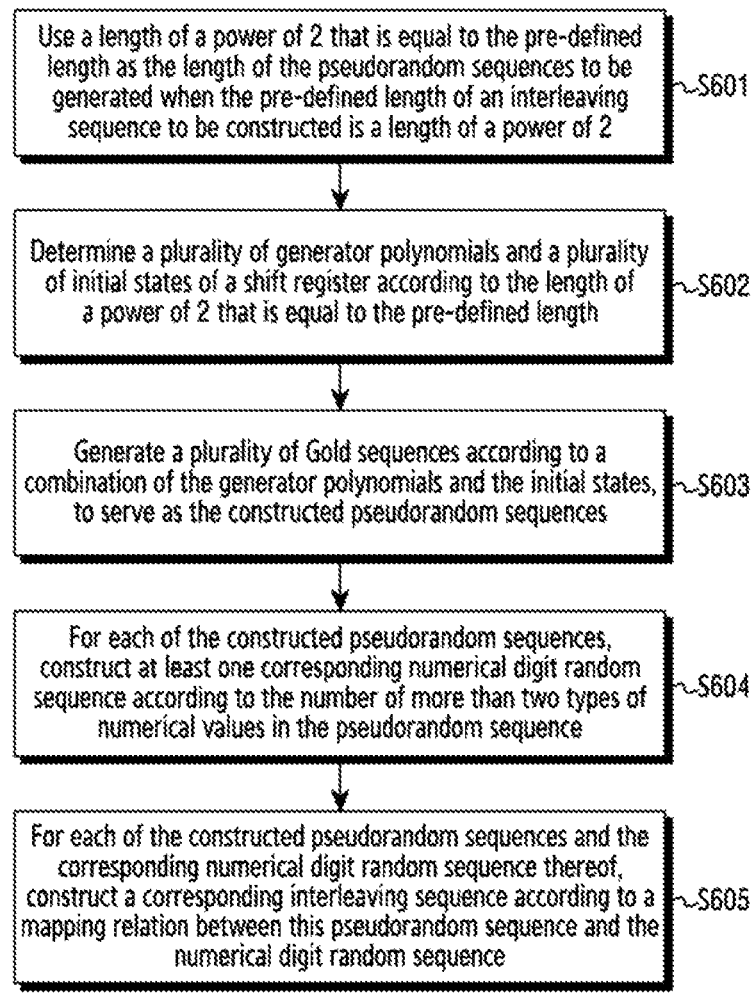
FIG. 6 illustrates a schematic flow diagram of a method for constructing an interleaving sequence based on Gold sequences, according to an embodiment of the present disclosure.

Some embodiments of the present disclosure provides a method for constructing an interleaving sequence based on Gold sequences. The schematic flow diagram of this method is as shown in FIG. 6, comprising the following steps S601 to S605.

S601: When a pre-defined length of an interleaving sequence to be constructed is a length of a power of 2, a length of a power of 2 that is equal to the pre-defined length is used as the length of pseudorandom sequences to be generated.

The method in this step is the same as the specific method in S401 and will not be repeated here.

S602: A plurality of generator polynomials and a plurality of initial states of a shift register are determined according to the length of a power of 2 that is equal to the pre-defined length.

Gold sequences are obtained by performing bitwise summation and then bitwise modulo-2 operation on two M-sequences having the same length, and have excellent self-correlation and cross-correlation properties. Gold sequences each having a length of 31 are used in the LTE, and generator polynomials for two M-sequences are as follows:

$$f_1(x)=x^5+x^3+1 \qquad \text{(Formula 5)}$$

$$f_2(x)=x^5+x^3+x^2+1 \qquad \text{(Formula 6)}$$

In the above Formula 5, the initial state corresponding to the generator polynomial $f_1(x)$ is fixed as $[a_0a_1a_2a_3a_4]=[1\ 0\ 0\ 0\ 0]$; however, in the above Formula 6, the initial state corresponding to the generator polynomial $f_2(x)$ changes according to the application scenario.

For each of the two M-sequences generating Gold sequences, with respect to a plurality of generator polynomials and a plurality of initial states of a shift register which are used for generation of this M-sequence, the method of determining the plurality of generator polynomials and the plurality of initial states of the shift register is the same as the specific method in S402 and will not be repeated here.

S603: A plurality of Gold sequences are generated according to a combination of generator polynomials and initial states to serve as the constructed pseudorandom sequences.

A plurality of pseudorandom pre-defined M-ary sequences are generated according to the following combinations of the generator polynomials and the initial states: a plurality of different generator polynomials and a plurality of same initial states; a plurality of same generator polynomials and a plurality of different initial states; a plurality of different generator polynomials and a plurality of different initial states; and a plurality of same generator polynomials and a plurality of same initial states. Wherein, the pseudorandom pre-defined M-ary sequences are specifically binary pseudorandom sequences. The binary pseudorandom sequences are specifically Gold sequences.

Specifically, a plurality of M-sequences are generated according to the combination of the generator polynomials and the initial states; and, for every two M-sequences having the same length, bitwise summation and then bitwise modulo-2 operation are performed on the two M-sequences to generate one Gold sequence, so that a plurality of Gold sequences are obtained.

In addition, the specific method of generating M-sequences in this step is the same as the specific method in above S403 and will not be repeated here.

Taking a Gold sequence having a length of 15 as example, two M-sequence generator polynomials are as follows:

$$f_1(x)=x^4+x+1 \qquad \text{(Formula 7)}$$

$$f_2(x)=x^4+x^3+1 \qquad \text{(Formula 8)}$$

Figure 7A:
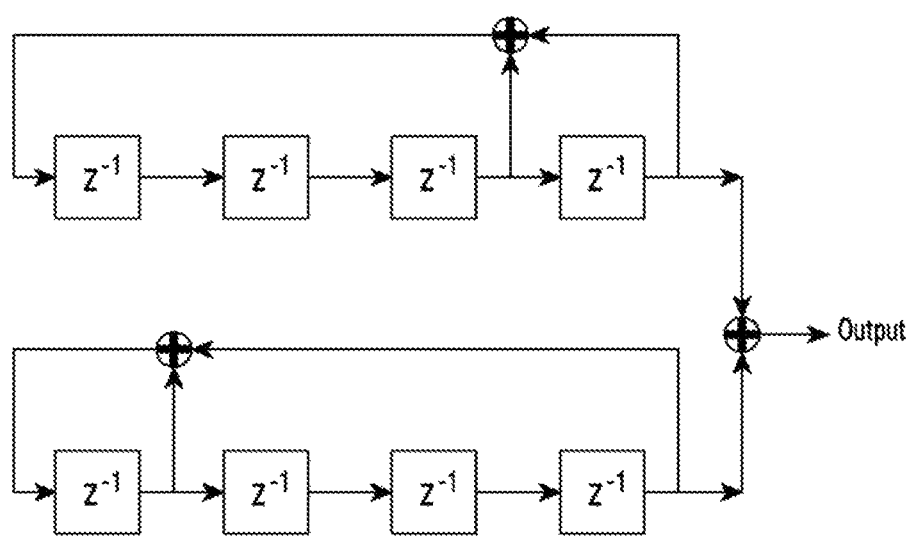
FIG. 7A illustrates a schematic diagram of an instance of a Gold sequence generation method, according to an embodiment of the present disclosure.

The schematic diagram of the method of generating a Gold sequence having a length of 15 is as shown in FIG. 7A.

In FIG. 7A, the initial state of the first M-sequence generator is $[a_0a_1a_2a_3]=[1\ 0\ 0\ 0]$, and the initial state of the second M-sequence generator is $[a_0a_1a_2a_3]=[0\ 1\ 0]$. In this case, the generated Gold sequence is $[1\ 1\ 0\ 0\ 1\ 1\ 1\ 0\ 0\ 0\ 0\ 0\ 0\ 0\ 1]$.

Preferably, the generating a plurality of Gold sequences according to a same generator polynomial and a same initial state can comprise: performing multiple cyclic shifts on numerical values in a Gold sequence to obtain (generate) a plurality of Gold sequences. Further, multiple cyclic shifts are performed on numerical values in at least one M-sequence generating the Gold sequences to generate a plurality of Gold sequences.

It should be understood by a person of ordinary skill in the art that, since the length of the Gold sequences is the same as the pre-defined length of the interleaving sequence to be constructed in some embodiments of the present disclosure, the generated Gold sequences are directly used as the constructed pseudorandom sequences.

S604: For each of the constructed pseudorandom sequences, at least one corresponding numerical digit random sequence is constructed according to the number of numerical values of more than two types in this pseudorandom sequence.

For each of the constructed pseudorandom sequences, numerical values of this pseudorandom sequence are padded according to the difference in the number of numerical values of each type in this pseudorandom sequence when the pre-defined length is a length of a power of 2.

At least one numerical digit random sequence, having numerical values of a type corresponding to the type of numerical values in the pseudorandom sequence padded with numerical values and having an equal number of numerical values of a corresponding type, is generated.

An interleaving sequence can be generated from the Gold sequences by using the concept similar to that in some embodiments of the present disclosure. However, since the Gold sequences have no balance, the number of 1 is not matched with the number of 0 in a sequence.

When the constructed pseudorandom sequence is specifically a Gold sequence, the pre-defined length is a length of a power of 2 and the number of 0 is not equal to that of 1 in this Gold sequence, a numerical value having the minimum number is padded to this Gold sequence.

Specifically, for a specified Gold sequence, the number of 1 and the number of 0 in this sequence are counted first. If there are more 1, 0 is padded to the tail of the sequence; while if there are more 0, 1 is padded to the tail of the sequence. According to the number of 0 and the number of 1 in the 0-padded or 1-padded sequence, a corresponding numerical digit random sequence is elected, wherein the number of +1 in the numerical digit random sequence is the same as the number of 1 in the 0-padded or 1-padded sequence, and the number of −1 in the numerical digit random sequence is the same as the number of 0 in the 0-padded or 1-padded sequence.

For example, for the above Gold sequence [1 1 0 0 1 1 0 0 0 0 0 0 0 1], since there are six 1 and nine 0 in this sequence, it is required to pad 1 to this sequence. Since there are seven 1 and nine 0 in the 1-padded sequence, a numerical digit random sequence [+1 −1 +1 −1 +1 −1 +1 −1 +1 −1 +1 −1 +1 −1 −1 −1] is selected, where there are seven +1 and nine −1.

S605: For each of the constructed pseudorandom sequences and the corresponding numerical digit random sequence thereof, a corresponding interleaving sequence is constructed according to a mapping relation between this pseudorandom sequence and the numerical digit random sequence.

For one of the numerical digit random sequence and the pseudorandom sequence, for each numerical value type in the one sequence, numerical values of this numerical value type are mapped to numerical values of a type corresponding to this numerical value type in the other sequence, respectively.

For each numerical value in the other sequence, this numerical value is replaced with the position number of a numerical value in the one sequence to which this numerical value is mapped, to obtain the interleaving sequence.

Figure 7B:
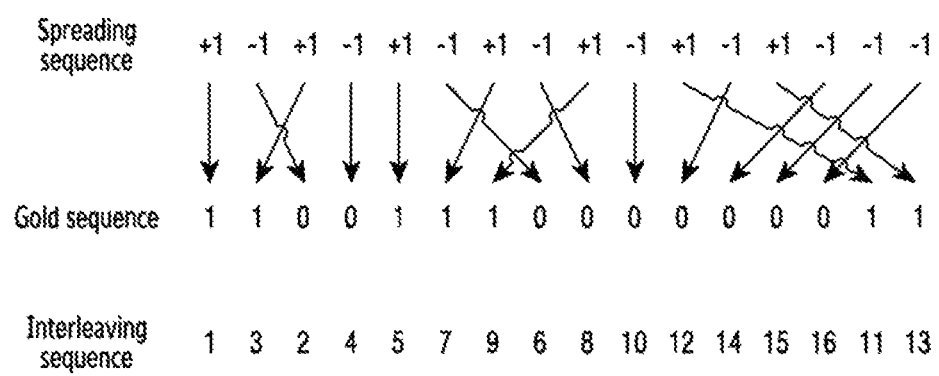
FIG. 7B illustrates a schematic diagram of an instance of generating an interleaving sequence based on Gold sequences, according to an embodiment of the present disclosure.

For example, for the Gold sequence [1 1 0 0 1 1 1 0 0 0 0 0 0 1], FIG. 7B shows a schematic diagram of generating an interleaving sequence by using this Gold sequence and a corresponding numerical digit random sequence [+1 −1 +1 −1 +1 −1 +1 −1 +1 −1 +1 −1 +1 −1 −1 −1].

As shown in FIG. 7B, the generated interleaving sequence is [1 3 2 4 5 7 9 6 8 10 12 14 15 16 11 13]. To increase the randomness, simple interleaving (for example, block interleaving, convolution interleaving, etc.) can be performed on the sequence.

More preferably, when interleaving sequences are generated using Gold sequences, interleaving sequences for a plurality of users can be generated in the following method.
  a. Cyclic shift of sequences. Different interleaving sequences can be generated by performing cyclic shifts on the generated Gold sequences. In addition, by performing cyclic shifts on the M-sequences generating Gold sequences, different Gold sequences can be generated, and different interleaving sequences can also be generated. However, it is to be noted that, for different Gold sequences obtained by performing cyclic shifts on M-sequences, the number of 0 may be not the same as the number of 1 in the sequences, so that it is required to adjust the numerical digit random sequences according to the number of 0 and the number of 1. By defining the method of generating the numerical digit random sequences, the numerical digit random sequences meeting the requirements can be obtained.
  As one possible method, the number of 0 and the number of 1 in Gold sequences are counted and expressed by $l_0$ and $l_1$, respectively, and the smaller one of the number of 0 and the number of 1 in the Gold sequences is expressed by $l_{min}=\min\{l_0,l_1\}$. When a numerical digit random sequence is constructed, first $2l_{min}$ elements are generated by alternating +1 and −1, while the remaining elements are added according to the size of $l_0$ and $l_1$. If $l_0>l_1$, −1 is padded to the remaining elements; or otherwise, +1 is padded to the remaining elements.
  b. Different initial states. For M-sequences, different initial states are equivalent to the cyclic shifts. Therefore, by changing an initial state of an M-sequence generator forming Gold sequences, different interleaving sequences can be generated. Specifically, it is possible to change the initial states of two M-sequence generators simultaneously, or it is also possible to change the initial state of one M-sequence generator only and fix the initial state of the other M-sequence generator. For example, in the generators for a Gold sequence having a length of 15 shown in FIG. 5, by fixing the initial state of a first M-sequence generator to be $[a_0 a_1 a_2 a_3]=[1\ 0\ 0\ 0]$ and changing the initial state of a second M-sequence generator, interleaving sequences for a plurality of users are obtained.
  c. Different numerical digit random sequences. Similar to some embodiments, by fixing the number of +1 and the number of −1 in the numerical digit random sequences and changing the positions of +1 and −1, different interleaving sequences can also be generated.
  d. Different M-sequence generator polynomials. By changing generator polynomials for M-sequences forming Gold sequences, different Gold sequences can be generated so that different interleaving sequences are generated. Specifically, by changing generator polynomials for two M-sequences simultaneously, or by fixing the generator polynomial for one M-sequence and changing the generator polynomial for another M-sequence, interleaving sequences for a plurality of users can be generated.
  e. A combination of the above methods. More interleaving sequences can be generated by combining two or three of the above methods. The combination method can be used for generating interleaving sequences for user groups.

A transmitter allocates the constructed interleaving sequences or sequence information for constructing interleaving sequences to a plurality of receivers.

The transmitter indicates the sequence information by, but not limited to, any one of the following: a physical broadcast channel, a physical downlink control channel and a high-layer signaling.

And, the indicated sequence information includes: a pre-defined length of the interleaving sequences, a pre-defined M-ary sequences mechanism of the pseudorandom sequences, generator polynomials and the initial states of the shift register.

Further, the indicated sequence information further comprises at least one of the following: the number of cyclic shifts performed on the pseudorandom sequences and/or the interleaving sequences; an arrangement order of numerical values in the numerical digit random sequences; and, starting positions from which the pseudorandom sequences are cut out from the original sequences.

For example, as one possible method, users are grouped according to the access capability or service requirements; and, for M-sequences generating a Gold sequence, by fixing the generator polynomial for one M-sequence and changing the generator polynomial for another M-sequence, interleaving sequences are generated for users in different user groups. For different users in a same user group, cyclic shift is performed on the generated Gold sequences; or the initial state of one M-sequence is fixed and the initial state of another M-sequence is changed. Users in different user groups can use the same cyclic shift or initial state. When the base station configures and informs different groups of multiple resources, it is only required to inform the user groups of the used variable M-sequence generator polynomials and corresponding cyclic shifts/initial states. The users only need to store possible M-sequence generator polynomials and possible cyclic shifts/initial states. Thus, both the storage requirement of the users and the signaling overhead of the network can be reduced.

Actually, the methods of generating an interleaving sequence in some embodiments can be extended to general random sequences. Specifically, in the above method for generating an interleaving sequence, two sequences are used: a random binary sequence including 0 and 1, and a numerical digit random sequence including +1 and −1. In the above method, M-sequences and Gold sequences are used as random binary sequences. However, actually, any sequence including 0 and 1 can be used as a binary sequence. Meanwhile, to ensure the generation process is simple enough, it is preferable to select a random binary sequence in which the number of 0 is close to the number of 1. A corresponding numerical digit random sequence is selected according to the random binary sequence. Specifically, it is ensured that the number of +1 in the numerical digit random sequence is equal to the number of 1 in the binary sequence, and the number of −1 in the numerical digit random sequence is equal to the number of 0 in the binary sequence. The method of generating numerical digit random sequences in this embodiment can be used. In other words, the number of 0 and the number of 1 in the binary sequence are counted and expressed by $l_0$ and $l_1$, respectively, and the smaller one of the number of 0 and the number of 1 in the Gold sequence is expressed by $l_{min}=\min\{l_0,l_1\}$. When a numerical digit random sequence is constructed, first $2l_{min}$ elements are generated by alternating +1 and −1, while the remaining elements are added according to the size of $l_0$ and $l_1$. If $l_0>l_1$, −1 is padded to the remaining elements, or otherwise, +1 is padded to the remaining elements.

After the random binary sequence and the numerical digit random sequence have been selected, operations are performed according to the subsequence steps in some embodiments of the present disclosure to obtain a corresponding interleaving sequence.

To generate interleaving sequences for a plurality of users, the following method can be adopted.

a. Different random binary sequences are used. Different interleaving sequences are generated by generating different binary sequences. Specifically, during the generation of M-sequences and Gold sequences, generator polynomials are changed correspondingly.

b. Different interleaving sequences for different users are generated by fixing the random binary sequences and performing different cyclic shifts for different users. Specifically, during the generation of M-sequences and Gold sequences, interleaving sequences are generated by using corresponding cyclic shifts and different initial states.

c. Different interleaving sequences for different users are generated by fixing the random binary sequences and using different numerical digit random sequences. Specifically, the number of +1 and the number of −1 in the numerical digit random sequences are fixed, and the positions of +1 and −1 are changed.

d. A combination of the above methods.

In practice, the positions of 1 and 0 in the random binary sequences in some embodiments can be exchanged. In other words, each 1 in the descriptions of the embodiments is replaced with 0, while 0 is replaced with 1. The methods as described in these embodiments still work. The positions of +1 and −1 in the numerical digit random sequences in these embodiments can be exchanged. In other words, each +1 in the descriptions of the embodiments is replaced with −1, while −1 is replaced with +1. The methods in these embodiments still work.

In some embodiments of the present disclosure, for sequences having a same pre-defined length, different M-sequences can be generated by different generator polynomials and/or different initial states of a shift register; different Gold sequences are generated by changing the M-sequences generating the Gold sequences; different Gold sequences are obtained by performing cyclic shifts on a same M-sequence or Gold sequence; different numerical digit random sequences can be generated for a same Gold sequence; and a plurality of interleaving sequences having a same pre-defined length can be constructed according to the Gold sequences and corresponding numerical digit random sequences thereof. During the construction process, a small amount of computations is required, the delay is small, and the efficiency is high.

Moreover, in some embodiments of the present disclosure, different interleaving sequences are used as identifiers of different users for multiple access, so that the requirements of terminal equipments of a plurality of users for multiple access are met. Further, when the base station configures or informs a user of multiple access signatures, the generator polynomials related to the Gold sequences and the cyclic shifts/initial states can be transmitted to the terminal equipment of the user for storage, so that the signaling overhead for data transmission is reduced greatly, the data to be stored by the terminal equipment is also less, and a convenient standardization prospect is realized. Meanwhile, the terminal equipment can generate sequences representing the terminal equipment according to the stored generator polynomials and cyclic shifts/initial states.

Further, the applicable range of the embodiment of the present disclosure is extended from Gold sequences to broader binary pseudorandom sequences.

In one embodiment of the present disclosure, an information processing method based on pseudorandom binary sequence interleaving will be described.

A transmitter allocates the constructed interleaving sequence or sequence information for constructing the interleaving sequence to a plurality of receivers.

The transmitter processes an information sequence to be transmitted or a received information sequence according to the allocated interleaving sequence or a combination of pseudorandom sequences and numerical digit random sequences, specifically: interleaving and then transmitting the information sequence to be transmitted according to the allocated interleaving sequence or a combination of pseudorandom sequences and numerical digit random sequences; and/or de-interleaving the received information sequence according to the allocated interleaving sequence or a combination of pseudorandom sequences and numerical digit random sequences.

As can be seen from the descriptions of some embodiments, the method for generating an interleaving sequence based on sequences can be interpreted to include the following steps of: dividing a numerical digit random sequence into two parts, one of which includes +1 while the other one of which includes −1, so that two sequences are constructed, respectively; and outputting numerical values in the two sequences according to the order of 1 and 0 in a pseudorandom binary sequence, so as to obtain an interleaving sequence. Based on this idea, it can be deduced that the interleaving sequence actually can be replaced with pseudorandom sequences (including binary pseudorandom sequences) and corresponding numerical digit random sequences thereof; and an interleaving operation and a de-interleaving operation can be performed according to the combination of the pseudorandom sequences and the corresponding numerical digit random sequences instead of the interleaving sequence.

Figure 8:
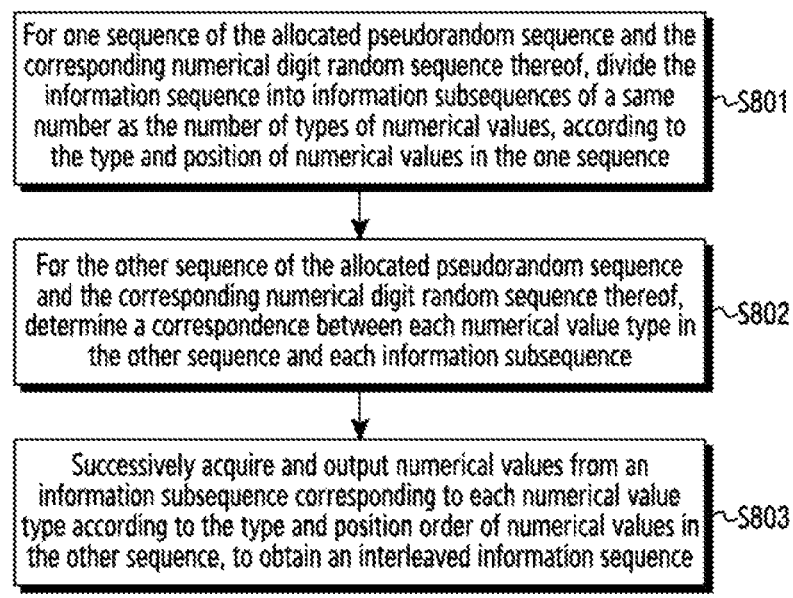
FIG. 8 illustrates a schematic flow diagram of a method for interleaving an information sequence, according to a combination of binary pseudorandom sequences and numerical digit random sequences, according to an embodiment of the present disclosure.

A method for interleaving the information sequence to be transmitted according to the combination of the allocated binary pseudorandom sequences and numerical digit random sequences provided by some embodiments will be described below. The schematic diagram of this method is as shown in FIG. 8, comprising the following steps S801 to S803.

S801: For one sequence of the allocated pseudorandom sequence and the corresponding numerical digit random sequence thereof, the information sequence to be transmitted is divided into information subsequences of a same number as the number of types of numerical values, according to the type and position of numerical values in the one sequence.

For one of the allocated pseudorandom sequence and the corresponding numerical digit random sequence thereof, for each numerical value type in the one sequence, the positions of numerical values of this numerical value type in the one sequence are mapped to corresponding positions in the information sequence.

Numerical values at the corresponding positions are acquired one by one according to the order of the corresponding positions in the information sequence, to form an information subsequence corresponding to this numerical value type.

Preferably, according to the distribution of +1 and −1 in the numerical digit random sequences, the information sequence serving as input numerical values is divided into two information subsequences, wherein the numerical values in the information subsequence 1 are numerical values (usually 1) corresponding to the positions of +1 in the numerical digit random sequences, and the numerical values in the information subsequence 2 are numerical values (usually 0) corresponding to the positions of −1 in the numerical digit random sequences.

Figure 9:
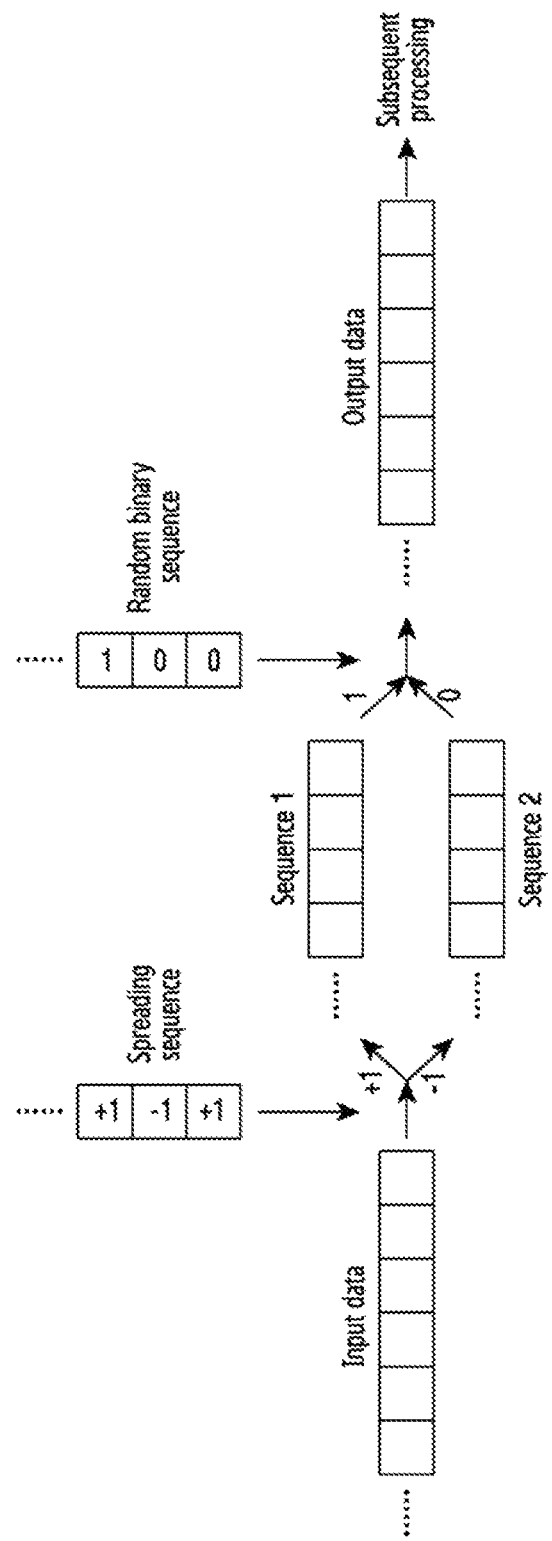
FIG. 9 illustrates a schematic diagram of a specific instance of an operation of interleaving an information sequence, according to a combination of binary pseudorandom sequences and numerical digit random sequences, according to an embodiment of the present disclosure.

FIG. 9 is a schematic diagram of a specific instance of the method for interleaving an information sequence according to a combination of binary pseudorandom sequences and numerical digit random sequences. In FIG. 9, the random binary sequences are binary pseudorandom sequences, and the numerical digit random sequences and the binary pseudorandom sequences are used as inputs in the vertical directions of the input end and the output end, respectively; and, sequences 1 and 2 represent information subsequences 1 and 2, respectively. In FIG. 9, arrows with a superscript or subscript represent selection branches. When the input in the vertical direction is the same as the data on the superscript/subscript, this branch is activated; or otherwise, the branch is not activated. Numerical values are bitwise input successively from the first bit to the last bit in the numerical digit random sequence. When the numerical value of the current bit of the numerical digit random sequence is +1, the superscript is +1, the arrow (branch) pointing to sequence 1 is activated, and 1 at a bit (position) in the information sequence as input data corresponding to the bit (position) of the current +1 in the numerical digit random sequence is input to the tail end of sequence 1. When the numerical value of the current bit of the numerical digit random sequence is −1, the superscript is −1, the arrow (branch) pointing to sequence 2 is activated, and 0 at a bit in the information sequence corresponding to the bit of the current −1 in the numerical digit random sequence is input to the tail end of sequence 2.

It should be understood that the numerical digit random sequence and the information sequence are equal in length, and the information sequence is bitwise input exactly after the numerical digit random sequence is bitwise input.

S802: For the other sequence of the allocated pseudorandom sequence and the corresponding numerical digit random sequence thereof, a correspondence between each numerical value type in the other sequence and each information subsequence is determined.

For the other one sequence of the allocated pseudorandom sequence and the corresponding numerical digit random sequence thereof, a mapping relation between each numerical value type in the other sequence and each numerical value type in the one sequence is determined, and an information subsequence corresponding to each numerical value type in the other sequence is further determined.

For example, as shown in FIG. 9, it can be seen from some embodiments that the numerical digit random sequence is constructed according to the pseudorandom binary sequence. In FIG. 9, the number of +1 and the number of −1 in the numerical digit random sequence located at the input end are equal to the number of 1 and the number of 0 in the pseudorandom binary sequence located at the output end, respectively. The mapping relations between +1 and −1 in the numerical digit random sequence and 1 and 0 in the pseudorandom binary sequence are determined, respectively. Further, information subsequences 1 and 2 corresponding to 1 and 0 in the pseudorandom binary sequence located at the output end are determined.

S803: For the other one of the allocated pseudorandom sequence and the corresponding numerical digit random sequence thereof, numerical values are successively acquired and then output from an information subsequence corresponding to each numerical value type according to the type and position order of numerical values in the other sequence, to obtain an interleaved information sequence.

For the other one of the allocated pseudorandom sequence and the corresponding numerical digit random sequence thereof, pointing to the last bit from the first bit in the other sequence, the type of a numerical value at a position is determined; an information subsequence corresponding to this numerical value type is determined, and a first numerical value which has not been acquired is acquired from the information subsequence for outputting; and an interleaved information sequence is obtained after the numerical values in each information subsequence are output.

Preferably, numerical values in the information subsequence 1 or information subsequence 2 are output according to the numerical value types and the arrangement order (position order) of numerical values in the generated random binary sequence.

For example, as shown in FIG. 9, pointing to the last bit from the last bit in the pseudorandom binary sequence to input numerical values one by one. If the numerical value in the current position (bit) in the pseudorandom binary sequence is 1, the superscript is 1 and the arrow (branch) originated from sequence 1 is activated, and a first numerical value which has not been output in the information subsequence 1 is output. If the numerical value in the current position (bit) in the random binary sequence is 0, the subscript is 0 and the arrow (branch) originated from sequence 2 is activated, and a first numerical value which has not been output in the information subsequence 2 is output. In this way, the interleaved information sequence is obtained.

Further, a subsequent operation can be performed on the interleaved information sequence. The subsequent operation includes a simple interleaving operation, for example, block interleaving, convolution interleaving or more.

The transmitter in each embodiment of the present disclosure indicates the sequence information by, but not limited to, any one of the following: a physical broadcast channel, a physical downlink control channel and a high-layer signaling. And, the indicated sequence information includes: a pre-defined length of the interleaving sequences, a pre-defined M-ary sequences mechanism of the pseudorandom sequences, generator polynomials and the initial states of the shift register. Further, the indicated sequence information further comprises at least one of the following: the number of cyclic shifts performed on the pseudorandom sequences and/or the interleaving sequences; an arrangement order of numerical values in the numerical digit random sequences; and, starting positions from which the pseudorandom sequences are cut out from the original sequences. Preferably, in the embodiment of the present disclosure, the pre-defined M-ary sequences mechanism of the pseudorandom sequences is a binary mechanism, and the pseudorandom sequences are binary pseudorandom sequences.

Figure 10:
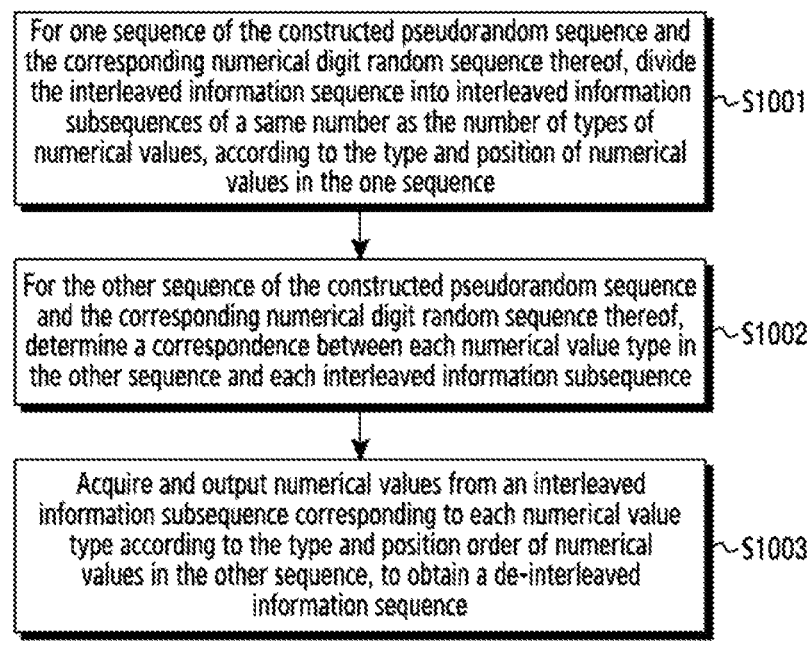
FIG. 10 illustrates a schematic flow diagram of a method for de-interleaving an information sequence, according to a combination of binary pseudorandom sequences and numerical digit random sequences, according to an embodiment of the present disclosure.

In addition, a method for de-interleaving, by a transmitter, the received interleaved information sequence according to the combination of allocated binary pseudorandom sequences and numerical digit random sequences can refer to the de-interleaving method on a receiver side shown in FIG. 10, and will not be repeated here.

A receiver in each embodiment of the present disclosure can acquire the interleaving subsequence or a combination of pseudorandom sequences and numerical digit random sequences by, but not limited to, any one of the following: a physical broadcast channel, a physical downlink control channel and a high-layer signaling.

And, the acquired sequence information includes: a pre-defined length of the interleaving sequence, a pre-defined M-ary sequences mechanism of the pseudorandom sequences, generator polynomials and the initial states of the shift register.

Further, the indicated sequence information further comprises at least one of the following: the number of cyclic shifts performed on the pseudorandom sequences and/or the interleaving sequences; an arrangement order of numerical values in the numerical digit random sequences; and, starting positions from which the pseudorandom sequences are cut out from the original sequences.

The constructing, by the receiver, an interleaving sequence according to the acquired sequence information comprises: constructing pseudorandom sequences according to the sequence information; constructing corresponding numerical digit random sequences according to the number of numerical values of more than two types in the constructed pseudorandom sequences; and constructing a corresponding interleaving sequence according to a mapping relation between the constructed pseudorandom sequences and the numerical digit random sequences.

Wherein, the constructing pseudorandom sequences according to the sequence information comprises: generating pseudorandom pre-defined M-ary sequences according to the pre-defined M-ary sequences mechanism of the pseudorandom sequences, the generator polynomials and the initial states of the shift register in the sequence information; using the generated pseudorandom pre-defined M-ary sequences as the constructed pseudorandom sequences; or, determining sequences having the present length from the generated pseudorandom pre-defined M-ary sequences to serve as the constructed pseudorandom sequences.

Preferably, the constructing, by the receiver, an interleaving sequence according to the acquired sequence information further comprises: performing cyclic shifts on numerical values in the generated pseudorandom pre-defined M-ary sequences or performing cyclic shifts on numerical values in the constructed pseudorandom sequences, according to the number of cyclic shifts performed on the pseudorandom sequences in the sequence information; or, cutting out sequences having the pre-defined length from corresponding starting positions of the generated pseudorandom pre-defined M-ary sequences, according to the starting positions from which the pseudorandom sequences are cut out from the original sequences in the sequence information; or, adjusting the order of numerical values in the constructed pseudorandom sequences, according to the arrangement order of numerical values in the numerical digit random sequences in the sequence information; or, performing cyclic shifts on numerical values in the constructed interleaving sequence, according to the number of cyclic shifts performed on the interleaving sequence in the sequence information.

In some embodiments of the present disclosure, the processing, by a receiver, a received information sequence or an information sequence to be transmitted according to the constructed interleaving sequence or a combination of pseudorandom sequences and numerical digit random sequences specifically comprises: de-interleaving the received interleaved information sequence according to the constructed interleaving sequence or a combination of pseudorandom sequences and numerical digit random sequences; and/or interleaving the information sequence to be transmitted according to the constructed interleaving sequence or a combination of pseudorandom sequences and numerical digit random sequences.

Based on the method for interleaving the information sequence to be transmitted according to the combination of allocated pseudorandom sequences and numerical digit random sequences, some embodiments of the present disclosure further provides a method for de-interleaving the received interleaved information sequence according to the combination of constructed pseudorandom sequences and numerical digit random sequences. The schematic flow diagram of this method is as shown in FIG. 10, comprising the following steps S1001 to S1003.

S1001: For one of the constructed pseudorandom sequence and the corresponding numerical digit random sequence thereof, the interleaved information sequence is divided into interleaved information subsequences of a same number as the number of types of numerical values, according to the type and position of numerical values in the one sequence.

For one of the constructed pseudorandom sequence and the corresponding numerical digit random sequence thereof, for each numerical value type in the one sequence, the positions of numerical values of this numerical value type in the sequence are mapped to corresponding positions in the information sequence.

Numerical values at the corresponding positions are acquired one by one according to the order of the corresponding positions in the information sequence, to form an interleaved information subsequence corresponding to this numerical value type.

S1002: For the other one sequence of the constructed pseudorandom sequence and the corresponding numerical digit random sequence thereof, a correspondence between each numerical value type in the other sequence and each interleaved information subsequence is determined.

For the other one sequence of the constructed pseudorandom sequence and the corresponding numerical digit random sequence thereof, a mapping relation between each numerical value type in the other sequence and each numerical value type in the one sequence is determined, and an information subsequence corresponding to each numerical value type in the other sequence is further determined.

Figure 11:
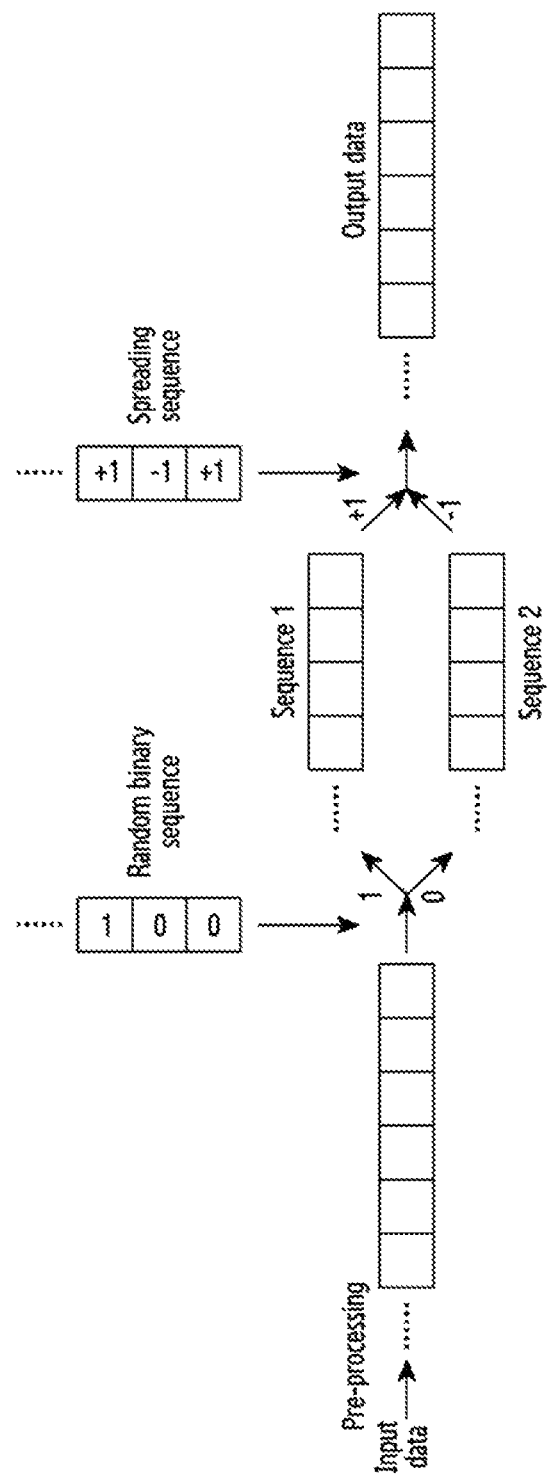
FIG. 11 illustrates a schematic diagram of a specific instance of an operation of de-interleaving an information sequence, according to a combination of binary pseudorandom sequences and numerical digit random sequences, according to an embodiment of the present disclosure.

For example, FIG. 11 is a schematic diagram of an instance of de-interleaving the received interleaved information sequence according to the combination of binary pseudorandom sequences and numerical digit random sequences. As shown in FIG. 11, it can be seen from some embodiments that the numerical digit random sequences are constructed according to the binary pseudorandom sequences. In FIG. 11, the number of +1 and the number of −1 in the numerical digit random sequence located at the output end are equal to the number of 1 and the number of 0 in the pseudorandom binary sequence located at the input end, respectively. The mapping relations between +1 and −1 in the numerical digit random sequence and 1 and 0 in the pseudorandom binary sequence are determined, respectively. Further, information subsequences 1 and 2 corresponding to +1 and −1 in the numerical digit random sequence located at the output end are determined, respectively.

S1003: For the other one sequence of the constructed pseudorandom sequence and the corresponding numerical digit random sequence thereof, numerical values are successively acquired and then output from an interleaved information subsequence corresponding to each numerical value type according to the type and position order of numerical values in the other sequence, to obtain a de-interleaved information sequence.

For the other one sequence of the constructed pseudorandom sequence and the corresponding numerical digit random sequence thereof, pointing to the first bit from the last bit in the other sequence, the type of a numerical value at a position is determined one by one; further, an interleaved information subsequence corresponding to this numerical value type is determined, and a first numerical value which has not been acquired is acquired from the interleaved information subsequence for outputting; and, a de-interleaved information sequence is obtained after the numerical values in the interleaved information subsequence are output.

Preferably, before S1001, the receiver can also execute a pre-operation. The pre-operation is an inverse process of the subsequent operation in the interleaving operation. If the subsequent operation in the interleaving method of the transmitter is simple interleaving, for example, block interleaving or convolution interleaving, the pre-operation is a de-interleaving process of the simple interleaving, for example, block de-interleaving or convolution de-interleaving.

In steps S1001 to S1003, according to the positions of 0 and 1 in the pseudorandom binary sequence, the input data is divided into two sequences, i.e., sequence 1 and sequence 2, wherein the data in sequence 1 is data corresponding to a position of 1 in the pseudorandom binary sequence and the data in sequence 2 is data corresponding to a position of 0 in the pseudorandom binary sequence. After sequence 1 and sequence 2 are obtained, the data in sequence 1 and the data in sequence 2 are successively output according to the numerical digit random sequence. Specifically, if the numerical value in the current position of the numerical digit random sequence is +1, a first data which has not been output in the sequence 1 is output; and if the numerical value in the current position of the numerical digit random sequence is −1, a first data which has not been output in the sequence 2 is output. The specific operation is as shown in FIG. 11.

In FIG. 11, arrows with a superscript or subscript represent selections. When the input in the vertical direction is the same as the data on the superscript/subscript, this branch is activated; or otherwise, the branch is not activated.

More preferably, to further enhance the randomness of the interleaving operation, the transmitter can perform simple interleaving on at least one of the following sequences: the information sequence before interleaving, information subsequences, and the interleaved information sequence, wherein the simple interleaving includes at least one of the following operations: block interleaving and convolution interleaving.

And, the receiver performs simple interleaving on at least one of the following sequences: the received interleaved information sequence, interleaved information subsequences, and the de-interleaved information sequence, wherein the simple interleaving includes at least one of the following operations: block de-interleaving and convolution de-interleaving.

Specifically, when interleaving operation is performed at the transmitting end and after the input data is divided into sequence 1 and sequence 2 according to the numerical digit random sequence, simple interleaving (e.g., block interleaving or convolution interleaving or more) can be first performed on the sequence 1 and sequence 2, and then the sequence 1 and sequence 2 are combined according to the pseudorandom binary sequence. The de-interleaving at the receiving end is an inverse operation of the interleaving at the transmitting end. In other words, the sequence is first divided into sequence 1 and sequence 2 according to the pseudorandom binary sequence; then, block de-interleaving is performed on the sequence 1 and sequence 2; and the sequence 1 and sequence 2 are combined according to the numerical digit random sequence. Another method is performing simple interleaving on the input data, before performing sequence-based interleaving on the input data.

In addition, a method for interleaving, by a receiver, the information sequence to be transmitted according to the combination of constructed binary pseudorandom sequences and numerical digit random sequences can refer to the interleaving method on the transmitter side shown in FIG. 8, and will not be repeated here.

It can be seen that, in the interleaving and de-interleaving methods provided in some embodiments of the present disclosure, the interleaving and de-interleaving operations can be completed only according to binary pseudorandom sequences and numerical digit random sequences, without requiring any real interleaving sequence. As can be seen from some embodiments, the binary pseudorandom sequences can be generated by M-sequences or Gold sequences, and the numerical digit random sequences are simple in structure. Accordingly, the solutions provided by this embodiment can significantly reduce the storage requirements for interleaving sequences in the non-orthogonal multiple access technologies based on interleaving, and can reduce the time delay of the interleaving operation.

In addition, it is to be noted that, in some embodiments, 0 and 1 in a pseudorandom binary sequence can be exchanged with each other, that is, 0 in the pseudorandom binary sequence is replaced with 1 while 1 is replaced with 0, without any impact on the implementation of this solution. Meanwhile, +1 and −1 in a numerical digit random sequence can be exchanged with each other, that is, +1 in the numerical digit random sequence is replaced with −1 while −1 is replaced with +1, without any impact on the implementation of this solution.

In addition, the interleaving operation shown in FIG. 8 and the de-interleaving operation shown in FIG. 10 can be exchanged. In other words, FIGS. 10 and 11 are interleaving operations, while FIGS. 8 and 9 are de-interleaving operations. This is similar to the exchange of positions of a pseudorandom binary sequence and a numerical digit random sequence in some embodiments. Specifically, it is equivalent that, when an interleaving sequence is generated, 1 in the pseudorandom binary sequence is mapped to the first +1 which has not been mapped in the numerical digit random sequence, and 0 in the pseudorandom binary sequence is mapped to the first −1 which has not been mapped in the numerical digit random sequence. Taking the example shown in FIG. 5C as example, if the positions of M-sequences and numerical digit random sequences are exchanged, the schematic diagram of generating an interleaving sequence is as shown in FIG. 12.

Figure 12:
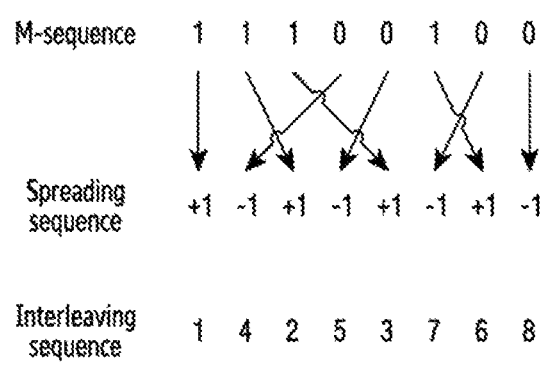
FIG. 12 illustrates a schematic diagram of an instance of exchanging positions of M-sequences and numerical digit random sequences and then generating an interleaving sequence, according to an embodiment of the present disclosure.

It can be seen that, the interleaving sequence obtained in the example shown in FIG. 12 is [1 4 2 5 3 7 6 8], which is exactly a de-interleaved sequence of the interleaver obtained in the example shown in FIG. 5C.

More preferably, the method for interleaving the information sequence to be transmitted according to the combination of allocated pseudorandom sequences and numerical digit random sequences further comprises the following steps.

For one of the allocated pseudorandom sequence and the corresponding numerical digit random sequence thereof, each divided sequence is constructed according to the position of each numerical value in the one sequence; each numerical value type of the one sequence is corresponding to one divided sequence, and the number of numerical values of this type is equal to the number of numerical values in the corresponding divided sequence. Specifically, for each numerical value in the one sequence, the series number of a bit represented by this numerical value is used as a numerical value of the corresponding divided sequence.

Each combined sequence is constructed according to the position of each numerical value in the other sequence; each numerical value type of the other sequence corresponds to one combined sequence, and the number of numerical values of this type is equal to the number of numerical values in the corresponding combined sequence. Specifically, for each numerical value in the other sequence, the series number of a bit represented by this numerical value is used as a numerical value of the corresponding combined sequence.

The information sequence to be transmitted is divided into information subsequences of a same number as the number of the divided sequences, according to the numerical values in each divided sequence; an output order of numerical values in each of the information subsequences is determined according to the numerical values in each combined subsequence; numerical values of each of the information subsequences are output according to the determined output order; and an interleaved information sequence is obtained after the numerical values in each information subsequence are output.

Specifically, the interleaving method can be described as follows:

Divided sequences $x_{+1}$ and $x_{-1}$ are defined according to the positions of +1 and +1 in the numerical digit random sequence, wherein the divided sequence $x_{+1}$ is a position sequence of +1 in the numerical digit random sequence, and the divided sequence $x_{-1}$ is a position sequence of −1 in the numerical digit random sequence. An intersection of the sequences $x_{+1}$ and $x_{-1}$ is null, that is, $x_{+1} \cap x_{-1} = \emptyset$.

Combined sequences $b_1$ and $b_0$ are defined according to the positions of 1 and 0 in the pseudorandom binary sequence, wherein the combined sequence $b_1$ is a position sequence of 1 in the pseudorandom binary sequence, and the combined sequence $b_0$ is a position sequence of 0 in the pseudorandom binary sequence. An intersection of the sequences $b_1$ and $b_0$ is null, that is, $b_1 \cap b_0 = \emptyset$; and, the sequences $b_1$ and $x_{+1}$ are equal in length, and the sequences $b_0$ and $x_{-1}$ are equal in length.

The relation between an interleaving input sequence 1 and an interleaving output sequence O is as follows:

$$O(b_1) = I(x_{+1}) \qquad \text{(Formula 9)}$$

$$O(b_0) = I(x_{-1}) \qquad \text{(Formula 10)}$$

The method of generating each sequence is as follows: generating a pseudorandom binary sequence according to the generator polynomial and the initial state, obtaining a pseudorandom binary sequence according to the starting position from which the sequence is cut out and the length of the sequence, and obtaining sequences $b_1$ and $b_0$ according to the positions of 1 and 0. Divided sequences $x_{+1}$ and $x_{-1}$ are generated according to the sequences $b_1$ and $b_0$. One possible generation method is as follows: if the length of the sequences $b_1$ and $b_0$ is $l_1$ and $l_0$, respectively, and if $l_1 < l_0$, then:

$$x_{+1}(i) = 2i - 1, 1 \leq i \leq l_1 \quad \text{(Formula 11)}$$

$$x_{-1}(i) = \begin{cases} 2i, 1 \leq i \leq l_1 \\ i + l_1, l_1 < i \leq l_0 \end{cases} \quad \text{(Formula 12)}$$

Conversely, if $l_0 < l_1$, then:

$$x_{+1}(i) = \begin{cases} 2i - 1, 1 \leq i \leq l_0 \\ i + l_0, l_0 < i \leq l_1 \end{cases} \quad \text{(Formula 13)}$$

$$x_{-1}(i) = 2i, 1 \leq i \leq l_0 \quad \text{(Formula 14)}$$

To further enhance the randomness, after the sequences $b_1$, $b_0$, $x_{+1}$ and $x_{-1}$ are generated, simple interleaving such as block interleaving can be performed on these sequences. More preferably, the method for de-interleaving the received interleaved information sequence according to the combination of constructed binary pseudorandom sequences and numerical digit random sequences, in some embodiments of the present disclosure, further comprises the following steps.

For one of the constructed pseudorandom sequence and the corresponding numerical digit random sequence thereof, each divided sequence is constructed according to the position of each numerical value in the one sequence; and each numerical value type of the one sequence is corresponding to one divided sequence, and the number of numerical values of this type is equal to the number of numerical values in the corresponding divided sequence. Specifically, for each numerical value in the one sequence, the position number of this numerical value in the one sequence is used as a numerical value in the corresponding divided sequence.

Each combined sequence is constructed according to the position of each numerical value in the other sequence; and each numerical value type of the other sequence is corresponding to one combined sequence, and the number of numerical values of this type is equal to the number of numerical values in the corresponding combined sequence. Specifically, for each numerical value in the other sequence, the position number of this numerical value in the other sequence is used as a numerical value of the corresponding combined sequence.

The interleaved information sequence is divided into interleaved information subsequences of a same number as the number of the divided sequences, according to the numerical values in each divided sequence; an output order of numerical values in each of the interleaved information subsequences is determined according to the numerical values in each combined subsequence; numerical values of each of the interleaved information subsequences are output according to the determined output order; and a de-interleaved information sequence is obtained after the numerical values in the interleaved information subsequence are output.

It is to be noted that, the positions of the combined sequences and the divided sequences can be exchanged. In other words, position sequences of 0 and 1 in the binary pseudorandom sequences are used as divided sequences, and position sequences of +1 and −1 in the numerical digit random sequences are used as combined sequences, without any impact on the implementation of the present disclosure. Meanwhile, the positions of 0 and 1 in the combined sequences can be exchanged, and the positions of +1 and −1 in the divided sequences can be exchanged. Moreover, corner marks of the sequences are merely used for distinguishing different values, and are not intended to limit the possibility of other values.

In some embodiments of the present disclosure, the interleaving sequence can be replaced with the combination of binary pseudorandom sequences and corresponding numerical digit random sequences, so that the step of constructing the interleaving sequence is cancelled. Accordingly, the amount of computations for the process of constructing sequences is further decreased, the time delay is further reduced, and the efficiency is further improved.

Moreover, in some embodiments of the present disclosure, different combinations of binary pseudorandom sequences and corresponding numerical digit random sequences are used as identifiers of different users for multiple access, so that the requirements of terminal equipments of a plurality of users for multiple access are met. Further, when the base station configures or informs a user of multiple access signatures, the generator polynomials for binary pseudorandom sequences and the cyclic shifts/initial states can be transmitted to the terminal equipment of the user for storage, so that the signaling overhead for data transmission is reduced greatly, and the data to be stored by the terminal equipment is also less, and a convenient standardization prospect is provided. Meanwhile, the terminal equipment can generate sequences representing the terminal equipment according to the stored generator polynomials and cyclic shifts/initial states.

In some embodiments of the present disclosure, a method for constructing an interleaving sequence based on binary pseudorandom sequences when the length of the interleaving sequence is not a power of 2 will be described.

The technical solutions in both some embodiments are applicable to the case where the length of the interleaving sequence is a power of 2. However, in practical systems, the required length of the interleaver is often not a power of 2. In some embodiments, corrections are performed on the basis of the technical solutions of some embodiments by the following three concepts, to obtain several methods for generating an interleaving sequence based on binary pseudorandom sequences:

concept 1: binary pseudorandom sequences and numerical digit random sequences are corrected;

concept 2: the output interleaving sequence is corrected; and concept 3: the length, which is not a power of 2, is divided into a plurality of lengths of a power of 2, and then interleaving sequences are designed, respectively.

Figure 13:
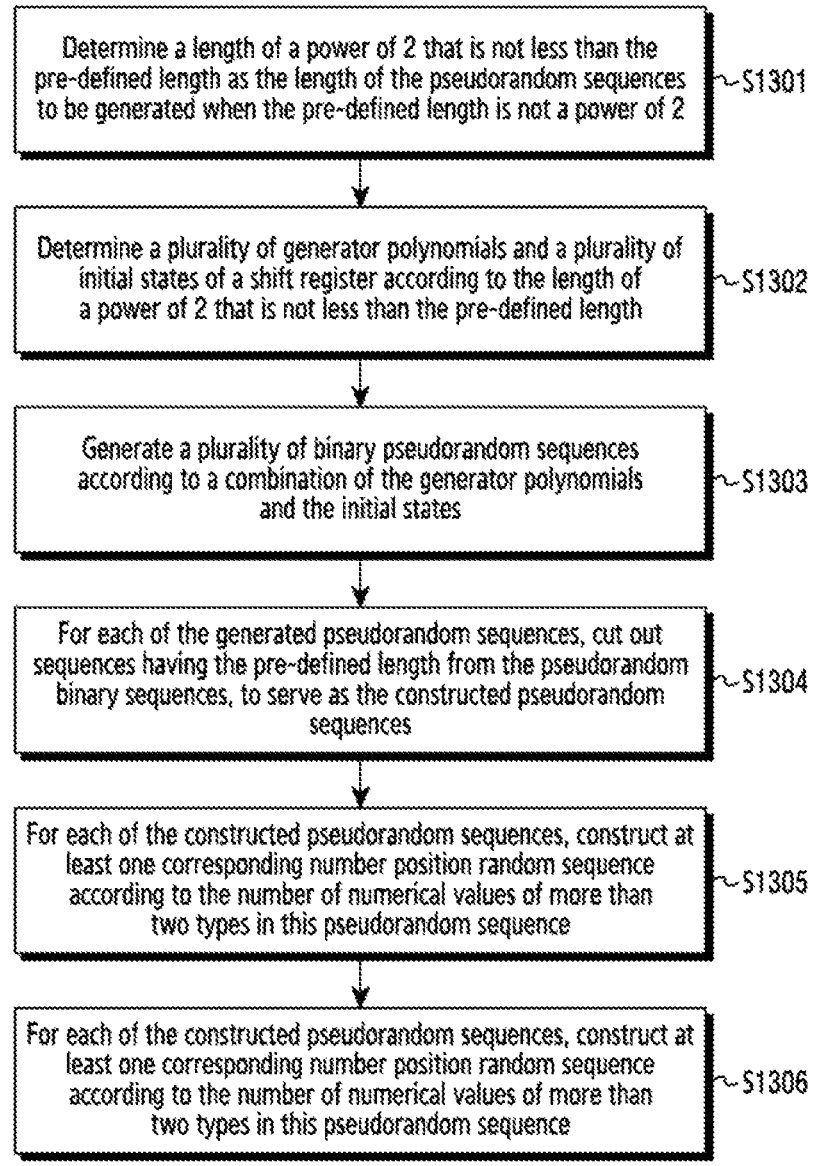
FIG. 13 illustrates a schematic flow diagram of a method for constructing an interleaving sequence based on binary pseudorandom sequences, according to an embodiment of the present disclosure.

The method for constructing an interleaving sequence based on binary pseudorandom sequences in accordance with concept 1 will be described below. The schematic flow diagram of this method is as shown in FIG. 13, comprising the following steps S1301 to S1306.

S1301: When a pre-defined length of an interleaving sequence to be constructed is not a power of 2, a length of a power of 2 that is not less than the pre-defined length is determined as the length of pseudorandom sequences to be generated.

When the pre-defined length of the interleaving sequence to be constructed is not a power of 2, a length not less than a power of 2 of the pre-defined length of the interleaving sequence is determined.

For example, for an interleaving sequence having any length l, a length of the minimum power of 2, which is not less than l, is first selected as $2^r$.

Other methods in this step are the same as the methods in S401 or S601 and will not be repeated here.

S1302: A plurality of generator polynomials and a plurality of initial states of a shift register are determined according to the length of a power of 2 that is not less than the pre-defined length.

The method in this step is the same as the method in S402 or S602 and will not be repeated here.

S1303: A plurality of binary pseudorandom sequences are generated according to a combination of the generated generator polynomials and initial states.

The method in this step is the same as the corresponding method in S403 or S603 and will not be repeated here.

S1304: For each of the generated binary pseudorandom sequences, a sequence having the pre-defined length is cut out from this pseudorandom binary sequence to serve as the constructed pseudorandom sequence.

For example, after binary pseudorandom sequences are generated by using the length of $2^r$, first l elements (numerical values) are cut out from the generated binary pseudorandom sequences to serve as binary pseudorandom sequences generating the interleaving sequence.

Other methods in this step are the same as the corresponding methods in S403 or S603 and will not be repeated here.

S1305: For each of the constructed pseudorandom sequences, at least one corresponding numerical digit random sequence is constructed according to the number of numerical values of more than two types in this pseudorandom sequence.

For each of the constructed pseudorandom sequences, when the constructed pseudorandom sequence is specifically a pseudorandom binary sequence and the pre-defined length is not a length of a power of 2, at least one numerical digit random sequence having numerical values of a type corresponding to the type of numerical values in the pseudorandom sequence and having an equal number of numerical values of a corresponding type is generated.

Specifically, after the binary pseudorandom sequences having a length of l for generating the interleaving sequence are generated, it is required to generate numerical digit random sequences having a length of l. The sequences still include +1 and −1, but the number of +1 and the number of −1 need to be matched with the number of 1 and the number of 0 in the binary pseudorandom sequences generating the interleaving sequence. For example, a method of generating numerical digit random sequences is as follows: the number of 1 and the number of 0 in the random binary sequences are counted and expressed by $l_1$ and $l_0$; if $l_{min}=\min(l_1,l_0)$, +1 and −1 are alternated in first $2l_{min}$ elements in the numerical digit random sequences; if there are more 1 in the random binary sequences, +1 is padded to the remaining elements in the numerical digit random sequences; and, if there are more 0 in the random binary sequences, −1 is padded to the remaining elements in the numerical digit random sequences.

Preferably, for one pseudorandom sequence, the type of numerical values and the number of numerical values of each type in this pseudorandom sequence are determined; and another pseudorandom sequence having a corresponding numerical value type and an equal number of numerical values of a corresponding type is used as a numerical digit random sequence of this pseudorandom sequence.

S1306: For each of the constructed pseudorandom sequences and the corresponding numerical digit random sequence thereof, a corresponding interleaving sequence is constructed according to a mapping relation between this pseudorandom sequence and the numerical digit random sequence.

After the numerical digit random sequences and the binary pseudorandom sequences are obtained, an interleaving sequence having a length of l is obtained according to the method for generating an interleaving sequence in some embodiments. It is also possible to replace the interleaving sequence with a combination of the obtained binary pseudorandom sequences having a length of l and corresponding numerical digit random sequences according to the method in some embodiments, for interleaving and de-interleaving the information sequence.

Another method for constructing an interleaving sequence based on binary pseudorandom sequences in accordance with concept 1 will be described below, comprising the following steps.

When the pre-defined length is not a length of a power of 2, a length of a power of 2 that is not less than the pre-defined length is used as the length of the pseudorandom sequences to be generated; and, a plurality of generator polynomials and a plurality of initial states of a shift register are determined according to the length of a power of 2 that is not less than the pre-defined length.

Binary pseudorandom sequences having a total length equal to pre-defined length and having more than two cycles are generated, according to a combination of the specified generator polynomials and initial states. Wherein, the last one cycle of the more than two cycles is a complete cycle or an incomplete cycle.

Preferably, binary pseudorandom sequences having a total length greater than the pre-defined length and having more than two cycles are generated; and, sequences having the pre-defined length are cut out from a plurality of starting positions of the binary pseudorandom sequences having a total length greater than the pre-defined length, to serve as a plurality of generated pseudorandom sequences.

For each of the constructed (generated) pseudorandom sequences, at least one corresponding numerical digit random sequence is constructed according to the number of numerical values of more than two types in this pseudorandom sequence.

For each of the constructed pseudorandom sequences and the corresponding numerical digit random sequence thereof, a corresponding interleaving sequence is constructed according to a mapping relation between this pseudorandom sequence and the numerical digit random sequence.

Specifically, another method of directly modifying sequences is as follows: directly generating binary pseudorandom sequences having a length of l, then counting the number of 1 and the number of 0 in the binary pseudorandom sequences having a length of l, generating numerical digit random sequences containing a corresponding number of +1 and −1, and generating a corresponding interleaving sequence according to the method in some embodiments. Considering that both M-sequences and Gold sequences are periodic sequences, after the generator polynomial and the corresponding initial state are fixed, sequences can be continuously generated periodically. For example, M-sequences generated from primitive polynomials of degree m are used, where the cycle is $2^m-1$.

Considering that the cycle of the binary pseudorandom sequences is not a decisive factor of the generation method when the interleaving sequence is generated, for the sequences having a length of l, generator polynomials for M-sequences (or generator polynomials for Gold sequences) can be searched to continuously generate binary sequences until the length of the sequences reaches l. The sequences can be one or more cycles of the M-sequences or Gold sequences, or a non-integer number of cycles. Subsequently, the number of 0 and the number of 1 in the binary sequences are counted, and corresponding numerical digit random sequences including +1 and −1 are constructed, so that the interleaving sequence is generated. When the sequences having a length of l are selected, the starting positions cannot be starting points of the generated sequences. For example, if the starting position is specified as $N_S$, when a sequence is read, the sequence having a length of l is read from $N_S$.

More preferably, it is possible to replace, by the method in some embodiments, the interleaving sequence with the binary pseudorandom sequences having a length of l and corresponding numerical digit random sequences obtained by the method in accordance with concept 1, for interleaving and de-interleaving the information sequence. The difference between the interleaving and de-interleaving method and the method in other embodiments lies in that the length of each information subsequence divided from the information sequence is not equal in some embodiments, but the remaining is the same as the interleaving and de-interleaving in other embodiments and will not be repeated here.

Figure 14:
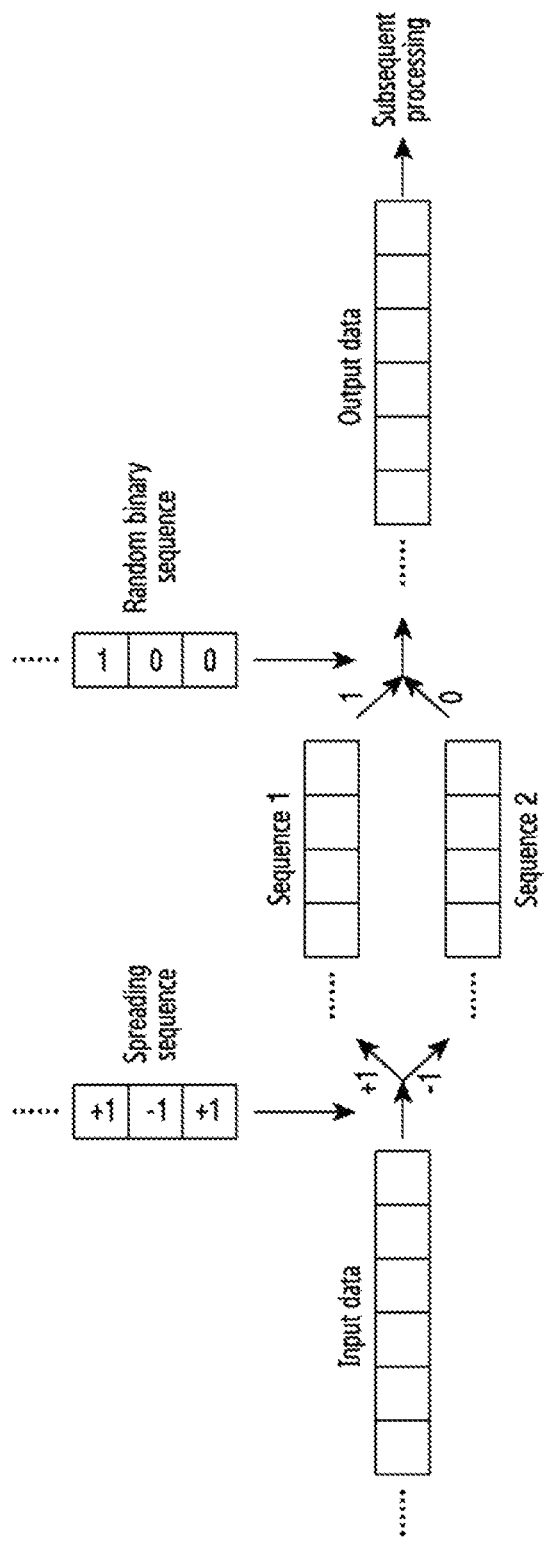
FIG. 14 illustrates a schematic diagram of a specific instance of an interleaving operation based on binary pseudorandom sequences when sequences 1 and 2 are not equal in length, according to an embodiment of the present disclosure.

For example, as shown in FIG. 14, when the information sequence is divided into sequences (i.e., information subsequences) 1 and 2, the sequences 1 and 2 are not equal in length.

A method for constructing an interleaving sequence based on binary pseudorandom sequences in accordance with concept 2 will be described below, comprising the following steps.

When the length of the generated pseudorandom sequences is greater than the pre-defined length, the generated pseudorandom sequences are used as the constructed pseudorandom sequences.

For each of the constructed pseudorandom sequences and the corresponding numerical digit random sequence thereof, an interleaving sequence having a same length as this pseudorandom sequence is constructed according to the mapping relation between this pseudorandom sequence and the numerical digit random sequence.

The interleaving sequence having the same length as this pseudorandom sequence is corrected to obtain an interleaving sequence having the pre-defined length. Specifically, for the interleaving sequence having the same length as this pseudorandom sequence, a former numerical value greater than a pre-defined threshold in this interleaving sequence is replaced with a later numerical value not greater than the threshold until the numerical values within the pre-defined length, starting from the first bit, are not greater than the threshold; and, starting from the first bit, a sequence having the pre-defined length is cut out to serve as the constructed interleaving sequence; or, a value having the pre-defined length is used as a threshold, and numerical values greater than the threshold are removed from the interleaving sequence having a same length as this pseudorandom sequence.

Preferably, if the length of the interleaving sequence to be generated is l, the minimum power of 2 not less than l is selected and expressed by $2^t$. An interleaving sequence having a length of $2^t$ is obtained by the method for generating an interleaving sequence based on M-sequences or Gold sequences in some embodiments, and then this interleaving sequence is processed and corrected to obtain an interleaving sequence having a length of l.

A method for processing and modifying an interleaving sequence based on position exchange is as follows: values greater than l among first l elements in the interleaving sequence are selected and then successively replaced with values less than or equal to l among later l elements in the interleaving sequence until there is no value greater than l among the first l elements in the interleaving sequence. First l elements in the position-exchanged sequence are cut out to serve as a final interleaving sequence.

Another method for processing and modifying an interleaving sequence based on removal is as follows: removing all values greater than l in the interleaving sequence after the sequence having a length of $2^t$ is generated, so that a final interleaving sequence having a length of $2^t$ is obtained.

More preferably, it is possible to replace, by the method in some embodiments, the interleaving sequence with the binary pseudorandom sequences having a length of l and the corresponding numerical digit random sequences obtained by the method in accordance with concept 2, for interleaving and de-interleaving the information sequence. Specifically, the number of +1 and the number of −1 in the numerical digit random sequences are still the same, and sequences 1 and 2 obtained by dividing the information sequence as input data are equal in length. However, the number of 1 and the number of 0 in binary pseudorandom sequences are not the same. The data in one sequence (sequence 1 or 2) will be all read first. In this case, if it is still required to read data from this sequence, data will be read from the other sequence still having data therein. Specifically, the first method based on position exchange is corresponding to reading data from the tail end of a still having data therein; however, the another method based on removal is corresponding to reading the first data, which has not been read, from the sequence still having data therein.

For concept 3, considering that the actual mapping from bits to symbols is mapping from an even number of bits to one symbol, the interleaving sequence generally has a length of an even number. Considering that any even number can be divided into the sum of a multiple of a power of 2, a sequence having a length of an even number can be divided into a plurality of sequences having a length of a power of 2, corresponding interleaving sequences are designed and combined finally so that the interleaving sequence is thus obtained.

A method for constructing an interleaving sequence based on binary pseudorandom sequences in accordance with concept 2 will be described below, comprising the following steps.

When the pre-defined length is not a power of 2 and is an even number, the pre-defined length is divided into a plurality of lengths of a power of 2, to serve as lengths of a plurality of pseudorandom sequences to be generated, respectively; for each of the divided lengths of a power of 2, a pseudorandom binary sequence is generated according to the length of a power of 2 to serve as a pseudorandom binary sequence having the length of a power of 2; for each of the binary pseudorandom sequences having the length of a power of 2, a numerical digit random sequence having the length of a power of 2 is constructed according to the number of numerical values of more than two types in this pseudorandom binary sequence; an interleaving sequence having the length of a power of 2 is constructed according to a mapping relation between each numerical digit random sequence having the length of a power of 2 and the pseudorandom binary sequence; and, the interleaving sequences having the length of a power of 2 are cascaded to form a sequence having the pre-defined length, to serve as the constructed interleaving sequence.

Specifically, for the sequences having the length of l, the maximum a power of 2 not greater than l is selected as $2^{r_1}$, and an interleaving sequence 1 having a length of $2^{r_1}$ is designed; then, for the remaining sequences having the length of $l-2^{r_1}$, the maximum a power of 2 not greater than $l-2^{r_1}$ is selected as $2^{r_2}$, and an interleaving sequence 2 having a length of $2^{t_2}$ is designed; and, this process will be repeated until the length of the remaining sequences is also a power of 2.

During this process, the even number l is divided as the following formula:

$$l=\Sigma_i 2^{t_i} \qquad \text{(Formula 15)}$$

For each $t_i$, an interleaving sequence having a length of $2^{t_i}$ is designed, and the obtained sequences are cascaded to obtain a final interleaving sequence. To enhance the randomness after interleaving, a subsequent simple operation, for example, a block interleaving operation, is performed on the obtained interleaving sequence, so as to obtain an interleaving sequence having better randomness.

For the sequences having a length of an even number, due to $1=2^0$, the interleaving sequence can also be generated in the above way. After the interleaving sequence is obtained, it is required to perform a subsequent operation of simple interleaving (for example, block interleaving or more) on the interleaving sequence, so as to obtain an interleaving sequence having better randomness.

In addition, the methods in concept 1 to concept 3 can also be combined.

The several methods of processing an interleaving sequence having a length not a power of 2 can be combined, so that the complexity of generating the interleaving sequence is reduced and the randomness of the interleaved sequence is improved.

As one possible combination method, for a sequence having a length of l, l is divided as the following formula:

$$l=\Sigma_{i=1}^{Q} 2^{t_i}+l_{re} \qquad \text{(Formula 16)}$$

Wherein, a lager power of 2 of Q is selected to generate an interleaving sequence; while the remaining parts, i.e., sequences having a length of $l_{re}$, are generated by the method in concept 1 or 2. To enhance the randomness after interleaving, a subsequence simple operation, for example, a block interleaving operation, is performed on the obtained interleaving sequence, so as to obtain an interleaving sequence having better randomness.

In some embodiments of the present disclosure, the pre-defined length of the sequences is extended from the length of a power of 2 to the length not a power of 2. According to the length not a power of 2, different binary pseudorandom sequences can be generated by different generator polynomials and/or different initial states of a shift register; different binary pseudorandom sequences are obtained by performing cyclic shifts on a same pseudorandom binary sequence; different numerical digit random sequences can be generated for a same pseudorandom binary sequence; and a plurality of interleaving sequences having a same pre-defined length can be constructed according to the binary pseudorandom sequences and corresponding numerical digit random sequences. During the construction process, a small amount of computations is required, the time delay is less, and the efficiency is high.

Moreover, in some embodiments of the present disclosure, different interleaving sequences are used as identifiers of different users for multiple access, so that the requirements of terminal equipments of a plurality of users for multiple access are met. Further, when the base station configures or informs a user of multiple access signatures, the generator polynomials for binary pseudorandom sequences and the cyclic shifts/initial states can be transmitted to the terminal equipment of the user for storage, so that the signaling overhead for data transmission is reduced greatly, the data to be stored by the terminal equipment is also less, and a convenient standardization prospect is realized.

In one embodiment of the present disclosure, a method for constructing an interleaving sequence based on M-ary pseudorandom sequences and a corresponding information processing method will be described.

The solutions described in the foregoing embodiments are based on binary sequences (the pseudorandom sequences are binary sequences including 0 and 1, and the numerical digit random sequences are two-value sequences including +1 and −1). Actually, the solutions provided by the present disclosure can also be extended to M-ary sequences. For an M-ary sequence, the determination of the sequence cycle is more complicated than the determination of the cycle of a binary sequence. As the generation of an interleaving sequence having any length still needs to be taken into consideration during generating an interleaving sequence by using M-ary sequences, the cycle of the M-ary sequences will not be limited in this embodiment.

Figure 15:
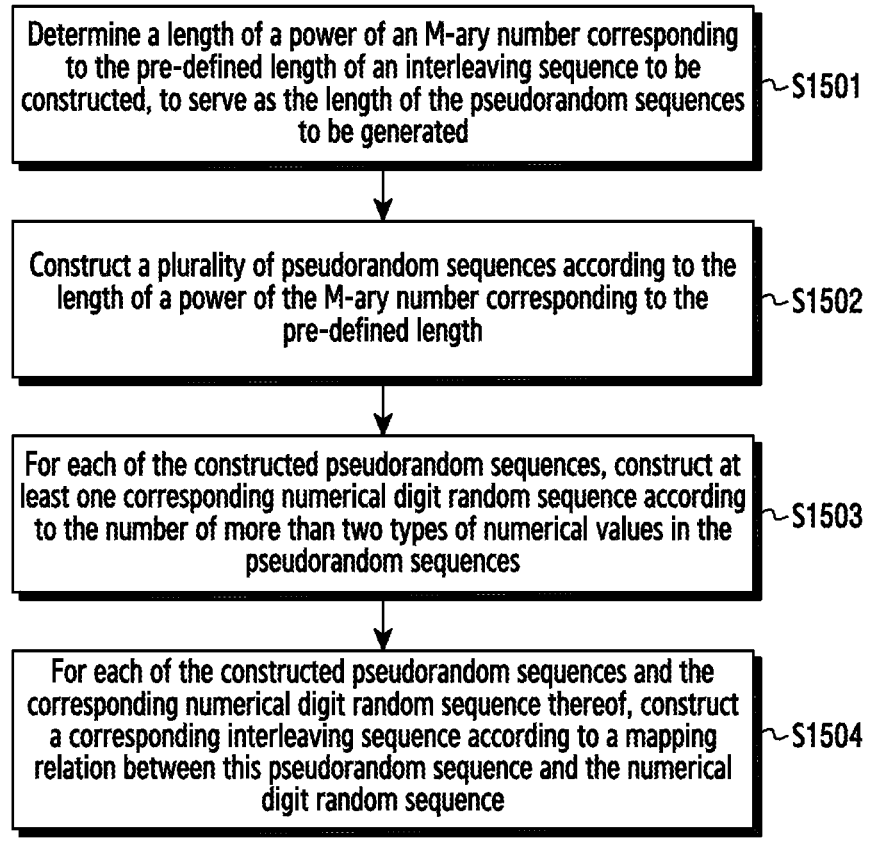
FIG. 15 illustrates a schematic flow diagram of a method for constructing an interleaving sequence based on M-ary pseudorandom sequences, according to an embodiment of the present disclosure.

The method for constructing an interleaving sequence based on M-ary pseudorandom sequences in this embodiment will be described below. The schematic flow diagram of this method is as shown in FIG. 15, comprising the following steps S1501 to S1504.

S1501: A length of a power of an M-ary number corresponding to the pre-defined length of an interleaving length to be constructed is determined as the length of the pseudorandom sequences to be generated.

For the pre-defined length of an interleaving length to be constructed, a length of a power of an M-ary number not less than the pre-defined length is determined from a plurality of lengths of a power of the M-ary number, to serve as the corresponding length of a power of the M-ary number.

Other methods in this step are the same as the methods in S401 or S601 and will not be repeated here.

S1502: A plurality of pseudorandom sequences are constructed according to the length of a power of the M-ary number corresponding to the pre-defined length.

A plurality of generator polynomials and a plurality of initial states of a shift register are determined according to the length of a power of the M-ary number determined in the above step.

A plurality of pseudorandom pre-defined M-ary sequences are generated according to the following combinations of the generator polynomials and the initial states: a plurality of generator polynomials and a same initial state; a same generator polynomial and a plurality of initial states; a plurality of generator polynomials and a plurality of initial states; and, a same generator polynomial and a same initial state.

The M-ary pseudorandom sequences are specifically original M-ary pseudorandom sequences or synthesized M-ary pseudorandom sequences, wherein the synthesized M-ary pseudorandom sequences are generated by performing bitwise summation and then bitwise modulo-M on more than two original M-ary pseudorandom sequences having the same length.

Preferably, the generating a plurality of pseudorandom pre-defined M-ary sequences according to a same generator polynomial and a same initial state comprises at least one of the following.

Multiple times of cyclic shifts are performed on numerical values in the original M-ary pseudorandom sequences to obtain a plurality of original M-ary pseudorandom sequences.

Sequences having the pre-defined length are cut out from a plurality of starting positions of the original M-ary pseudorandom sequences to obtain a plurality of original M-ary pseudorandom sequences.

Multiple times of cyclic shifts are performed on numerical values in the synthesized M-ary pseudorandom sequences to obtain a plurality of synthesized M-ary pseudorandom sequences.

Multiple times of cyclic shifts are performed on numerical values in at least one original M-ary pseudorandom sequence generating the synthesized M-ary pseudorandom sequences to generate a plurality of synthesized M-ary pseudorandom sequences. Specifically, for the synthesized M-ary pseudorandom sequences, for at least one original M-ary pseudorandom sequence generating the sequences, multiple cyclic shifts are performed on numerical values in the at least one original M-ary pseudorandom sequence to generate a plurality of synthesized M-ary pseudorandom sequences.

Sequences having the pre-defined length are cut out from a plurality of starting positions of the synthesized M-ary pseudorandom sequences to obtain a plurality of synthesized M-ary pseudorandom sequences.

Taking B-ary sequences as example, a method for generating pseudorandom B-ary sequences can comprise: generating B-ary sequences in the method shown in FIG. 5A, where the plus sign in this figure represents modulo-B summation so that the output sequences only contain integers from 0 to B−1.

Taking B=4 as example, the generator polynomial is selected as:

$$f(x)=1+x^2+x^5 \quad \text{(Formula 17)}$$

The initial state is selected as [0 1 2 3 0]. The clip position is the starting position of the sequence, the clip length is l=16, and the obtained quaternary sequence is [3 0 2 1 0 0 0 2 1 2 1 2 3 3 1 0].

Another method of generating pseudorandom B-ary sequence is similar to the method of generating Gold sequences in some embodiments. Two or more original pseudorandom B-ary sequences are generated by generator polynomials and corresponding initial states, and bitwise modulo-B operation and bitwise summation are performed on these original pseudorandom B-ary sequences to obtain a combined pseudorandom B-ary sequence.

S1503: For each of the constructed pseudorandom sequences, at least one corresponding numerical digit random sequence is constructed according to the number of numerical values of more than two types in this pseudorandom sequence.

For example, the frequency of occurrence of each number in the B-ary sequences is counted, and B-ary numerical digit random sequences are constructed on this basis. Wherein, the frequency of occurrence of each number in the B-ary numerical digit random sequences is the same as that of each number in the B-ary sequences.

Still taking the quaternary sequence as example, the frequency of occurrence of 1 is 5, the frequency of occurrence of 1 is 4, the frequency of occurrence of 2 is 4, and the frequency of occurrence of 3 is 3. In this case, the constructed quaternary numerical digit random sequence is [0 1 2 3 0 1 2 3 0 1 2 3 0 1 2 0].

Other methods in this step are the same as the methods in S404, S604 or S1305 and will not be repeated here.

S1504: For each of the constructed pseudorandom sequences and the corresponding numerical digit random sequence thereof, a corresponding interleaving sequence is constructed according to a mapping relation between this pseudorandom sequence and the numerical digit random sequence.

For one of the numerical digit random sequence and the pseudorandom sequence, for each numerical value type in the one sequence, numerical values of this numerical value type are mapped to numerical values of a type corresponding to this numerical value type in the other sequence.

For each numerical value in the other sequence, this numerical value is replaced with the position number of a numerical value in the one sequence to which this numerical value is mapped, to obtain the interleaving sequence.

For example, an interleaving sequence is constructed according to the B-ary sequences and the B-ary numerical digit random sequences.

Specifically, B-ary spread columns are traversed; if there is a number 0, the number 0 is mapped to the position of the first 0 which has not been mapped in the B-ary sequence; if there is a number n, 0<n<B, this number n is mapped to the position of the first n which has not been mapped in the B-ary sequence.

Figure 16:
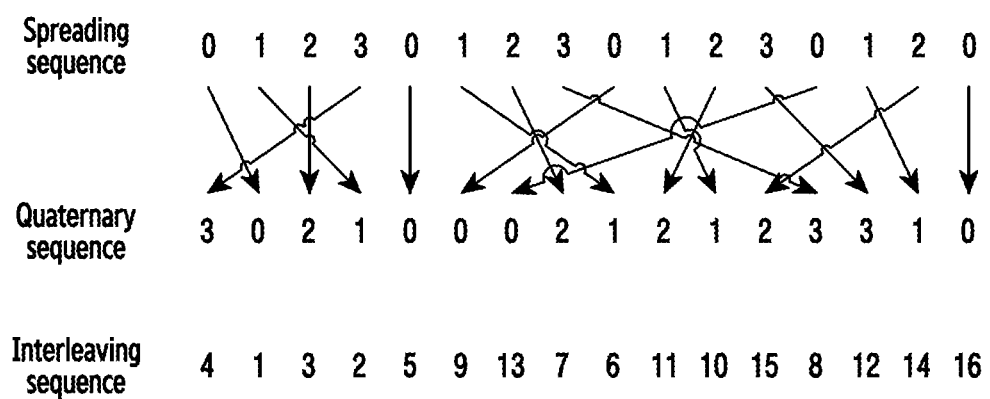
FIG. 16 illustrates a schematic diagram of an instance of constructing an interleaving sequence based on pseudorandom quaternary sequences, according to an embodiment of the present disclosure.

Still taking the quaternary sequence as example, the construction process is as shown in FIG. 16. From the starting bit to the last bit of a numerical digit random sequence, 0, 1, 2 or 3 in the numerical digit random sequence is mapped to first 0, 1, 2 or 3 which has not been mapped in the quaternary sequence, respectively.

In the example shown in FIG. 16, the finally generated interleaving sequence is [4 1 3 2 5 9 13 7 6 11 10 15 8 12 14 16]. Compared with the method of generating an interleaving sequence based on binary sequences, the randomness of this sequence is better.

Other methods in this step are the same as the methods in S405, S605 or S1306 and will not be repeated here.

Actually, when it is required to generate a plurality of interleaving sequences for a plurality of users, the following methods can be adopted.

1. Different initial states are used.

Similar to the method of generating an interleaving sequence based on binary sequences, different interleaving sequences can be obtained by changing the initial state of a register when random M-ary sequences are generated.

2. Different starting positions are used.

When the generator polynomials and the initial state for each generator polynomial are fixed, different random M-ary sequences can be obtained by changing the starting position from which the sequences are cut out, so that different interleaving sequences are obtained.

3. Different cyclic shifts are used.

When the generator polynomials and the initial state for each generator polynomial are fixed and when the starting position from which the sequences are cut out is also fixed, only the same random M-ary sequences can be obtained. In this case, if different cyclic shifts are performed on the random M-ary sequences, different interleaving sequences can also be obtained.

4. Different M-ary numerical digit random sequences are used.

The mapping mode of the same number position random M-ary sequences will be changed by changing M-ary numerical digit random sequences, so that different interleaving sequences are obtained. Therefore, different interleaving sequences can also be obtained by using different M-ary sequences.

5. Different generator polynomials are used.

6. A combination of the above methods is used.

It can be seen that, in comparison to the method of generating an interleaving sequence based on binary sequences, an interleaving sequence based on M-ary sequences can provide a higher degree of freedom and generate more interleaving sequences, and the generated interleaving sequences have better randomness.

In some embodiments of the present disclosure, a transmitter allocates the constructed interleaving sequences or sequence information for constructing interleaving sequences to a plurality of receivers.

The transmitter indicates the sequence information by, but not limited to, any one of the following: a physical broadcast channel, a physical downlink control channel and a high-layer signaling. And, the indicated sequence information includes: a pre-defined length of the interleaving sequences, a pre-defined M-ary sequences mechanism of the pseudorandom sequences, generator polynomials and the initial states of the shift register. Further, the indicated sequence information further comprises at least one of the following: the number of cyclic shifts performed on the pseudorandom sequences and/or the interleaving sequences; an arrangement order of numerical values in the numerical digit random sequences; and, starting positions from which the pseudorandom sequences are cut out from the original sequences. Preferably, in the embodiment of the present disclosure, the pre-defined M-ary sequences mechanism of the pseudorandom sequences is a binary mechanism, and the pseudorandom sequences are binary pseudorandom sequences.

In addition, a method for de-interleaving, by a transmitter, the received interleaved information sequence according to the combination of allocated binary pseudorandom sequences and numerical digit random sequences can refer to the de-interleaving method on a receiver side shown in FIG. 10, and will not be repeated here.

In some embodiments of the present disclosure, a receiver can acquire the interleaving sequence or a combination of pseudorandom sequences and numerical digit random sequences by, but not limited to, any one of the following: a physical broadcast channel, a physical downlink control channel and a high-layer signaling.

And, the acquired sequence information includes: a pre-defined length of the interleaving sequence, a pre-defined M-ary sequences mechanism of the pseudorandom sequences, generator polynomials and the initial states of the shift register.

Further, the indicated sequence information further comprises at least one of the following: the number of cyclic shifts performed on the pseudorandom sequences and/or the interleaving sequences; an arrangement order of numerical values in the numerical digit random sequences; and, starting positions from which the pseudorandom sequences are cut out from the original sequences.

The constructing, by the receiver, an interleaving sequence according to the acquired sequence information comprises: constructing a plurality of pseudorandom sequences according to the sequence information; constructing corresponding numerical digit random sequences according to the number of numerical values of more than two types in the constructed pseudorandom sequences; and constructing a corresponding interleaving sequence according to a mapping relation between the constructed pseudorandom sequences and the numerical digit random sequences.

Wherein, the constructing pseudorandom sequences according to the sequence information comprises: generating pseudorandom pre-defined M-ary sequences according to the pre-defined M-ary sequences mechanism of the pseudorandom sequences, the generator polynomials and the initial states of the shift register in the sequence information; using the generated pseudorandom pre-defined M-ary sequences as the constructed pseudorandom sequences; or, determining sequences having the present length from the generated pseudorandom pre-defined M-ary sequences to serve as the constructed pseudorandom sequences.

Preferably, the constructing, by the receiver, an interleaving sequence according to the acquired sequence information further comprises: performing cyclic shifts on numerical values in the generated pseudorandom pre-defined M-ary sequences or performing cyclic shifts on numerical values in the constructed pseudorandom sequences, according to the number of cyclic shifts performed on the pseudorandom sequences in the sequence information; or, cutting out sequences having the pre-defined length from corresponding starting positions of the generated pseudorandom pre-defined M-ary sequences, according to the starting positions from which the pseudorandom sequences are cut out from the original sequences in the sequence information; or, adjusting the order of numerical values in the constructed pseudorandom sequences, according to the arrangement order of numerical values in the numerical digit random sequences in the sequence information; or, performing cyclic shifts on numerical values in the constructed interleaving sequence, according to the number of cyclic shifts performed on the interleaving sequence in the sequence information.

In some embodiments of the present disclosure, the processing, by a receiver, a received information sequence or an information sequence to be transmitted according to the constructed interleaving sequence or a combination of pseudorandom sequences and numerical digit random sequences specifically comprises: de-interleaving the received interleaved information sequence according to the constructed interleaving sequence or a combination of pseudorandom sequences and numerical digit random sequences; and/or interleaving the information sequence to be transmitted according to the constructed interleaving sequence or a combination of pseudorandom sequences and numerical digit random sequences.

More preferably, it is possible to process (including an interleaving operation and a de-interleaving operation), by the interleaving and de-interleaving method in some embodiments, the information sequence according to the combination of the constructed pseudorandom sequences and the corresponding numerical digit random sequences in some embodiments.

Figure 17:
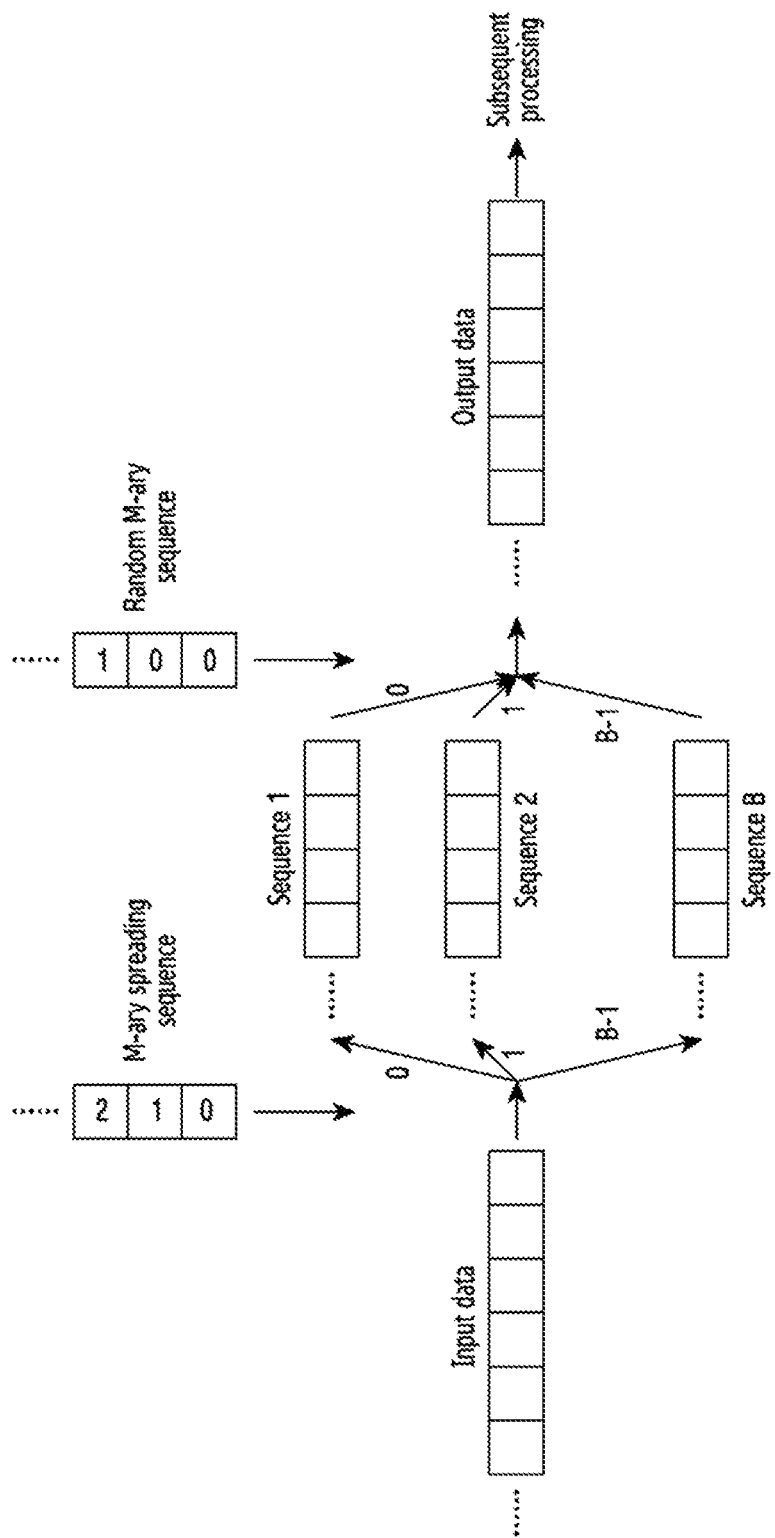
FIG. 17 illustrates a schematic flow diagram of a method for interleaving an information sequence, according to a combination of M-ary pseudorandom sequences and numerical digit random sequences, according to an embodiment of the present disclosure.

Specifically, FIG. 17 is a schematic diagram of interleaving an information sequence to be transmitted according to a combination of pseudorandom sequences and numerical digit random sequences. For example, a method for interleaving an information sequence to be transmitted according to a combination of pseudorandom B-ary sequences and numerical digit random sequences comprises: by a transmitter, dividing the information sequence into B sequences according to the B-ary numerical digit random sequences, and combining the B sequences according to the pseudorandom B-ary sequences. B is an integer greater than 2. Further, to enhance the randomness of the interleaved information sequence, a subsequent operation can be additionally performed on the obtained interleaved information sequence. The subsequent operation can be specifically: performing simple interleaving (for example, block interleaving or more) on the interleaved information sequence.

Figure 18:
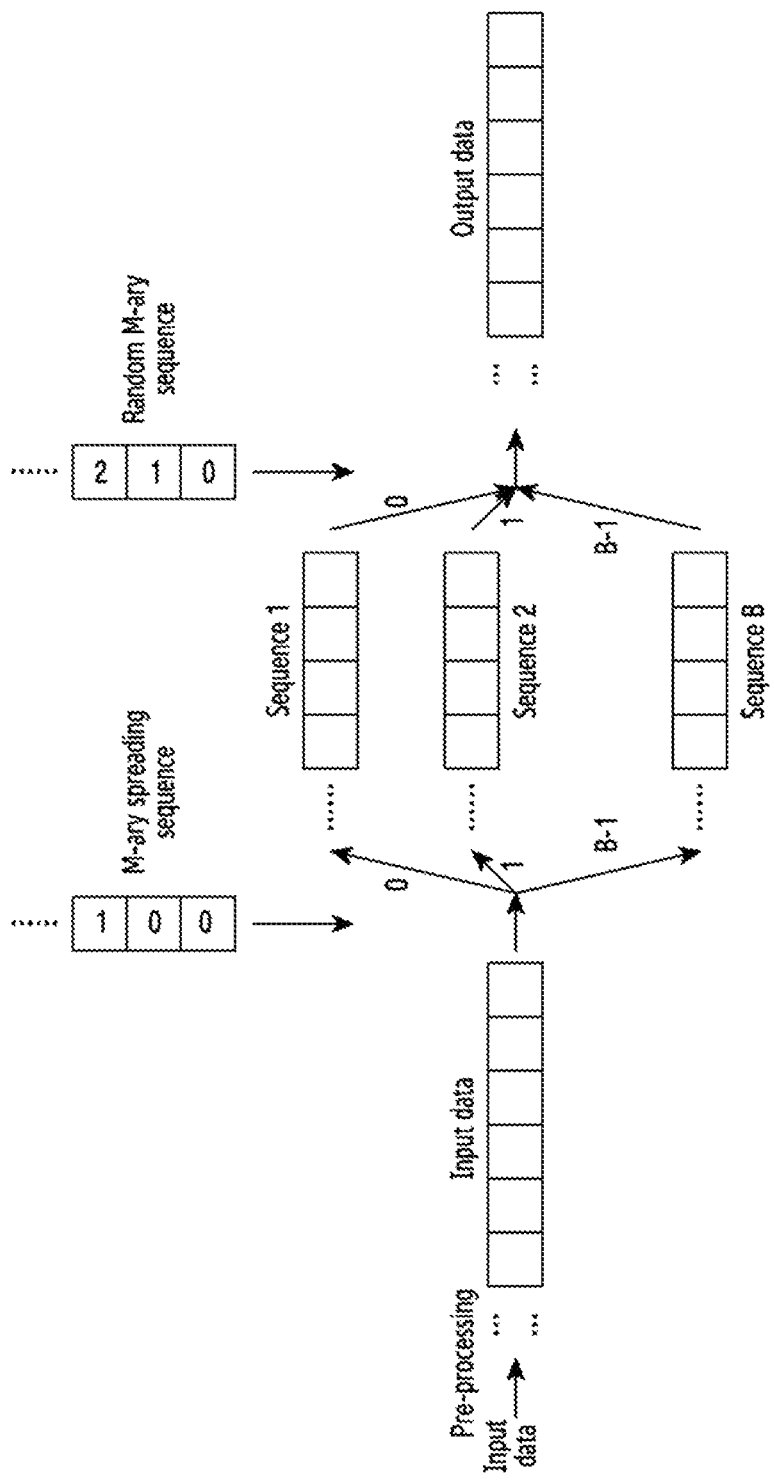
FIG. 18 illustrates a schematic diagram of a method for de-interleaving an information sequence, according to a combination of M-ary pseudorandom sequences and numerical digit random sequences, according to an embodiment of the present disclosure.

FIG. 18 is a schematic diagram of an instance of de-interleaving the received interleaved information sequence according to a combination of M-ary pseudorandom sequences and numerical digit random sequences. A de-interleaving method based on B-ary sequences comprises: by a receiver, dividing the interleaved information sequence into B sequences according to M-ary pseudorandom sequences, and combining the B sequences into an information sequence according to the M-ary numerical digit random sequences. Further, a pre-operation (an inverse operation of the subsequent operation on the transmitter side) can be additionally performed, before the interleaved information sequence is divided into B sequences according to M-ary pseudorandom sequences. The pre-operation can be: performing simple de-interleaving (for example, block de-interleaving or more) on the interleaved information sequence.

Preferably, in the interleaving method shown in FIG. 17, it is also possible to perform simple interleaving (for example, block interleaving or more) on the B sequences obtained by dividing according to the M-ary numerical digit random sequences. Correspondingly, in the de-interleaving method shown in FIG. 18, the interleaved information sequence as input data is first divided into B sequences according to the M-ary pseudorandom sequences, then simple de-interleaving (for example, an inverse operation of simple interleaving in the interleaving operation, such as block de-interleaving or more) is performed on the B sequences, and these simply de-interleaved B sequences are combined according to the M-ary numerical digit random sequences, so that the randomness of the sequences is further enhanced.

Further, the interleaving method in some embodiments of the present disclosure further comprises: for one of the allocated pseudorandom sequences and the corresponding numerical digit random sequence thereof, constructing each divided sequence according to the position of each numerical value in the one sequence, where each numerical value type of the one sequence is corresponding to one divided sequence, and the number of numerical values of this type is equal to the number of numerical values in the corresponding divided sequence. Specifically, for each numerical value in the one sequence, the series number of a bit represented by this numerical value is used as a numerical value of the corresponding divided sequence.

Each combined sequence is constructed according to the position of each numerical value in the other sequence, where each numerical value type of the other sequence is corresponding to one combined sequence, and the number of numerical values of this type is equal to the number of numerical values in the corresponding combined sequence. Specifically, for each numerical value in the other sequence, the series number of a bit represented by this numerical value is used as a numerical value of the corresponding combined sequence.

The information sequence to be transmitted is divided into information subsequences of a same number as the number of the divided sequences, according to the numerical values in each divided sequence; an output order of numerical values in each of the information subsequences is determined according to the numerical values in each combined sequence; numerical values of each of the information subsequences are output according to the determined output order; and an interleaved information sequence is obtained after the numerical values in each information subsequence are output.

Specifically, the interleaving method can be described as follows.

B divided sequences $\{b_m\}_{m=0}^{B-1}$ are defined according to the position of each numerical value in the numerical digit random sequence, wherein the divided sequence $x_m$ is a position sequence of m in the numerical digit random sequence. The intersection of the divided sequences is null, that is, $\cap_{m=0}^{B-1} x_m = \emptyset$.

Combined sequences $\{b_m\}_{m=0}^{B-1}$ are defined according to the position of each numerical value in the M-ary pseudorandom sequence, wherein the combined sequence $b_m$ is a position sequence of m in the M-ary pseudorandom sequence. The intersection of the combined sequence is null, that is, $\cap_{m=0}^{B-1} b_m = \emptyset$; and sequences $b_m$ and $x_m$ are equal in length.

The relation between an interleaving input sequence I and an interleaving output sequence O is as follows:

$$O(b_m) = I(x_m), 0 \leq m \leq B-1 \quad \text{(Formula 18)}$$

The method of generating sequences is as follows: generating M-ary pseudorandom sequences according to the generator polynomials and initial states, obtaining M-ary pseudorandom sequences according to the starting positions from which the sequences is cut out and the length of the sequences, and obtaining combined sequences $\{b_m\}_{m=0}^{B-1}$ according to the position of each numerical value. Divided sequences $\{x_m\}_{m=0}^{B-1}$ are generated according to the length of the sequences $\{b_m\}_{m=0}^{B-1}$.

To further enhance the randomness, after the combined sequences $\{b_m\}_{m=0}^{B-1}$ and the divided sequences $\{x_m\}_{m=0}^{B-1}$ are generated, simple interleaving such as block interleaving can be performed on these sequences, respectively.

More preferably, the method for de-interleaving the received interleaved information sequence according to the combination of constructed binary pseudorandom sequences and numerical digit random sequences, in some embodiments of the present disclosure, further comprises the following steps.

For one of the constructed pseudorandom sequences and the corresponding numerical digit random sequence thereof, each divided sequence is constructed according to the position of each numerical value in the one sequence, where each numerical value type of the one sequence is corresponding to one divided sequence, and the number of numerical values of this type is equal to the number of numerical values in the corresponding divided sequence. Specifically, for each numerical value in the one sequence, the position number of this numerical value in the one sequence is used as a numerical value in the corresponding divided sequence.

Each combined sequence is constructed according to the position of each numerical value in the other sequence, where each numerical value type of the other sequence is corresponding to one combined sequence, and the number of numerical values of this type is equal to the number of numerical values in the corresponding combined sequence. Specifically, for each numerical value in the other sequence, the position number of this numerical value in the other sequence is used as a numerical value of the corresponding combined sequence.

The interleaved information sequence is divided into interleaved information subsequences of a same number as the number of the divided sequences, according to the numerical values in each divided sequence; an output order of numerical values in each of the interleaved information subsequences is determined according to the numerical values in each combined sequence; numerical values of each of the interleaved information subsequences are output according to the determined output order; and a de-interleaved information sequence is obtained after the numerical values in the interleaved information subsequence are output.

It is to be noted that, the positions of the combined sequences and the divided sequences can be exchanged. In other words, the position sequences of each numerical value in the M-ary pseudorandom sequences are used as divided sequences, and the position sequences of each numerical value in the numerical digit random sequences are used as combined sequences, without any impact on the implementation of the present disclosure. Meanwhile, the positions of the numerical values in the combined sequences can be exchanged, and the positions of the numerical values in the divided sequences can be exchanged. Moreover, corner marks of the sequences are merely used for distinguishing different values, and are not intended to limit the possibility of other values.

Actually, the method of generating an interleaving sequence based on M-ary sequences can make the mapping between codeword and stream in a Multi-Input Multi-Output (MIMO) system simpler.

Figure 19:
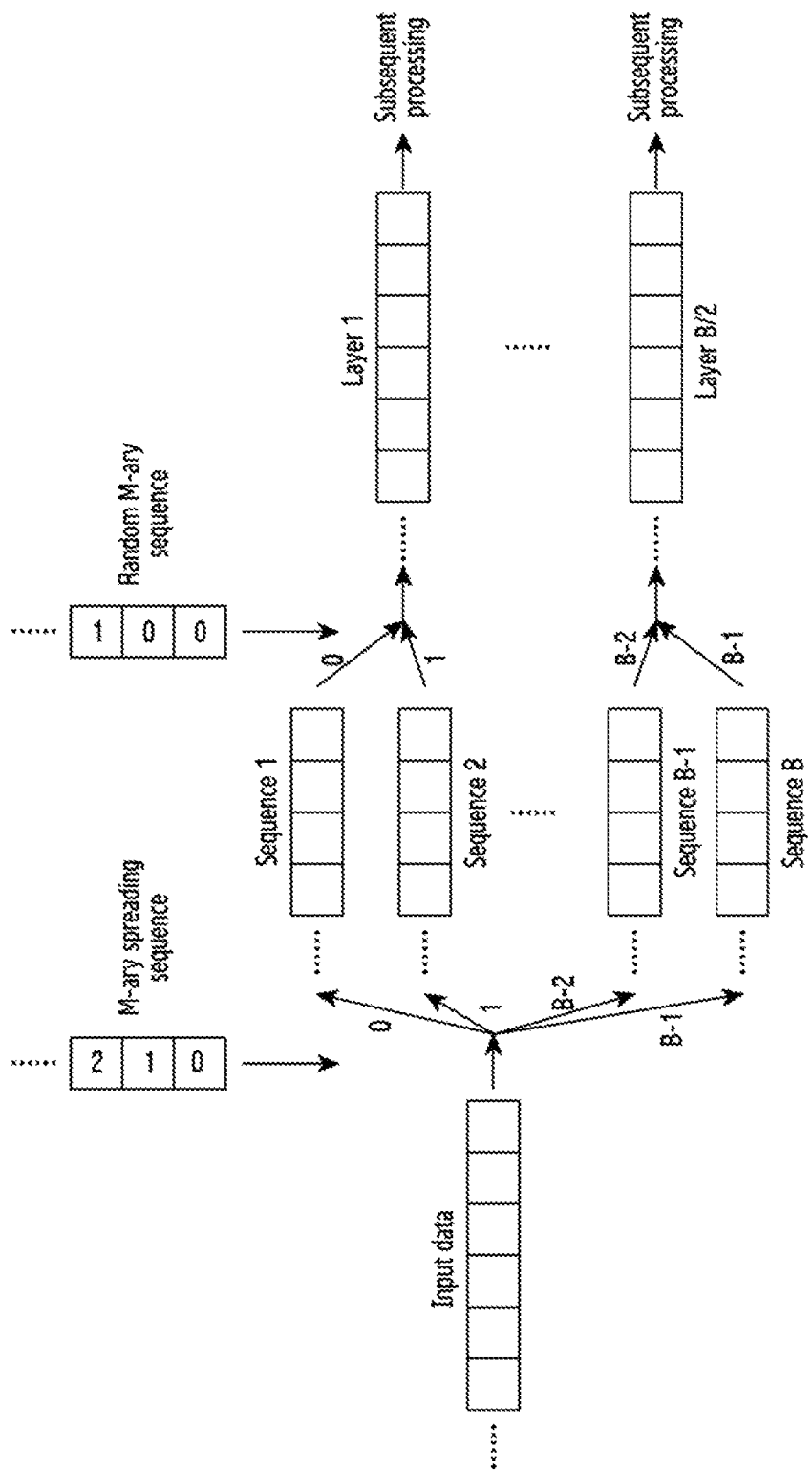
FIG. 19 illustrates a schematic diagram of an instance of an interleaving method based on M-ary pseudorandom sequences and numerical digit random sequences in an MIMO system, according to an embodiment of the present disclosure.

FIG. 19 is a schematic diagram of an implementation of the interleaving method in the MIMO system. As shown in FIG. 19, in the MIMO system, a transmitter needs to map a coded and modulated symbol stream (codeword) to different layers, and then transmit the symbol stream (codeword) by pre-coding or other operations from different antenna ports.

FIG. 19 shows an example of mapping a symbol stream (codeword) to B/2 data streams, where B is an even number. In FIG. 19, the information sequence as input data is divided into B sequences according to the M-ary numerical digit random sequences, the B sequences are combined according to the random M-ary sequences, and data for a plurality of data streams (layers) is generated.

A method for combining B sequences into B/2 data streams (layers) is as shown in FIG. 19. If the value in the M-ary pseudorandom sequence is 2n−2 or 2n−1, the first data which has not been mapped in the sequence 2n−2 or 2n is input to the data stream n, where 0≤n≤B/2. To enhance the randomness of the interleaved data, before or after interleaving, it is possible to perform simple interleaving (for example, block interleaving or more) on the input data or the output data; or, after the data is divided into a plurality of sequences, simple interleaving is performed on the sequences.

It is to be noted that, to ensure the consistent data rate of a plurality of data streams (layers), it is required to adjust the frequency of occurrence of each number in the random M-ary sequences and the M-ary numerical digit random sequences, so that the frequency of occurrence of each number is consistent. After the frequency is consistent, the length of each sequence obtained by dividing according to the M-ary numerical digit random sequences is consistent, so that data streams having the same data rate can be obtained.

Figure 20:
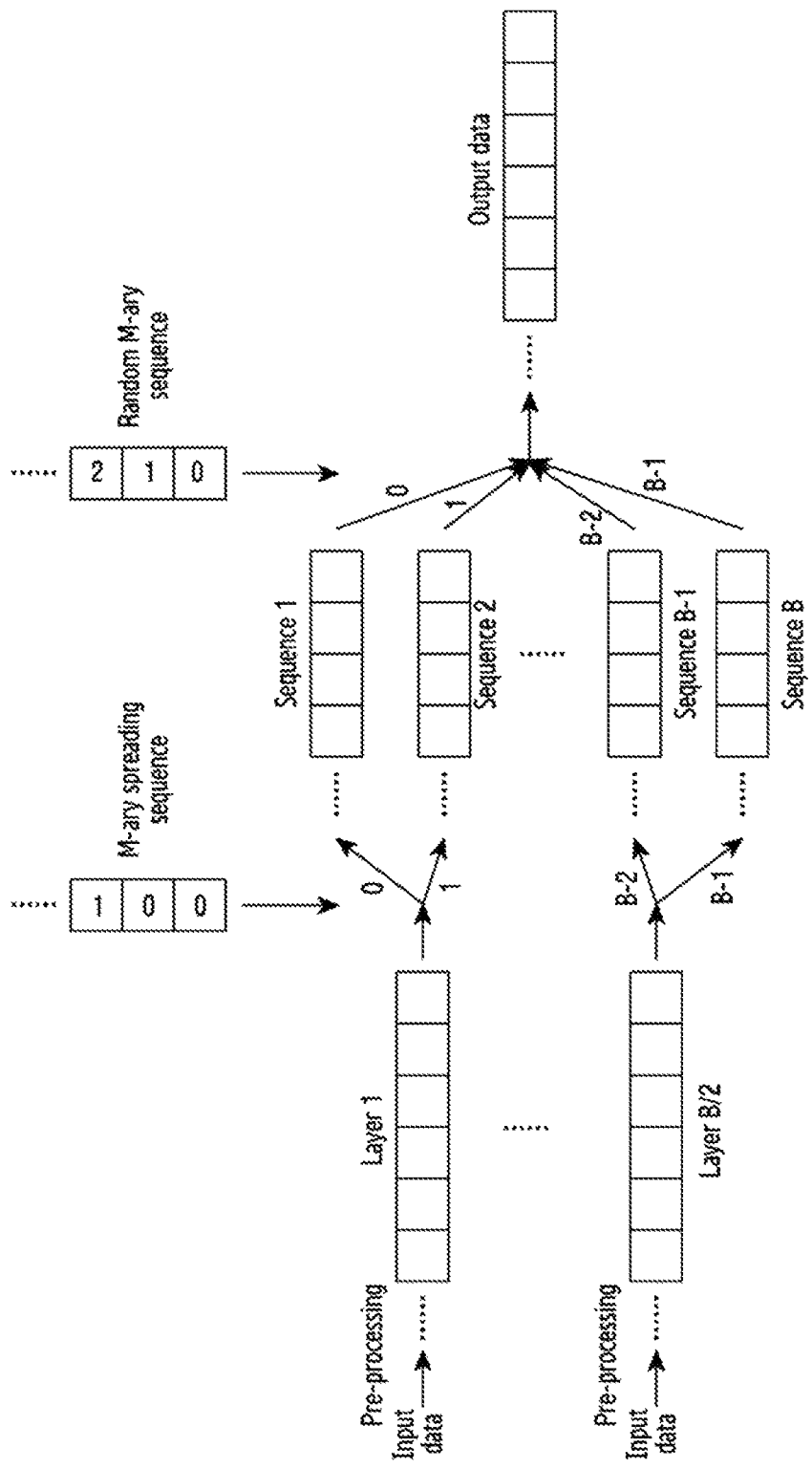
FIG. 20 illustrates a schematic diagram of an instance of a de-interleaving method based on M-ary pseudorandom sequences and numerical digit random sequences in an MIMO system, according to an embodiment of the present disclosure.

The operation on the receiver side is an inverse operation of the operation on the transmitter side, and the schematic diagram of a de-interleaving method by a receiver in the MIMO system is as shown in FIG. 20.

As shown in FIG. 20, upon receiving and demodulating to obtain data estimations of a plurality of data streams (layers), the receiver in the MIMO system divides each layer of data into a plurality of sequences according to the random M-ary sequence. Still taking the above example as an example, one possible division method is as follows: if the numerical value in the random M-ary sequence is 2n−2 or 2n−1, the first data which has not been selected in the data stream n is mapped to sequence 2n−1 or 2n, where 0≤n≤B/2. After dividing into a plurality of sequences, numerical values in a plurality of sequences are combined according to the M-ary numerical digit random sequence, so as to obtain an information sequence as output data.

If simple interleaving including block interleaving is performed on the transmitter side, it is also required to perform a corresponding inverse operation on the receiver side.

Further, in some embodiments, the positions of the M-ary pseudorandom sequences and the M-ary numerical digit random sequences can be exchanged, without any impact on the implementation of the embodiment. For example, in the example shown in FIG. 16, when an interleaving sequence is generated, the generation rules are as follows: random B-ary sequences are traversed; if there is a number 0, this number 0 is mapped to the position of the first 0 which has not been mapped in the B-ary numerical digit random sequences; if there is a number n, 0<n<B, this number n is mapped to the position of the first n which has not been mapped in the B-ary numerical digit random sequences.

Figure 21:
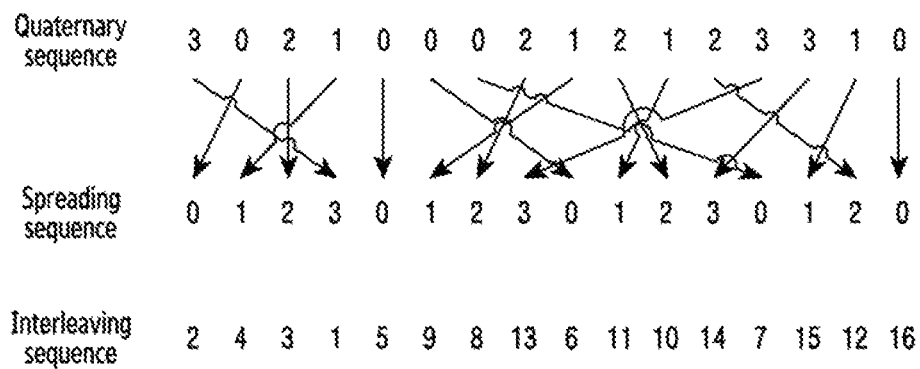
FIG. 21 illustrates a schematic diagram of an instance of exchanging positions of pseudorandom quaternary sequences and quaternary numerical digit random sequences and then generating an interleaving sequence, according to an embodiment of the present disclosure.

FIG. 21 is a schematic diagram of generating an interleaving sequence after exchanging random M-ary sequences and M-ary numerical digit random sequences. In FIG. 21, the obtained interleaving sequence is [2 4 3 1 5 9 8 13 6 11 10 14 7 15 12 16], which is exactly a de-interleaved sequence of the interleaving sequence in the example shown in FIG. 16.

In some embodiments of the present disclosure, the pseudorandom sequences are extended from binary sequences to M-ary sequences. According to the pre-defined length of the sequence, different M-ary pseudorandom sequences can be generated by different generator polynomials and/or different initial states of a shift register; different M-ary pseudorandom sequences are obtained by performing cyclic shifts on a same M-ary pseudorandom sequence; different M-ary numerical digit random sequences can be generated for a same M-ary pseudorandom sequence; and a plurality of interleaving sequences having a same pre-defined length can be constructed according to the M-ary pseudorandom sequences and corresponding M-ary numerical digit random sequences. During the construction process, a small amount of computations is required, the time delay is less, and the efficiency is high.

Moreover, in some embodiments of the present disclosure, different combinations of M-ary pseudorandom sequences and corresponding numerical digit random sequences are used as identifiers of different users for multiple access, so that the requirements of terminal equipments of a plurality of users for multiple access are met. Further, when the base station configures or informs a user of multiple access signatures, the generator polynomials for M-ary pseudorandom sequences and the cyclic shifts/initial states can be transmitted to the terminal equipment of the user for storage, so that the signaling overhead for data transmission is reduced greatly, the data to be stored by the terminal equipment is also less, and a convenient standardization prospect is realized.

In one embodiment of the present disclosure, the applications of the method for constructing an interleaving sequence and of the interleaving method and the de-interleaving method in the information sequence processing method, as described in some embodiments, in actual systems will be described in combination with specific system configurations. Considering that the number of physical resources allocated to users may be greatly different in actual systems. For example, in the LTE-A, physical resources consist of Physical Resource Blocks (PRBs) composed of time-frequency resources, and the possible number of physical resource blocks allocated to users is from 1 to 110. For non-orthogonal multiple access signatures based on interleaving, the length of the interleaving sequence is determined by the length of the allocated physical resource blocks (e.g., symbol-level interleaving) and/or the length of the coded bit sequences (e.g., bit-level interleaving). Therefore, more interleaving sequences of different lengths will be required in actual systems. Accordingly, significant challenges are brought to the user's storage and the configuration and informing of multiple access signatures of base stations.

Specifically, for the method for constructing an interleaving sequence, the interleaving operation and the de-interleaving operation provided by the present disclosure, pseudorandom sequences can be generated all the time after the generator polynomial and the initial state are fixed. However, since the sequences are periodic, the randomness of the interleaving sequence (i.e., the position of the data in the interleaved information sequence) will be limited within the cycle of the pseudorandom sequences after the interleaving sequence is generated by using the periodic pseudorandom sequences and the numerical digit random sequences. Accordingly, the randomness of the interleaving operation will be influenced, and the performance of the system will be reduced slightly.

Therefore, in some embodiments of the present disclosure, improvements are made to the method for constructing an interleaving sequence, and/or the interleaving operation and the de-interleaving operation in the information sequence processing method.

A possible improvement method comprises the following steps of: when, as the interleaving sequence to be constructed, there are specifically a plurality of interleaving sequences to be constructed, determining the largest pre-defined length of a plurality of interleaving sequences to be constructed; constructing a plurality of pseudorandom sequences according to the largest pre-defined length; and, for each of other pre-defined lengths other than the largest pre-defined length, cutting out sequences having the each of other pre-defined lengths from the pseudorandom sequences constructed according to the largest pre-defined length, to serve as a pseudorandom sequence corresponding to the each of other pre-defined lengths.

Specifically, a method for generating pseudorandom sequences is defined only for the longest interleaving sequence (that is, the generator polynomial or the maximum degree of the generator polynomial is specified), and shorter interleaving sequences are generated from a sequence within a cycle of the longest pseudorandom sequence. In this method, the method for generating different interleaving sequences for different users provided in the foregoing embodiments still works.

Considering that the greatest length of the coded sequence is less than $2^{15}$ in the LTE-A, the generator polynomial having the maximum degree of 15 can be defined to be used for generating the longest pseudorandom sequence (an M-sequence or a Gold sequence). For an interleaving sequence having a length less than $2^{15}-1$, the starting positions from which pseudorandom sequences are cut out and the length of the cut out pseudorandom sequences are specified, so that the pseudorandom sequences for generating an interleaving sequence having a particular length are obtained. For the numerical digit random sequences, it is required to count the number of 0 and the number of 1 in the pseudorandom sequences, so that numerical digit random sequences having a corresponding number of +1 and −1 are generated.

The starting positions from which pseudorandom sequences of different lengths are cut out can be broadcast to users by system information in a broadcast channel or a downlink control channel, or informed to users together with multiple access signatures during configuring the multiple access signatures for the users. Wherein, the former method is more suitable for the scheduling-free data transmission method. In this case, a user directly acquires resource configurations of different lengths from the system information, and then randomly selects multiple access signatures for data transmission. However, the latter method is more suitable for the data transmission method based on scheduling, where a user directly acquires the allocation of multiple access signatures from a base station and then transmits and sends data.

Another possible improvement method comprises the following steps of: when, as the interleaving sequence to be constructed, there are specifically a plurality of interleaving sequences to be constructed, determining the smallest pre-defined length of a plurality of interleaving sequences to be constructed; constructing a plurality of pseudorandom sequences according to the smallest pre-defined length; for each of other pre-defined lengths other than the smallest pre-defined length, Cascading interleaving sequences generated from the pseudorandom sequences constructed according to the smallest pre-defined length, to form a sequence having the each of other pre-defined lengths; and, simply interleaving the cascaded sequence having the each of other pre-defined lengths to serve as an interleaving sequence corresponding to the each of other pre-defined lengths, wherein the simple interleaving includes at least one of the following: block interleaving and convolution interleaving.

Specifically, the generator polynomial (or the degree of the generator polynomial) is defined only for the shortest interleaving sequence, and longer interleaving sequences are obtained by Cascading shorter interleaving sequences. To enhance the randomness, simple interleaving including block interleaving can be performed after the Cascading.

The minimum resource scheduling unit in the LTE-A is 1 PRB. An interleaving sequence having the smallest length can be defined for this resource block size. Considering that the greater resource scheduling unit is generally a multiple of 1 PRB, an interleaving sequence having a greater length can be generated by repetitive Cascading after the interleaving sequence having the smallest length is generated. For example, if the interleaving sequence having the smallest length is A and its length is $l_A$, the interleaving sequence having a length of $Nl_A$ is:

$$[A\ A+N\ A+2N,\ \ldots,\ A+N(l_A-1)]$$

In the Formula, $A+N$ represents that each numerical value in sequence A is increased by N. To enhance the randomness of the interleaving sequence, it is possible to perform simple interleaving (e.g., block interleaving or more) on the sequence to obtain a final interleaving sequence.

In this method, the simple interleaving operation can be fixed at the receiver and the transmitter, and does not need to be configured and informed. During configuring and informing resources, it is only required to configure and inform multiple access signatures used by different users. For a communication method based on scheduling-free, a user can select multiple access signatures from a resource pool to generate an interleaving sequence having the smallest length, then generate an interleaving sequence having a greater length by Cascading, simple interleaving or other methods, and finally transmit data.

A third possible improvement method is a combination of the two methods. It can be seen from the foregoing description that, in the first method, it is required to define longer pseudorandom sequences, and the user's storage and the configuration of multiple access signatures are highly required; meanwhile, in the second method, although shorter pseudorandom sequences are used and the requirements for the storage and configuration are reduced, there are less available interleaving sequences generated from shorter sequences. To achieve the compromise of the storage requirement and the number of available interleavers, the two methods can be combined.

Specifically, a length threshold is specified as $l_{th}$, and the minimum power N of 2 greater than this threshold is used as the maximum degree of the generator polynomials. For a sequence having a length less than or equal to the length threshold, by the first method, pseudorandom sequences are generated by generator polynomials of degree N, and then cut out according to the sequence length; or, according to the length of the sequence to be interleaved, a proper generator polynomial is selected to generate pseudorandom sequences and further to generate the interleaving sequence.

For a sequence having a length greater than the threshold, shorter interleaving sequences are selected, and the sequence is generated by the repetitive Cascading as described in the second method. When a base station configures resources, it is required to inform pseudorandom sequence generation information for generating respective shorter interleaving sequences.

In some embodiments of the present disclosure, for a plurality of interleaving sequences to be constructed, the longest or shortest pseudorandom sequence is configured for the interleaving sequence having the greatest length or smallest length; and other sequences are cut out from the longest pseudorandom sequence, or obtained by Cascading and/or cutting out the shortest sequence. Accordingly, the amount of computations for constructing the interleaving sequences and/or a combination of pseudorandom sequences and numerical digit random sequences is further reduced, the time delay is less, the efficiency is improved, and it is more convenient for standardization.

Figure 22A:
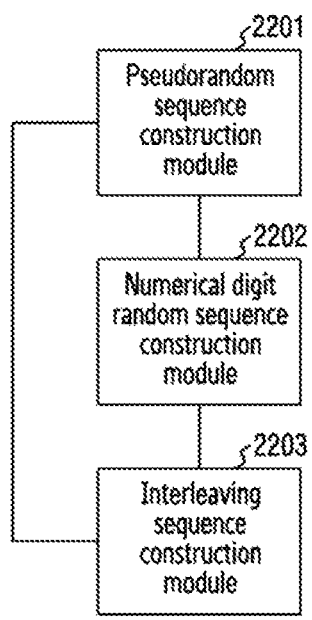
FIG. 22A illustrates a schematic block diagram of an internal structure of a device for constructing an interleaving sequence, according to an embodiment of the present disclosure.

Based on the method for constructing an interleaving sequence provided in some embodiments, one embodiment of the present disclosure describes a device for constructing an interleaving sequence, which is applicable to these embodiments. The schematic block diagram of the internal structure of the device is as shown in FIG. 22A, comprising: a pseudorandom sequence construction module 2201, a numerical digit random sequence construction module 2202 and an interleaving sequence construction module 2203.

Wherein, the pseudorandom sequence construction module 2201 is configured to construct a plurality of pseudorandom sequences according to a pre-defined length of an interleaving sequence to be constructed.

The numerical digit random sequence construction module 2202 is configured to, for each of the constructed pseudorandom sequences, construct at least one corresponding numerical digit random sequence according to the number of numerical values of more than two types in this pseudorandom sequence, where the type of numerical values in the numerical digit random sequence is corresponding to that of numerical values in the pseudorandom sequence, and the number of numerical values of a corresponding type is equal.

The interleaving sequence construction module 2203 is configured to, for each of the pseudorandom sequences constructed by the pseudorandom sequence construction module 2201 and the numerical digit random sequence corresponding to this pseudorandom sequence constructed by the numerical digit random sequence construction module 2202, construct a corresponding interleaving sequence according to a mapping relation between this pseudorandom sequence and the numerical digit random sequence, so that a plurality of interleaving sequences are allocated and indicated as multiple access signatures.

Figure 22B:
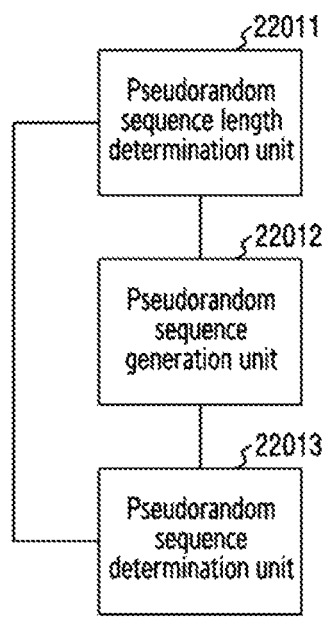
FIG. 22B illustrates a schematic block diagram of an internal structure of a pseudorandom sequence construction module in the device for constructing an interleaving sequence, according to an embodiment of the present disclosure.

More preferably, the schematic block diagram of the internal structure of the pseudorandom sequence construction module 2201 is as shown in FIG. 22B, comprising: a pseudorandom sequence length determination unit 22011, a pseudorandom sequence generation unit 22012 and a pseudorandom sequence determination unit 22013.

Wherein, the pseudorandom sequence length determination unit 22011 is configured to determine the length of pseudorandom sequences to be generated according to the pre-defined length of the interleaving sequence to be constructed.

The pseudorandom sequence generation unit 22012 is configured to generate a plurality of pseudorandom sequences according to the length of the pseudorandom sequences to be generated determined by the pseudorandom sequence length determination unit 22011.

The pseudorandom sequence determination unit 22013 is configured to use the pseudorandom sequences generated by the pseudorandom sequence generation unit 22012 as the constructed pseudorandom sequences; or clip sequences having the pre-defined length from the pseudorandom sequences generated by the pseudorandom sequence generation unit 22012 to serve as the constructed pseudorandom sequences.

Preferably, the pseudorandom sequence length determination unit 22011 is specifically configured to: use a length of a power of 2 that is equal to the pre-defined length as the length of the pseudorandom sequences to be generated when the pre-defined length is a length of a power of 2; or, use a length of a power of 2 that is not less than the pre-defined length as the length of the pseudorandom sequences to be generated when the pre-defined length is not a power of 2; or, use a length of a power of an M-ary number corresponding to the pre-defined length as the length of the pseudorandom sequences to be generated.

Preferably, the pseudorandom sequence generation unit 22012 is specifically configured to: determine a plurality of generator polynomials and a plurality of initial states of a shift register according to the length of the pseudorandom sequences to be generated; and, generate a plurality of pseudorandom pre-defined M-ary sequences according to one of the following combinations of the generator polynomials and the initial states: a plurality of generator polynomials and a same initial state; a same generator polynomial and a plurality of initial states; a plurality of generator polynomials and a plurality of initial states; and a same generator polynomial and a same initial state.

Further, the pseudorandom sequence generation unit 22012 is specifically configured to: when the pseudorandom pre-defined M-ary sequences are specifically binary pseudorandom sequences and the binary pseudorandom sequences are specifically M-sequences or Gold sequences, generate a plurality of pseudorandom pre-defined M-ary sequences according to a same generator polynomial and a same initial state, comprising executing at least one of the following: performing multiple cyclic shifts on numerical values in the M-sequences to generate a plurality of M-sequences; performing multiple cyclic shifts on numerical values in the Gold sequences to generate a plurality of Gold sequences; and performing multiple cyclic shifts on numerical values in at least one component M-sequence generating the Gold sequences to generate a plurality of Gold sequences.

Further, the pseudorandom sequence generation unit 22012 is specifically configured to: when the pseudorandom pre-defined M-ary sequences are specifically M-ary pseudorandom sequences and the M-ary pseudorandom sequences are specifically original M-ary pseudorandom sequences or synthesized M-ary pseudorandom sequences, generate a plurality of pseudorandom pre-defined M-ary sequences according to a same generator polynomial and a same initial state, including executing at least one of the following: performing multiple cyclic shifts on numerical values in the original M-ary pseudorandom sequences to obtain a plurality of original M-ary pseudorandom sequences; cutting out sequences having the pre-defined length from a plurality of starting positions of the original M-ary pseudorandom sequences to obtain a plurality of original M-ary pseudorandom sequences, performing multiple cyclic shifts on numerical values in the synthesized M-ary pseudorandom sequences to obtain a plurality of synthesized M-ary pseudorandom sequences; performing multiple cyclic shifts on numerical values in at least one original M-ary pseudorandom sequence generating the synthesized M-ary pseudorandom sequences to generate a plurality of synthesized M-ary pseudorandom sequences; and cutting out sequences having the pre-defined length from a plurality of starting positions of the synthesized M-ary pseudorandom sequences to obtain a plurality of synthesized M-ary pseudorandom sequences. Wherein, the synthesized M-ary pseudorandom sequences are generated by performing bitwise summation and then bitwise modulo-M operation on more than two original M-ary pseudorandom sequences having the same length.

Preferably, the pseudorandom sequence length unit 22011 is further configured to use a length of a power of 2 that is less than the pre-defined length as the length of the pseudorandom sequences to be generated when the pre-defined length is not a length of a power of 2.

And, the pseudorandom sequence generation unit 22012 is further configured to determine a plurality of generator polynomials and a plurality of initial states of a shift register according to the length of a power of 2 that is less than the pre-defined length; and generate binary pseudorandom sequences having a total length equal to the pre-defined length and having more than two cycles according to a specified combination of the generator polynomials and the initial states, wherein the last one cycle of the more than two cycles is a complete cycle or an incomplete cycle.

Further, the pseudorandom sequence generation unit 22012 is further configured to generate binary pseudorandom sequences having a total length greater than the pre-defined length and having more than two cycles.

And, the pseudorandom sequence determination unit 22013 is further configured to clip sequences having the pre-defined length from a plurality of starting positions of the binary pseudorandom sequences having a total length greater than the pre-defined length, to serve as a plurality of generated pseudorandom sequences.

Preferably, the numerical digit random sequence construction module 2202 is specifically configured to: for each of the constructed pseudorandom sequences, pad numerical values of this pseudorandom sequence according to the difference in the number of numerical values of each type in this pseudorandom sequence when the pre-defined length is a length of a power of 2, and, generate at least one numerical digit random sequence having numerical values of a type corresponding to the type of numerical values in the pseudorandom sequence padded with numerical values and having an equal number of numerical values of a corresponding type.

Further, the numerical digit random sequence construction module 2202 is specifically configured to: for each of the constructed pseudorandom sequences, pad numerical values of this pseudorandom sequence according to the difference in the number of numerical values of each type in this pseudorandom sequence, including executing one of the following: when the constructed pseudorandom sequence is specifically an M-sequence, the pre-defined length is a length of a power of 2 and the number of 0 is less than that of 1 in this M-sequence, padding 0 to this M-sequence; and, when the constructed pseudorandom sequence is specifically a Gold sequence, the pre-defined length is a length of a power of 2 and the number of 0 is not equal to that of 1 in this Gold sequence, padding a numerical value having the minimum number to this Gold sequence.

Preferably, the numerical digit random sequence construction module 2202 is further configured to: for each of the constructed pseudorandom sequences, generate at least one numerical digit random sequence having numerical values of a type corresponding to the type of numerical values in the pseudorandom sequence padded with numerical values and having an equal number of numerical values of a corresponding type, when the constructed pseudorandom sequence is specifically a pseudorandom binary sequence and the pre-defined length is not a length of a power of 2; and, pad a numerical value having the maximum number to each generated numerical digit random sequence.

Preferably, the numerical digit random sequence construction module 2202 is further configured to: for one pseudorandom sequence, determine the type of numerical values and the number of numerical values of each type in this pseudorandom sequence; and use another pseudorandom sequence having a corresponding numerical value type and an equal number of numerical values of a corresponding type as a numerical digit random sequence of this pseudorandom sequence.

Preferably, the interleaving sequence construction module 2203 is specifically configured to: for one of the numerical digit random sequence and the pseudorandom sequence, for each numerical value type in the one sequence, map numerical values of this numerical value type to numerical values of a type corresponding to this numerical value type in the other sequence; and, for each numerical value in the other sequence, replace this numerical value with the position number of a numerical value in the one sequence to which this numerical value is mapped, to obtain the interleaving sequence.

Preferably, the pseudorandom sequence length determination unit 22011 is further configured to divide the pre-defined length into a plurality of lengths of a power of 2, to serve as lengths of a plurality of pseudorandom sequences to be generated, respectively.

And, the pseudorandom sequence generation unit 22012 is further configured to: for each of the divided lengths of a power of 2, generate a pseudorandom binary sequence according to the length of a power of 2 to serve as a pseudorandom binary sequence having the length of a power of 2.

And, the pseudorandom sequence construction module 2201 is further configured to: for each of the binary pseudorandom sequences having the length of a power of 2, construct a numerical digit random sequence having the length of a power of 2 according to the number of numerical values of more than two types in this pseudorandom binary sequence.

And, the interleaving sequence construction module 2203 is further configured to: according to a mapping relation between each numerical digit random sequence having the length of a power of 2 and the pseudorandom binary sequence, construct an interleaving sequence having the length of a power of 2; and cascade the interleaving sequences having the length of a power of 2 to form a sequence having the pre-defined length, to serve as the constructed interleaving sequence.

Preferably, the pseudorandom sequence determination unit 22013 is specifically configured to use the generated pseudorandom sequences as the constructed pseudorandom sequences when the length of the generated pseudorandom sequences is greater than the pre-defined length.

And, the interleaving sequence construction module 2203 is further configured to: for each of the constructed pseudorandom sequences and the corresponding numerical digit random sequence thereof, construct an interleaving sequence having a same length as this pseudorandom sequence according to the mapping relation between this pseudorandom sequence and the numerical digit random sequence; and correct the interleaving sequence having the same length as this pseudorandom sequence to obtain an interleaving sequence having the pre-defined length.

Further, the interleaving sequence construction module 2203 is specifically configured to: for the interleaving sequence having the same length as this pseudorandom sequence, replace a former numerical value greater than a pre-defined threshold in this interleaving sequence with a later numerical value not greater than the threshold until all the numerical values within the pre-defined length, starting from the first numerical value, are not greater than the threshold; and clip, starting from the first numerical value, a sequence having the pre-defined length to serve as the constructed interleaving sequence; or, use a value having the pre-defined length as a threshold, and remove numerical values greater than the threshold from the interleaving sequence having a same length as this pseudorandom sequence.

Preferably, the pseudorandom sequence length determination unit 22011 is further configured to: determine the largest pre-defined length of a plurality of interleaving sequences to be constructed, when, as the interleaving sequence to be constructed, there are specifically a plurality of interleaving sequences to be constructed.

And, the pseudorandom sequence generation unit 22012 is further configured to construct a plurality of pseudorandom sequences according to the largest pre-defined length.

And, the pseudorandom sequence determination unit 22013 is configured to: for each of other pre-defined lengths other than the largest pre-defined length, clip sequences having the each of other pre-defined lengths from the pseudorandom sequences constructed according to the largest pre-defined length, to serve as a pseudorandom sequence corresponding to the each of other pre-defined lengths.

Preferably, the pseudorandom sequence length determination unit 22011 is further configured to: determine the smallest pre-defined length of a plurality of interleaving sequences to be constructed, when, as the interleaving sequence to be constructed, there are specifically a plurality of interleaving sequences to be constructed.

And, the pseudorandom sequence generation unit 22012 is further configured to construct a plurality of pseudorandom sequences according to the smallest pre-defined length.

And, the numerical digit random sequence construction module 2202 and the interleaving sequence construction module 2203 is cooperatively configured to: for each of other pre-defined lengths other than the smallest pre-defined length, cascaded interleaving sequences generated from the pseudorandom sequences constructed according to the smallest pre-defined length, to form a sequence having the each of other pre-defined lengths, and, simply interleave the cascaded sequence having the each of other pre-defined lengths to serve as an interleaving sequence corresponding to the each of other pre-defined lengths, wherein the simple interleaving includes at least one of the following: block interleaving and convolution interleaving.

The implementations of the functions of the pseudorandom sequence construction module 2201, the numerical digit random sequence construction module 2202, the interleaving sequence construction module 2203, and the pseudorandom sequence length determination unit 22011, the pseudorandom sequence generation unit 22012 and the pseudorandom sequence determination unit 22013 in the pseudorandom sequence construction module 2201 can refer to the specific contents of the steps of the methods in some embodiments, and will not be repeated here.

Figure 23A:
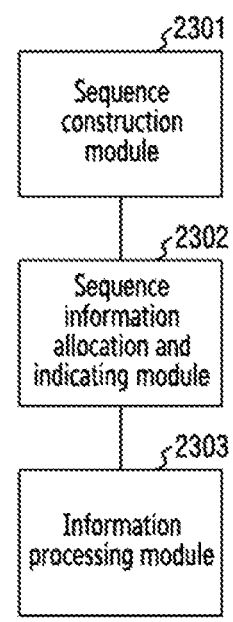
FIG. 23A illustrates a schematic block diagram of an internal structure of a transmitter, according to an embodiment of the present disclosure.

Based on the method for generating an interleaving sequence and the information sequence processing method provided in some embodiments, another embodiment of the present disclosure describes a transmitter applicable to these embodiments. The schematic block diagram of the internal structure of the transmitter is as shown in FIG. 23A, comprising a sequence construction module 2301, a sequence information allocation and indicating module 2302 and an information processing module 2303.

Wherein, the sequence construction module 2301 is configured to construct a plurality of the following sequences according to a pre-defined length of an interleaving sequence to be constructed: an interleaving sequence, or a combination of pseudorandom sequences and numerical digit random sequences, where the type of numerical values in the numerical digit random sequences is corresponding to that of numerical values in the pseudorandom sequences and the number of numerical values of a corresponding type is equal.

The sequence information allocation and indicating module 2302 is configured to allocate and then indicate sequence information of the sequences constructed by the sequence construction module 2301.

The information processing module 2303 is configured to process an information sequence to be transmitted or a received information sequence according to the interleaving sequence or a combination of interleaving sequences or pseudorandom sequences and numerical digit random sequences allocated by the sequence information allocation and indicating module 2302.

Preferably, the sequence construction module 2301 is specifically configured to: construct a plurality of pseudorandom sequences according to the pre-defined length of the interleaving sequence to be constructed; for each of the constructed pseudorandom sequences, construct at least one corresponding numerical digit random sequence according to the number of numerical values of more than two types in this pseudorandom sequence; and, for each of the constructed pseudorandom sequences and the corresponding numerical digit random sequence thereof, construct a corresponding interleaving sequence according to a mapping relation between this pseudorandom sequence and the numerical digit random sequence.

Further, the sequence construction module 2301 is specifically configured to: determine the length of pseudorandom sequences to be generated according to the pre-defined length; generate a plurality of pseudorandom sequences according to the length of the pseudorandom sequences to be generated; and, use the generated pseudorandom sequences as the constructed pseudorandom sequences, or clip sequences having the pre-defined length from the generated pseudorandom sequences to serve as the constructed pseudorandom sequences.

Preferably, the sequence construction module 2301 is specifically configured to: determine a plurality of generator polynomials and a plurality of initial states of a shift register according to the length of the pseudorandom sequences to be generated; and, generate a plurality of pseudorandom pre-defined M-ary sequences according to one of the following combinations of the generator polynomials and the initial states: a plurality of generator polynomials and a same initial state; a same generator polynomial and a plurality of initial states, a plurality of generator polynomials and a plurality of initial states; and a same generator polynomial and a same initial state.

Further, the sequence construction module 2301 is further configured to: when the pseudorandom pre-defined M-ary sequences are specifically binary pseudorandom sequences and the binary pseudorandom sequences are specifically M-sequences or Gold sequences, generate a plurality of pseudorandom pre-defined M-ary sequences according to a same generator polynomial and a same initial state, including executing at least one of the following: performing multiple cyclic shifts on numerical values in the M-sequences to generate a plurality of M-sequences; performing multiple cyclic shifts on numerical values in the Gold sequences to generate a plurality of Gold sequences; and performing multiple cyclic shifts on numerical values in at least one component M-sequence generating the Gold sequences to generate a plurality of Gold sequences.

Further, the sequence construction module 2301 is specifically configured to: for one of the numerical digit random sequence and the pseudorandom sequence, for each numerical value type in the one sequence, map numerical values of this numerical value type to numerical values of a type corresponding to this numerical value type in the other sequence; and, for each numerical value in the other sequence, replace this numerical value with the position number of a numerical value in the one sequence to which this numerical value is mapped, to obtain the interleaving sequence.

Further, the sequence construction module 2301 is further configured to: use the generated pseudorandom sequences as the constructed pseudorandom sequences when the length of the generated pseudorandom sequences is greater than the pre-defined length; for each of the constructed pseudorandom sequences and the corresponding numerical digit random sequence thereof, construct an interleaving sequence having a same length as this pseudorandom sequence according to the mapping relation between this pseudorandom sequence and the numerical digit random sequence; and, correct the interleaving sequence having the same length as this pseudorandom sequence to obtain an interleaving sequence having the pre-defined length.

Preferably, the sequence information allocation and indicating module 2302 is specifically configured to indicate the sequence information by, but not limited to, any one of the following: a physical broadcast channel, a physical downlink control channel and a high-layer signaling.

And, the sequence information includes: a pre-defined length of an interleaving sequence, a pre-defined M-ary sequences mechanism of a pseudorandom sequence, generator polynomials, and initial states of a shift register; and the sequence information further comprises at least one of the following: the number of cyclic shifts performed on the pseudorandom sequences and/or the interleaving sequences; an arrangement order of numerical values in the numerical digit random sequences; and starting positions from which the pseudorandom sequences are cut out from the original sequences.

Figure 23B:
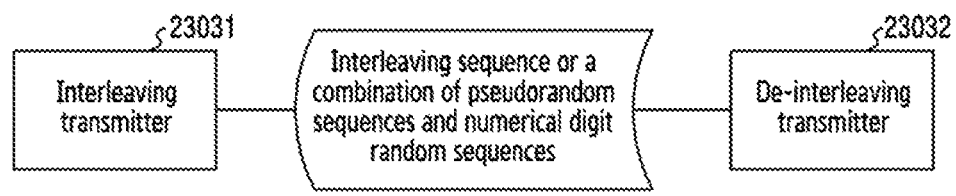
FIG. 23B illustrates a schematic block diagram of an internal structure of an information processing module in the transmitter, according to an embodiment of the present disclosure.

More preferably, the schematic block diagram of the internal structure of the information processing module 2303 in the transmitter in the embodiments of the present disclosure is as shown in FIG. 23B, including an interleaving transmitter 23031 and a de-interleaving transmitter 23032.

Wherein, the interleaving transmitter 23031 is configured to interleave and then transmit the information sequence to be transmitted according to the allocated interleaving sequence or a combination of pseudorandom sequences and numerical digit random sequences.

The de-interleaving transmitter 23032 de-interleaves the received interleaved information sequence according to the allocated interleaving sequence or a combination of pseudorandom sequences and numerical digit random sequences.

Preferably, the interleaving transmitter 23031 is specifically configured to: for one of the allocated pseudorandom sequence and the corresponding numerical digit random sequence thereof, divide the information sequence to be transmitted into information subsequences of a same number as the number of types of numerical values, according to the type and position of numerical values in the one sequence; determine a correspondence between each numerical value type in the other sequence and each information subsequence; and, successively acquire and output numerical values from an information subsequence corresponding to each numerical value type according to the type and position order of numerical values in the other sequence, to obtain an interleaved information sequence.

Further, the interleaving transmitter 23031 is specifically configured to: for each numerical value type in the one sequence, map the positions of numerical values of this numerical value type in the one sequence to corresponding positions in the information sequence; and, acquire numerical values at the corresponding positions one by one according to the order of the corresponding positions in the information sequence, to form an information subsequence corresponding to this numerical value type.

Further, the interleaving transmitter 23031 is specifically configured to: determine, starting from the first bit to the last bit in the other sequence, the type of a numerical value at a position; and, determine an information subsequence corresponding to this numerical value type, and acquire and output a first numerical value which has not been acquired from the information subsequence.

Preferably, the interleaving transmitter 23031 is further configured to: for one of the allocated pseudorandom sequence and the corresponding numerical digit random sequence thereof, construct each divided sequence according to the position of each numerical value in the one sequence, each numerical value type of the one sequence being corresponding to one divided sequence, and the number of numerical values of this type being equal to the number of numerical values in the corresponding divided sequence; construct each combined sequence according to the position of each numerical value in the other sequence, each numerical value type of the other sequence being corresponding to one combined sequence, and the number of numerical values of this type being equal to the number of numerical values in the corresponding combined sequence; divide the information sequence to be transmitted into information subsequences of a same number as the number of the divided sequences, according to the numerical values in each divided sequence; determine an output order of numerical values in each of the information subsequences according to the numerical values in each combined sequence; and, output numerical values of each of the information subsequences according to the determined output order, to obtain an interleaved information sequence.

Further, the interleaving transmitter 23031 is specifically configured to: for each numerical value in the one sequence, use the position number of this numerical value in the one sequence as a numerical value in the corresponding divided sequence; and, for each numerical value in the other sequence, use the position number of this numerical value in the other sequence as a numerical value of the corresponding combined sequence.

Further, the interleaving transmitter 23031 is further configured to simply interleave at least one of the following sequences: the information subsequences before interleaving, the information subsequences, and the interleaved information subsequences, wherein the simple interleaving comprises at least one of the following operations: block interleaving and convolution interleaving.

Preferably, the de-interleaving transmitter 23032 is specifically configured to: for one of the allocated pseudorandom sequence and the corresponding numerical digit random sequence thereof, divide the interleaved information sequence into interleaved information subsequences of a same number as the number of types of numerical values, according to the type and position of numerical values in the one sequence; determine a correspondence between each numerical value type in the other sequence and each interleaved information subsequence; and, successively acquire and output numerical values from an interleaved information subsequence corresponding to each numerical value type according to the type and position order of numerical values in the other sequence, to obtain a de-interleaved information sequence.

The implementations of the functions of the sequence construction module 2301, the sequence information allocation and indicating module 2302, the information processing module 2303, and the interleaving transmitter 23031 and the de-interleaving transmitter 23032 in the information processing module 2303 can refer to the specific contents of the steps of the methods in some embodiments, and will not be repeated here.

Figure 24A:
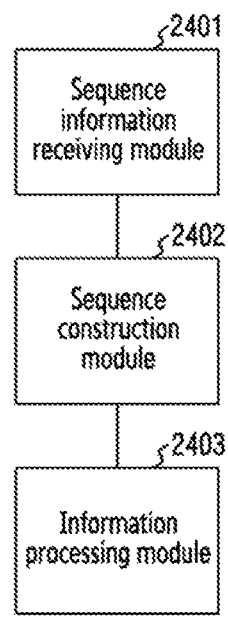
FIG. 24A illustrates a schematic block diagram of an internal structure of a receiver, according to an embodiment of the present disclosure.

Based on the method for generating an interleaving sequence and the information sequence construction method provided in some embodiments, this embodiment of the present disclosure describes a receiver applicable to these embodiments. The schematic block diagram of the internal structure of the receiver is as shown in FIG. 24A, comprising a sequence information receiving module 2401, a sequence construction module 2402 and an information processing module 2403.

Wherein, the sequence information receiving module 2401 is configured to receive sequence information indicated to the present apparatus.

The sequence construction module 2402 is configured to construct an interleaving sequence or a combination of pseudorandom sequences and numerical digit random sequences according to the sequence information received by the sequence information receiving module 2401, where the type of numerical values in the numerical digit random sequences is corresponding to the type of numerical values in the pseudorandom sequences, and the number of numerical values of a corresponding type is equal.

The information processing module 2403 is configured to process a received information sequence or an information sequence to be transmitted according to the interleaving sequence or a combination of pseudorandom sequences and numerical digit random sequences constructed by the sequence construction module 2402.

Specifically, the sequence information received by the sequence information receiving module 2401 includes: a pre-defined length of the interleaving sequences, a pre-defined M-ary sequences mechanism of the pseudorandom sequences, generator polynomials and the initial states of the shift register. The sequence information further comprises at least one of the following: the number of cyclic shifts performed on the pseudorandom sequences and/or the interleaving sequences; an arrangement order of numerical values in the numerical digit random sequences; and, starting positions from which the pseudorandom sequences are cut out from the original sequences.

Preferably, the sequence construction module 2402 is specifically configured to: construct a plurality of pseudorandom sequences according to the sequence information; construct corresponding numerical digit random sequences according to the number of numerical values of more than two types in the constructed pseudorandom sequences; and construct a corresponding interleaving sequence according to a mapping relation between the constructed pseudorandom sequences and the numerical digit random sequences.

Further, the sequence construction module 2402 is specifically configured to: generate pseudorandom pre-defined M-ary sequences according to the pre-defined M-ary sequences mechanism of the pseudorandom sequences, the generator polynomials and the initial states of the shift register in the sequence information; use the generated pseudorandom pre-defined M-ary sequences as the constructed pseudorandom sequences; or, determine sequences having the pre-defined length from the generated pseudorandom pre-defined M-ary sequences to serve as the constructed pseudorandom sequences.

Further, the sequence construction module 2402 is further configured to: perform cyclic shift on numerical values in the generated pseudorandom pre-defined M-ary sequences or perform cyclic shift on numerical values in the constructed pseudorandom sequences according to the number of cyclic shifts performed on the pseudorandom sequences; or, clip sequences having the pre-defined length from corresponding starting positions of the generated pseudorandom pre-defined M-ary sequences according to the starting positions from which the pseudorandom sequences are cut out from the original sequences in the sequence information; or, adjust the order of numerical values in the constructed pseudorandom sequences according to the arrangement order of numerical values in the numerical digit random sequences in the sequence information; or, perform cyclic shift on numerical values in the constructed interleaving sequence according to the number of cyclic shifts performed on the interleaving sequence.

Figure 24B:
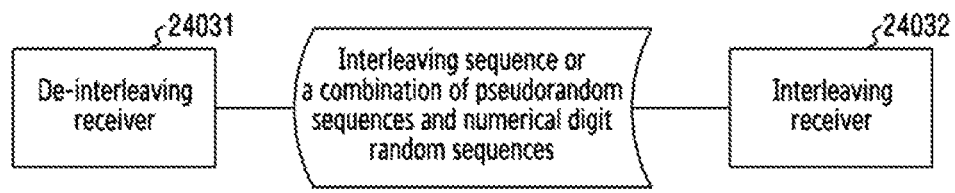
FIG. 24B illustrates a schematic block diagram of an internal structure of an information processing module in the receiver, according to an embodiment of the present disclosure.

More preferably, the schematic block diagram of an internal port of the information processing module 2403 of the receiver applicable to various embodiments provided in some embodiments of the present disclosure is as shown in FIG. 24B, including a de-interleaving receiver 24031 and an interleaving receiver 24032.

The de-interleaving receiver 24031 is configured to de-interleave the received interleaved information sequence according to the interleaving sequence or a combination of pseudorandom sequences and numerical digit random sequences constructed by the sequence construction module 2402.

The interleaving receiver 24032 is configured to interleave the information sequence to be transmitted according to the interleaving sequence or a combination of pseudorandom sequences and numerical digit random sequences constructed by the sequence construction module 2402.

Preferably, the de-interleaving receiver 24031 is specifically configured to: for one of the configured pseudorandom sequence and the corresponding numerical digit random sequence thereof, divide the interleaved information sequence into interleaved information subsequences of a same number as the number of types of numerical values, according to the type and position of numerical values in the one sequence; determine a correspondence between each numerical value type in the other sequence and each interleaved information subsequence; and, successively acquire and output numerical values from an interleaved information subsequence corresponding to each numerical value type according to the type and position order of numerical values in the other sequence, to obtain a de-interleaved information sequence.

Further, the de-interleaving receiver 24031 is specifically configured to: for each numerical value type in the one sequence, map the positions of numerical values of this numerical value type in the one sequence to corresponding positions in the interleaved information sequence; and, acquire numerical values at the corresponding positions one by one according to the order of the corresponding positions in the interleaved information sequence, to form an interleaved information subsequence corresponding to this numerical value type. Further, the de-interleaving receiver 24031 is specifically configured to: determine, starting from the first bit to the last bit in the other sequence, the type of a numerical value at a position; and, determine an interleaved information subsequence corresponding to this numerical value type, and acquire and output a first numerical value which has not been acquired from the interleaved information subsequence.

Preferably, the de-interleaving receiver 24031 is further configured to: for one of the constructed pseudorandom sequence and the corresponding numerical digit random sequence thereof, construct each divided sequence according to the position of each numerical value in the one sequence, each numerical value type of the one sequence being corresponding to one divided sequence, and the number of numerical values of this type being equal to the number of numerical values in the corresponding divided sequence; construct each combined sequence according to the position of each numerical value in the other sequence, each numerical value type of the other sequence being corresponding to one combined sequence, and the number of numerical values of this type being equal to the number of numerical values in the corresponding merged sequence; divide the interleaved information sequence into interleaved information subsequences of a same number as the number of the divided sequences, according to the numerical values in each divided sequence; determine an output order of numerical values in each of the interleaved information subsequences according to the numerical values in each merged sequence; and, output numerical values of each of the interleaved information subsequences according to the determined output order, to obtain a de-interleaved information sequence.

Further, the de-interleaving receiver 24031 is specifically configured to: for each numerical value in the one sequence, use the position number of this numerical value in the one sequence as a numerical value in the corresponding divided sequence; and, for each numerical value in the other sequence, use the position number of this numerical value in the other sequence as a numerical value of the corresponding combined sequence.

Preferably, the de-interleaving receiver 24031 is further configured to perform simple interleaving on at least one of the following sequences: the received interleaved information sequence, interleaved information subsequences, and the de-interleaved information sequence, wherein the simple interleaving includes at least one of the following operations: block de-interleaving and convolution de-interleaving.

Preferably, the interleaving receiver 24032 is specifically configured to: for one of the configured pseudorandom sequence and the corresponding numerical digit random sequence thereof, divide the information sequence to be transmitted into information subsequences of a same number as the number of types of numerical values, according to the type and position of numerical values in the one sequence; determine a correspondence between each numerical value type in the other sequence and each information subsequence; and, successively acquire and output numerical values from an information subsequence corresponding to each numerical value type according to the type and position order of numerical values in the other sequence, to obtain an interleaved information sequence.

The implementations of the functions of the sequence information receiving module 2401, the sequence construction module 2402, the information processing module 2403, and the de-interleaving receiver 24031 and the interleaving receiver 23031 in the information processing module 2403 can refer to the specific contents of the steps of the methods in some embodiments, and will not be repeated here.

It should be understood by a person of ordinary skill in the art that the present disclosure involves devices for carrying out one or more of operations as described in the present disclosure. Those devices can be specially designed and manufactured as intended, or can include well known devices in a general-purpose computer. Those devices have computer programs stored therein, which are selectively activated or reconstructed. Such computer programs can be stored in device (such as computer) readable media or in any type of media suitable for storing electronic instructions and respectively coupled to a bus, the computer readable media include but are not limited to any type of disks (including floppy disks, hard disks, optical disks, CD-ROM and magneto optical disks), ROM (Read-Only Memory), RAM (Random Access Memory), EPROM (Erasable Programmable Read-Only Memory), EEPROM (Electrically Erasable Programmable Read-Only Memory), flash memories, magnetic cards or optical line cards. That is, readable media include any media storing or transmitting information in a device (for example, computer) readable form.

Figure 25:
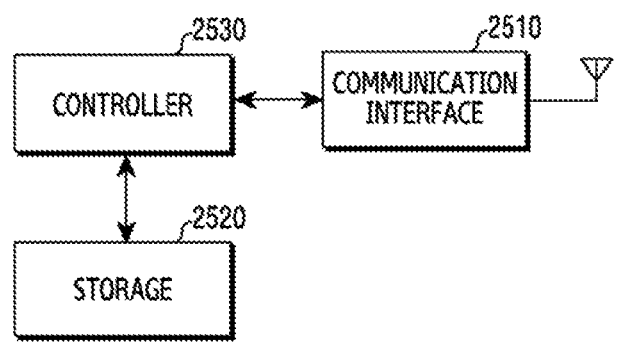
FIG. 25 illustrates an example configuration of a terminal in a wireless communication system, according to an embodiment of the present disclosure.

FIG. 25 illustrates an example configuration of a terminal in a wireless communication system according to an exemplary embodiment of the disclosure. FIG. 25 illustrates an example of a configuration of the receiver or the transmitter of the present disclosure. Hereinafter, the term "unit" or the term ending with the suffix "-er" or "-or" refer to a unit for processing at least one function or operation and these terms may be implemented by using hardware or software or a combination of hardware and software.

Referring to FIG. 25, the terminal includes a communication interface 2510, a storage 2520, and a controller 2530.

The communication interface 2510 performs functions for transmitting and receiving signals via a radio channel. For example, the communication interface 2510 performs a function of converting between a baseband signal and a bit string according to a physical layer standard of a system. For example, when transmitting data, the communication interface 2510 generates complex symbols by encoding and modulating a transmission bit string. In addition, when receiving data, the communication interface 2510 restores a reception bit string by demodulating and decoding a baseband signal. In addition, the communication interface 2510 up-converts a baseband signal into an RF band signal and then transmit the RF band signal through an antenna, and down-converts an RF band signal received through the antenna into a baseband signal. For example, the communication interface 2510 may include a transmission filter, a reception filter, an amplifier, a mixer, an oscillator, a DAC, an ADC, or the like.

The communication interface 2510 may include a plurality of transmission/reception paths. The communication interface 2510 may include at least one antenna array configured by a plurality of antenna elements. In view of hardware, the communication interface 2510 may be configured by a digital circuitry and an analog circuitry (e.g., radio frequency integrated circuit (RFIC)). Here, the digital circuitry and analog circuitry may be implemented as one package. Also, the communication interface 2510 may include a plurality of RF chain. The communication interface 2510 may perform beamforming.

Also, the communication interface 2510 may include different communication modules for processing signals of different frequency band. The communication interface 2510 may include a plurality of communication modules for supporting a plurality of different wireless access technologies. For example, the plurality of different wireless access technologies may include Bluetooth low energy (BLE), wireless fidelity (Wi-Fi), Wi-Fi gigabyte (WiGig), cellular network (e.g., long term evolution (LTE)), or the like. Also, different frequency bands may include super high frequency (SHF)(e.g., 2.5 GHz, 5 GHz) band and millimeter wave (e.g., 60 GHz).

The wireless communication interface 2510 transmits and receives signals as described above. Accordingly, the communication interface 2510 may be referred to as a transmission interface, a reception interface, a transmission and reception interface, a transmitter, a receiver or a transceiver. In addition, in the following description, transmitting and receiving performed through a radio channel may include processing by the communication interface 2510 as described above.

The storage 2520 stores data such as a basic program for the operation of the terminal, an application program, setting information, or the like. The storage 2510 may be configured by a volatile memory, a nonvolatile memory, or a combination of a volatile memory and a nonvolatile memory. In addition, the storage 2520 provides stored data in response to a request of the controller 2530.

The controller 2530 controls overall operations of the terminal. For example, the controller 2530 transmits and receives signals through the communication interface 2510. In addition, the controller 2530 records and reads data on and from the storage 2520. The controller 2530 may perform functions of a protocol stack which the communication standard requires. To achieve this, the controller 2530 may include at least one processor or microprocessor or may be a part of the processor. In addition, a part of the communication interface 2510 and the controller 2530 may be referred to as a communication processor (CP). According to exemplary embodiments of the present disclosure, the controller 2530 may include a pseudorandom sequence construction module, a numerical digit random sequence construction module, an interleaving sequence construction module. Here, the pseudorandom sequence construction module, the numerical digit random sequence construction module, the interleaving sequence construction module may be a command/code resided in the controller 2530, storage space that stores the command/code, or a part of circuitry configuring the controller 2530.

According to exemplary embodiments of the present disclosure, the controller 2530 may configured to construct a plurality of pseudorandom sequences according to a pre-defined length of an interleaving sequence, and for each of the constructed pseudorandom sequences, construct at least one corresponding numerical digit random sequence according to a number of more than two types numerical values in the pseudorandom sequence, and for each of the constructed pseudorandom sequences and the corresponding numerical digit random sequence thereof, construct a corresponding interleaving sequence according to a mapping relation between the pseudorandom sequence and the numerical digit random sequence. For example, the controller 2530 may control the terminal to perform operations according to the exemplary embodiments of the present disclosure.

A method for constructing an interleaving sequence is provided. The method includes following steps: constructing a multiple of pseudorandom sequences according to a pre-defined length of an interleaving sequence to be constructed. And for each of the constructed pseudorandom sequences, constructing at least one corresponding numerical digit random sequence according to the number of more than two types numerical values in this pseudorandom sequence, the type of numerical values in the numerical digit random sequence being corresponding to that of numerical values in the pseudorandom sequence, and the number of numerical values of a corresponding type being equal. And for each of the constructed pseudorandom sequences and the corresponding numerical digit random sequence thereof, constructing a corresponding interleaving sequence according to a mapping relation between this pseudorandom sequence and the numerical digit random sequence, so that a multiple of interleaving sequences are allocated and indicated as multiple access signatures.

The method for constructing an interleaving sequence is provided. The constructing a multiple of pseudorandom sequences according to a pre-defined length of an interleaving sequence to be constructed includes determining the length of pseudorandom sequences to be generated according to the pre-defined length, generating a multiple of pseudorandom sequences according to the length of the pseudorandom sequences to be generated, and using the generated pseudorandom sequences as the constructed pseudorandom sequences; or cutting out sequences having the pre-defined length from the generated pseudorandom sequences to serve as the constructed pseudorandom sequences.

The method for constructing an interleaving sequence is provided. The determining the length of pseudorandom sequences to be constructed includes using a length of power of 2 of that being equal to the pre-defined length as the length of the pseudorandom sequences to be generated when the pre-defined length is a length of power of 2, or using a length of power of 2 that being not less than the pre-defined length as the length of the pseudorandom sequences to be generated when the pre-defined length is not power of 2, or using a length of power of an M-ary corresponding to the pre-defined length as the length of the pseudorandom sequences to be generated.

The method for constructing an interleaving sequence is provided. The generating a multiple of pseudorandom sequences according to the length of the pseudorandom sequences to be generated specifically includes determining a multiple of initial states of a multiple of generator polynomials and shift registers according to the length of the pseudorandom sequences to be generated. And the generating a multiple of pseudorandom pre-defined M-ary sequences according to one of the following combinations of the generator polynomials and the initial states: a multiple of different generator polynomials and a multiple of same initial state, a multiple of same generator polynomials and a multiple of different initial states, a multiple of different generator polynomials and a multiple of different initial states and a multiple of same generator polynomials and a multiple of same initial states.

The method for constructing an interleaving sequence is provided. The pseudorandom pre-defined M-ary sequences are specifically binary pseudorandom sequences. And the binary pseudorandom sequences are specifically M-sequences or Gold sequences. And the generating a multiple of pseudorandom pre-defined M-ary sequences according to a multiple of same generator polynomials and a multiple of same initial states comprises at least one of performing multiple cyclic shifts on numerical values in the M-sequences to generate a multiple of M-sequences, performing multiple cyclic shifts on numerical values in the Gold sequences to generate a multiple of Gold sequences, and performing multiple cyclic shifts on numerical values in at least one component M-sequence generating the Gold sequences to generate a multiple of Gold sequences.

The method for constructing an interleaving sequence is provided. The pseudorandom pre-defined M-ary sequences are specifically M-ary pseudorandom sequences. And the pseudorandom sequences are specifically original M-ary pseudorandom sequences or synthesized M-ary pseudorandom sequences, wherein the synthesized M-ary pseudorandom sequences are generated by performing bitwise summation and then bitwise modulo-M on more than two original M-ary pseudorandom sequences having the same length. And the generating a multiple of pseudorandom pre-defined M-ary sequences according to a multiple of same generator polynomials and a multiple of same initial states comprises at least one of performing multiple cyclic shifts on numerical values in the original M-ary pseudorandom sequences to obtain a multiple of original M-ary pseudorandom sequences, cutting out sequences having the pre-defined length from a multiple of starting positions of the original M-ary pseudorandom sequences to obtain a multiple of original M-ary pseudorandom sequences, performing multiple cyclic shifts on numerical values in the synthesized M-ary pseudorandom sequences to obtain a multiple of synthesized M-ary pseudorandom sequences, performing multiple cyclic shifts on numerical values in at least one original M-ary pseudorandom sequence generating the synthesized M-ary pseudorandom sequences to generate a multiple of synthesized M-ary pseudorandom sequences, and cutting out sequences having the pre-defined length from a multiple of starting positions of the synthesized M-ary pseudorandom sequences to obtain a multiple of synthesized M-ary pseudorandom sequences.

The method for constructing an interleaving sequence is provided. The pseudorandom pre-defined M-ary sequences are specifically binary pseudorandom sequences. And the determining the length of pseudorandom sequences to be generated according to the pre-defined length further includes using a length of power of 2 that being less than the pre-defined length as the length of the pseudorandom sequences to be generated when the pre-defined length is not a length of power of 2. And the generating a multiple of pseudorandom sequences according to the length of the pseudorandom sequences to be generated further includes determining a multiple of initial states of a multiple of generator polynomials and shift registers according to the length of power of 2 that being less than the pre-defined length, and generating binary pseudorandom sequences having a total length equal to the pre-defined length and having more than two cycles according to a specified combination of the generator polynomials and the initial states, wherein the last one cycle of the more than two cycles is a complete cycle or an incomplete cycle.

The method for constructing an interleaving sequence is provided. The method further includes following steps: generating binary pseudorandom sequences having more than two periodicities of pre-defined length, and cutting out sequences having the pre-defined length from a multiple of starting positions of the binary pseudorandom sequences having a total length greater than the pre-defined length, to serve as a multiple of generated pseudorandom sequences.

The method for constructing an interleaving sequence is provided. The constructing at least one corresponding numerical digit random sequence according to the number of numerical values of more than two types in this pseudorandom sequence specifically includes for each of the constructed pseudorandom sequences, padding numerical values of this pseudorandom sequence according to the difference in the number of numerical values of each type in this pseudorandom sequence when the pre-defined length is a length of power of 2, and generating at least one numerical digit random sequence having numerical values of a type corresponding to the type of numerical values in the pseudorandom sequence padded with numerical values and having an equal number of corresponding numerical values.

The method for constructing an interleaving sequence is provided. For each of the constructed pseudorandom sequences, padding numerical values of this pseudorandom sequence according to the difference in the number of numerical values of each type in this pseudorandom sequence includes one of the following: when the constructed pseudorandom sequence is specifically an M-sequence, the pre-defined length is a length of power of 2 and the number of 0 is less than that of 1 in this M-sequence, padding 0 to this M-sequence, and when the constructed pseudorandom sequence is specifically a Gold sequence, the pre-defined length is a length of power of 2 and the number of 0 is not equal to that of 1 in this Gold sequence, padding a numerical value having the minimum number to this Gold sequence.

The method for constructing an interleaving sequence is provided. The constructing at least one corresponding numerical digit random sequence according to the number of numerical values of more than two types in this pseudorandom sequence includes for each of the constructed pseudorandom sequences, generating at least one numerical digit random sequence having numerical values of a type corresponding to the type of numerical values in the pseudorandom sequence and having an equal number of corresponding numerical values, when the constructed pseudorandom sequence is specifically a pseudorandom binary sequence and the pre-defined length is not a length of power of 2, and padding a numerical value having the maximum number to each generated numerical digit random sequence.

The method for constructing an interleaving sequence is provided. For each of the constructed pseudorandom sequences, constructing at least one corresponding numerical digit random sequence according to the number of numerical values of more than two types in this pseudorandom sequence further includes for one pseudorandom sequence, determining the type of numerical values and the number of numerical values of each type in this pseudorandom sequence; and using another pseudorandom sequence having a corresponding numerical value type and an equal number of numerical values of a corresponding type as a numerical digit random sequence of this pseudorandom sequence.

The method for constructing an interleaving sequence is provided. For each of the constructed pseudorandom sequences and the corresponding numerical digit random sequence thereof, constructing a corresponding interleaving sequence according to a mapping relation between this pseudorandom sequence and the numerical digit random sequence specifically includes: for one sequence of the numerical digit random sequence and the pseudorandom sequence, for each numerical value type in the one sequence, mapping numerical values of this numerical value type to numerical values of a type corresponding to this numerical value type in the other sequence, respectively, and for each numerical value in the other sequence, replacing this numerical value with the position number of a numerical value in the one sequence to which this numerical value is mapped, to obtain the interleaving sequence.

The method for constructing an interleaving sequence is provided. The pseudorandom pre-defined M-ary sequences are specifically binary pseudorandom sequences. And the determining the length of pseudorandom sequences to be generated according to the pre-defined length further includes dividing the pre-defined length into a multiple of lengths of power of 2, to serve as lengths of a multiple of pseudorandom sequences to be generated, respectively. And the generating a multiple of pseudorandom sequences according to the length of the pseudorandom sequences to be constructed further includes: for each of the divided lengths of power of 2, generating a pseudorandom binary sequence according to the length of power of 2 to serve as a pseudorandom binary sequence having the length of power of 2. And the constructing at least one corresponding numerical digit random sequence according to the number of numerical values of more than two types in this pseudorandom sequence further includes: for each of the binary pseudorandom sequences having the length of power of 2, constructing a numerical digit random sequence having the length of power of 2 according to the number of numerical values of more than two types in this pseudorandom binary sequence. And the step of, for each of the constructed pseudorandom sequences and the corresponding numerical digit random sequence thereof, constructing a corresponding interleaving sequence according to a mapping relation between this pseudorandom sequence and the numerical digit random sequence specifically includes: according to a mapping relation between each numerical digit random sequence having the length of power of 2 and the pseudorandom binary sequence, constructing an interleaving sequence having the length of power of 2, and cascadeding the interleaving sequences having the length of power of 2 to form a sequence having the pre-defined length, to serve as the constructed interleaving sequence.

The method for constructing an interleaving sequence is provided. The using the generated pseudorandom sequences as the constructed pseudorandom sequences includes using the generated pseudorandom sequences as the constructed pseudorandom sequences when the length of the generated pseudorandom sequences is greater than the pre-defined length. And the step of, for each of the constructed pseudorandom sequences and the corresponding numerical digit random sequence thereof, constructing a corresponding interleaving sequence according to a mapping relation between this pseudorandom sequence and the numerical digit random sequence includes: for each of the constructed pseudorandom sequences and the corresponding numerical digit random sequence thereof, constructing an interleaving sequence having a same length as this pseudorandom sequence according to the mapping relation between this pseudorandom sequence and the numerical digit random sequence, and modifying the interleaving sequence having the same length as this pseudorandom sequence to obtain an interleaving sequence having the pre-defined length.

The method for constructing an interleaving sequence is provided. The modifying the interleaving sequence having the same length as this pseudorandom sequence to obtain an interleaving sequence having the pre-defined length includes: for the interleaving sequence having the same length as this pseudorandom sequence, replacing a former numerical value greater than a pre-defined threshold in this interleaving sequence with a later numerical value not greater than the threshold until all the numerical values within the pre-defined length, starting from the first bit, are not greater than the threshold; and, cutting out, starting from the first bit, a sequence having the pre-defined length to serve as the constructed interleaving sequence, or using a value having the pre-defined length as a threshold, and removing numerical values greater than the threshold from the interleaving sequence having a same length as this pseudorandom sequence.

The method for constructing an interleaving sequence is provided. The interleaving sequences to be constructed are specifically a multiple of interleaving sequences to be constructed. And the method for constructing interleaving sequences further includes determining the largest pre-defined length of a multiple of interleaving sequences to be constructed, constructing a multiple of pseudorandom sequences according to the largest pre-defined length, and for each of other pre-defined lengths other than the largest pre-defined length, cutting out sequences having the each of other pre-defined lengths from the pseudorandom sequences constructed according to the largest pre-defined length, to serve as a pseudorandom sequence corresponding to the each of other pre-defined lengths.

The method for constructing an interleaving sequence is provided. The method further includes determining the smallest pre-defined length of a multiple of interleaving sequences to be constructed, constructing a multiple of pseudorandom sequences according to the smallest pre-defined length, and for each of other pre-defined lengths other than the smallest pre-defined length, cascadeding interleaving sequences generated from the pseudorandom sequences constructed according to the smallest pre-defined length, to form a sequence having the each of other pre-defined lengths and simply interleaving the cascaded sequence having the each of other pre-defined lengths to serve as an interleaving sequence corresponding to the each of other pre-defined lengths. The simple interleaving includes at least one of the following: block interleaving and convolution interleaving.

A method for processing information based on interleaving is provided. The method includes following steps: constructing a multiple of the following sequences according to a pre-defined length of an interleaving sequence to be constructed: interleaving sequences, or a combination of pseudorandom sequences and numerical digit random sequences, the type of numerical values in the numerical digit random sequences being corresponding to that of numerical values in the pseudorandom sequences and the number of numerical values of a corresponding type being equal, allocating and then indicating sequence information of the constructed sequences, and processing an information sequence to be transmitted or a received information sequence according to the allocated interleaving sequence or a combination of pseudorandom sequences and numerical digit random sequences.

The method for processing information based on interleaving is provided. The step of constructing a multiple of interleaving sequences according to a pre-defined length of an interleaving sequence to be constructed includes constructing a multiple of pseudorandom sequences according to the pre-defined length of the interleaving sequence to be constructed, for each of the constructed pseudorandom sequences, constructing at least one corresponding numerical digit random sequence according to the number of numerical values of more than two types in this pseudorandom sequence, and for each of the constructed pseudorandom sequences and the corresponding numerical digit random sequence thereof, constructing a corresponding interleaving sequence according to a mapping relation between this pseudorandom sequence and the numerical digit random sequence.

The method for processing information based on interleaving is provided. The step of constructing a multiple of pseudorandom sequences according to the pre-defined length of the interleaving sequence to be constructed includes determining the length of pseudorandom sequences to be generated according to the pre-defined length, generating a multiple of pseudorandom sequences according to the length of the pseudorandom sequences to be generated, and using the generated pseudorandom sequences as the constructed pseudorandom sequences, or cutting out sequences having the pre-defined length from the generated pseudorandom sequences to serve as the constructed pseudorandom sequences.

The method for processing information based on interleaving is provided. The generating a multiple of pseudorandom sequences according to the length of the pseudorandom sequences to be generated specifically includes determining a multiple of initial states of a multiple of generator polynomials and shift registers according to the length of the pseudorandom sequences to be generated. And the generating a multiple of pseudorandom pre-defined M-ary sequences according to one of the following combinations of the generator polynomials and the initial states: a multiple of different generator polynomials and a multiple of same initial state, a multiple of same generator polynomials and a multiple of different initial states, a multiple of different generator polynomials and a multiple of different initial states, and a multiple of same generator polynomials and a multiple of same initial states.

The method for processing information based on interleaving is provided. The pseudorandom pre-defined M-ary sequences are specifically binary pseudorandom sequences. And the binary pseudorandom sequences are specifically M-sequences or Gold sequences. And the generating a multiple of pseudorandom pre-defined M-ary sequences according to a multiple of same generator polynomials and a multiple of same initial states includes at least one of the following: performing multiple cyclic shifts on numerical values in the M-sequences to generate a multiple of M-sequences, performing multiple cyclic shifts on numerical values in the Gold sequences to generate a multiple of Gold sequences, and performing multiple cyclic shifts on numerical values in at least one component M-sequence generating the Gold sequences to generate a multiple of Gold sequences.

The method for processing information based on interleaving is provided. The step of, for each of the constructed pseudorandom sequences and the corresponding numerical digit random sequence thereof, constructing a corresponding interleaving sequence according to a mapping relation between this pseudorandom sequence and the numerical digit random sequence specifically includes: for one sequence of the numerical digit random sequence and the pseudorandom sequence, for each numerical value type in the one sequence, mapping numerical values of this numerical value type to numerical values of a type corresponding to this numerical value type in the other sequence, and for each numerical value in the other sequence, replacing this numerical value with the position number of a numerical value in the one sequence to which this numerical value is mapped, to obtain the interleaving sequence.

The method for processing information based on interleaving is provided. The using the generated pseudorandom sequences as the constructed pseudorandom sequences specifically includes: using the generated pseudorandom sequences as the constructed pseudorandom sequences when length of the generated pseudorandom sequences is greater than the pre-defined length. And the step of, for each of the constructed pseudorandom sequences and the corresponding numerical digit random sequence thereof, constructing a corresponding interleaving sequence according to a mapping relation between this pseudorandom sequence and the numerical digit random sequence specifically includes: for each of the constructed pseudorandom sequences and the corresponding numerical digit random sequence thereof, constructing an interleaving sequence having a same length as this pseudorandom sequence according to the mapping relation between this pseudorandom sequence and the numerical digit random sequence, and modifying the interleaving sequence having the same length as this pseudorandom sequence to obtain an interleaving sequence having the pre-defined length.

The method for processing information based on interleaving is provided. The sequence information is indicated by, but not limited to, any one of the followings: a physical broadcast channel, a physical downlink control channel and a high-layer signaling. And the sequence information includes: a pre-defined length of an interleaving sequence, a pre-defined M-ary sequences of a pseudorandom sequence, generator polynomials, and initial states of a shift register. And the sequence information further includes at least one of the following: the number of cyclic shifts performed on the pseudorandom sequences and/or the interleaving sequences, an arrangement order of numerical values in the numerical digit random sequences, and starting positions from which the pseudorandom sequences are cut out from the original sequences.

The method for processing information based on interleaving is provided. The step of processing an information sequence to be transmitted or a received information sequence according to the allocated interleaving sequence or a combination of pseudorandom sequences and numerical digit random sequences specifically includes: interleaving and then transmitting the information sequence to be transmitted according to the allocated interleaving sequence or a combination of pseudorandom sequences and numerical digit random sequences, and/or de-interleaving the received interleaved information sequence according to the allocated interleaving sequence or a combination of pseudorandom sequences and numerical digit random sequences.

The method for processing information based on interleaving is provided. The step of interleaving the information sequence to be transmitted according to the combination of allocated pseudorandom sequences and numerical digit random sequences specifically includes: for one of the allocated pseudorandom sequence and the corresponding numerical digit random sequence thereof, dividing the information sequence to be transmitted into information subsequences of a same number as the number of types of numerical values, according to the type and position of numerical values in the one sequence, determining a correspondence between each numerical value type in the other sequence and each information subsequence, and successively acquiring and outputting numerical values from an information subsequence corresponding to each numerical value type according to the type and position order of numerical values in the other sequence, to obtain an interleaved information sequence.

The method for processing information based on interleaving is provided. The dividing the information sequence to be transmitted into information subsequences of a same number as the number of types of numerical values according to the type and position of numerical values in the one sequence specifically includes: for each numerical value type in the one sequence, mapping the positions of numerical values of this numerical value type in the one sequence to corresponding positions in the information sequence, and acquiring numerical values at the corresponding positions one by one according to the order of the corresponding positions in the information sequence, to form an information subsequence corresponding to this numerical value type.

The method for processing information based on interleaving is provided. The successively acquiring and outputting numerical values from an information subsequence corresponding to each numerical value type according to the type and position order of numerical values in the other sequence specifically includes: pointing to the last bit from the first bit in the other sequence, determining the type of a numerical value at this position, and then determining an information subsequence corresponding to this numerical value type, and acquiring and outputting a first numerical value which has not been acquired from the information subsequence.

The method for processing information based on interleaving is provided. The step of interleaving the information sequence to be transmitted according to the combination of allocated pseudorandom sequences and numerical digit random sequences further includes: for one sequence of the allocated pseudorandom sequence and the corresponding numerical digit random sequence thereof, constructing each divided sequence according to the position of each numerical value in the one sequence, each numerical value type of the one sequence being corresponding to one divided sequence, and the number of numerical values of this type being equal to the number of numerical values in the corresponding divided sequence, constructing each combined sequence according to the position of each numerical value in the other sequence, each numerical value type of the other sequence being corresponding to one combined sequence, the number of numerical values of this type being equal to the number of numerical values in the corresponding combined sequence, dividing the information sequence to be transmitted into information subsequences of a same number as the number of the divided sequences, according to the numerical values in each divided sequence, determining an output order of numerical values in each of the information subsequences according to the numerical values in each combined subsequence, and outputting numerical values of each of the information subsequences according to the determined output order, to obtain an interleaved information sequence.

The method for processing information based on interleaving is provided. The constructing each divided sequence according to the position of each numerical value in the one sequence specifically includes: for each numerical value in the one sequence, using the position number of this numerical value in the one sequence as a numerical value in the corresponding divided sequence. And the constructing each combined sequence according to the position of each numerical value in the other sequence specifically includes for each numerical value in the other sequence, using the position number of this numerical value in the other sequence as a numerical value of the corresponding combined sequence.

The method for processing information based on interleaving is provided. The method further includes simply interleaving at least one of the following sequences: the information sequences before interleaving, the information subsequences, and the interleaved information sequences, wherein the simple interleaving comprises at least one of the following operations: block interleaving and convolution interleaving.

The method for processing information based on interleaving is provided. The de-interleaving the received interleaved information sequence according to the combination of allocated pseudorandom sequences and numerical digit random sequences specifically includes: for one sequence of the allocated pseudorandom sequence and the corresponding numerical digit random sequence thereof, dividing the interleaved information sequence into interleaved information subsequences of a same number as the number of types of numerical values, according to the type and position of numerical values in the one sequence, determining a correspondence between each numerical value type in the other sequence and each interleaved information subsequence, and successively acquiring and outputting numerical values from an interleaved information subsequence corresponding to each numerical value type according to the type and position order of numerical values in the other sequence, to obtain a de-interleaved information sequence.

A method for processing information based on interleaving is provided. The method includes receiving sequence information indicated to the present apparatus, constructing an interleaving sequence or a combination of pseudorandom sequences and numerical digit random sequences according to the sequence information, the type of numerical values in the numerical digit random sequences being corresponding to the type of numerical values in the pseudorandom sequences, and the number of numerical values of a corresponding type being equal, and processing a received information sequence or an information sequence to be transmitted according to the constructed interleaving sequence or a combination of pseudorandom sequences and numerical digit random sequences.

A device for constructing an interleaving sequence is provided. The device includes a pseudorandom sequence construction module, configured to construct a multiple of pseudorandom sequences according to a pre-defined length of an interleaving sequence to be constructed, a numerical digit random sequence construction module, configured to, for each of the constructed pseudorandom sequences, construct at least one corresponding numerical digit random sequence according to the number of numerical values of more than two types in this pseudorandom sequence, the type of numerical values in the numerical digit random sequence being corresponding to that of numerical values in the pseudorandom sequence, and the number of numerical values of a corresponding type being equal, and an interleaving sequence construction module, configured to, for each of the constructed pseudorandom sequences and the corresponding numerical digit random sequence thereof, construct a corresponding interleaving sequence according to a mapping relation between this pseudorandom sequence and the numerical digit random sequence, so that a multiple of interleaving sequences are allocated and indicated as multiple access signatures.

A transmitter is provided. The transmitter includes a sequence construction module, configured to construct a multiple of the following sequences according to a pre-defined length of an interleaving sequence to be constructed: an interleaving sequence, or a combination of pseudorandom sequences and numerical digit random sequences, the type of numerical values in the numerical digit random sequences being corresponding to that of numerical values in the pseudorandom sequences and the number of numerical values of a corresponding type being equal, a sequence information allocation and indicating module, configured to allocate and then indicate sequence information of the constructed sequences, and an information processing module, configured to process an information sequence to be transmitted or a received information sequence according to the allocated interleaving sequence or a combination of interleaving sequences or pseudorandom sequences and numerical digit random sequences.

A receiver is provided. The receiver includes a sequence information receiving module, configured to receive sequence information indicated to the present apparatus, a sequence construction module, configured to construct an interleaving sequence or a combination of pseudorandom sequences and numerical digit random sequences according to the sequence information, the type of numerical values in the numerical digit random sequences being corresponding to the type of numerical values in the pseudorandom sequences, and the number of numerical values of a corresponding type being equal, and an information processing module, configured to process a received information sequence or an information sequence to be transmitted according to the constructed interleaving sequence or a combination of pseudorandom sequences and numerical digit random sequences.

It should be understood by one of ordinary skill in the art that computer program instructions can be used to realize each block in structure diagrams and/or block diagrams and/or flowcharts as well as a combination of blocks in the structure diagrams and/or block diagrams and/or flowcharts. It should be understood by one of ordinary skill in the art that these computer program instructions can be provided to general purpose computers, special purpose computers or other processors of programmable data processing means to be implemented, so that solutions designated in a block or blocks of the structure diagrams and/or block diagrams and/or flow diagrams are executed by computers or other processors of programmable data processing means.

It should be understood by one of ordinary skill in the art that the steps, measures and solutions in the operations, methods and flows already discussed in the present disclosure can be alternated, changed, combined or deleted. Further, other steps, measures and solutions in the operations, methods and flows already discussed in the present disclosure can also be alternated, changed, rearranged, decomposed, combined or deleted. Further, the steps, measures and solutions in the art in the operations, methods and operations disclosed in the present disclosure can also be alternated, changed, rearranged, decomposed, combined or deleted.

The foregoing descriptions are merely some implementations of the present disclosure. It should be noted that, to a person of ordinary skill in the art, various improvements and modifications can be made without departing from the principle of the present disclosure, and these improvements and modifications shall be regarded as falling into the protection scope of the present disclosure.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method performed by an apparatus for interleaving an information sequence by constructing an interleaving sequence for non-orthogonal multiple access (NOMA), the method comprising:
   receiving, by a transceiver of the apparatus, an information sequence;
   constructing, by at least one processor of the apparatus, a pseudorandom sequence, wherein a length of the pseudorandom sequence is equal to a pre-defined length of an interleaving sequence to be constructed and wherein each position of the pseudorandom sequence includes one of a first at least two numerical values;
   constructing, by the at least one processor of the apparatus, a corresponding numerical digit random sequence, wherein a length of the corresponding numerical digit random sequence is equal to the length of the pseudorandom sequence and wherein each position of the corresponding numerical digit random sequence includes one of a second at least two numerical values;
   constructing, by the at least one processor of the apparatus, an interleaving sequence of the apparatus for the NOMA by mapping values of the positions between the pseudorandom sequence and the corresponding numerical digit random sequence;
   generating, by the at least one processor of the apparatus, an interleaved information sequence by interleaving the information sequence based on the constructed interleaving sequence and
   transmitting, by the transceiver of the apparatus, the generated interleaved information sequence to another apparatus.

2. The method of claim 1, wherein the constructing of the pseudorandom sequence further comprises:
   generating a base pseudorandom sequence; and
   using the base pseudorandom sequence as the constructed pseudorandom sequence or extracting the constructed pseudorandom sequence by removing part of a sequence from the base pseudorandom sequence such that the length of the constructed pseudorandom sequence is the pre-defined length of the interleaving sequence to be constructed.

3. The method of claim 2, wherein the generating of the base pseudorandom sequence further comprises:
  determining a generator polynomial and an initial state for at least one M-ary sequence generator with shift registers according to the length of the pseudorandom sequence;
  constructing the M-ary sequence generator using the generator polynomial and the initial state for the shift registers; and
  generating a base pseudorandom M-ary sequence using the constructed M-ary sequence generator.

4. The method of claim 3, wherein the base pseudorandom M-ary sequence comprises a binary pseudorandom sequence, and
  wherein the binary pseudorandom sequence comprises an M-sequence or a Gold sequence.

5. The method of claim 4, wherein the first at least two numerical values includes two numerical values; and
  wherein the generating of the base pseudorandom M-ary sequence further comprises:
    generating the binary pseudorandom sequence using the constructed M-ary sequence generator; and
    padding one numerical value among the two numerical values to the generated binary pseudorandom sequence such that a number of the one numerical value in the binary pseudorandom sequence is equal to a number of another numerical value in the binary pseudorandom sequence.

6. The method of claim 3, wherein the generating of the base pseudorandom M-ary sequence comprises:
  generating the base pseudorandom M-ary sequence by synthesizing M-ary sequences, and
  wherein the synthesizing of M-ary sequences comprises:
    performing bitwise summation and bitwise modulo-M on more than two M-ary sequences generated using constructed M-ary sequence generators with different initial states or different generator polynomials.

7. The method of claim 2, wherein the constructing of the interleaving sequence further comprises:
  mapping each of the first at least two numerical values in the constructed pseudorandom sequence to a corresponding numerical value of the second at least two numerical values in the corresponding numerical digit random sequence, respectively; and
  replacing each numerical value in the constructed pseudorandom sequence with a position number of a numerical value in the corresponding numerical digit random sequence to which the each numerical value in the constructed pseudorandom sequence is mapped, to obtain the interleaving sequence.

8. The method of claim 2, wherein the using of the base pseudorandom sequence as the constructed pseudorandom sequence comprises:
  using the base pseudorandom sequence as the constructed pseudorandom sequence when the length of the base pseudorandom sequence is greater than the pre-defined length, and
  wherein the constructing of the interleaving sequence comprises:
    constructing an interleaving sequence having the length of the base pseudorandom sequence by mapping values of the positions between this pseudorandom sequence and the corresponding numerical digit random sequence; and
    modifying the interleaving sequence having the length of the base pseudorandom sequence to obtain an interleaving sequence having the pre-defined length.

9. The method of claim 2, wherein the interleaving sequence comprises a plurality of interleaving sequences, and
  wherein the constructing of the interleaving sequence further comprises:
    determining the largest pre-defined length of a plurality of interleaving sequences to be constructed;
    constructing a plurality of pseudorandom sequences according to the largest pre-defined length; and
    for each of other pre-defined lengths other than the largest pre-defined length, extracting sequences having the each of other pre-defined lengths from the pseudorandom sequences constructed according to the largest pre-defined length, to serve as a pseudorandom sequence corresponding to the each of other pre-defined lengths.

10. An apparatus for interleaving an information sequence by constructing an interleaving sequence for non-orthogonal multiple access (NOMA), the apparatus comprising:
  at least one processor;
  a memory; and
  a transceiver operatively connected to the at least one processor,
  wherein the at least one processor is configured to:
    control the transceiver to receive an information sequence,
    construct a plurality of pseudorandom sequences, wherein a length of the pseudorandom sequence is equal to a pre-defined length of an interleaving sequence to be constructed, and wherein each position of the pseudorandom sequence includes one of a first at least two numerical values,
    construct a corresponding numerical digit random sequence, wherein a length of the corresponding numerical digit random sequence is equal to the length of the pseudorandom sequence and wherein each position of the corresponding numerical digit random sequence includes one of a second at least two numerical values,
    construct an interleaving sequence of the apparatus for the NOMA by mapping values of the position between the pseudorandom sequence and the corresponding numerical digit random sequence,
    generate an interleaved information sequence by interleaving the information sequence based on the constructed interleaving sequence, and
    control the transceiver to transmit the generated interleaved information sequence to another apparatus.

11. The apparatus of claim 10, wherein the at least one processor is further configured to:
  generate a base pseudorandom sequence; and
  use the base pseudorandom sequences as the constructed pseudorandom sequences or extract the constructed pseudorandom sequence by removing part of a sequence from the base pseudorandom sequence such that the length of the constructed pseudorandom sequence is the pre-defined length of the interleaving sequence to be constructed.

12. The apparatus of claim 11, wherein the at least one processor is further configured to:

determine a generator polynomial and an initial state for at least one M-ary sequence generator with shift registers according to the length of the pseudorandom sequences;

construct the M-ary sequence generator using the generator polynomial and the initial state for the shift registers; and generate a base pseudorandom M-ary sequence using the constructed M-ary sequence generator.

13. The apparatus of claim 12, wherein the base pseudorandom M-ary sequence comprises a binary pseudorandom sequence, and wherein the binary pseudorandom sequence comprises an M-sequence or a Gold sequence.

14. The apparatus of claim 13, wherein the first at least two numerical values includes two numerical values; and wherein the at least one processor is further configured to:

generate the binary pseudorandom sequence using the constructed M-ary sequence generator; and pad one numerical value among the two numerical values to the generated binary pseudorandom sequence such that a number of the one numerical value in the binary pseudorandom sequence is equal to a number of another numerical value in the binary pseudorandom sequence.

15. The apparatus of claim 12, wherein the at least one processor is further configured to:

generate the base pseudorandom M-ary sequence by synthesizing M-ary sequences, and wherein the synthesized M-ary sequences are generated by performing bitwise summation and bitwise modulo-M on more than two M-ary sequences generated using constructed M-ary sequence generators with different initial states or different generator polynomials.

16. The apparatus of claim 11, wherein the at least one processor is further configured to:

map each of the first at least two numerical values in the constructed pseudorandom sequence to corresponding numerical values of the second at least two numerical values in the corresponding numerical digit random sequence, respectively; and replace each numerical value in the constructed pseudorandom sequence with a position number of a numerical value in the corresponding numerical digit random sequence to which the each numerical value in the constructed pseudorandom sequence is mapped, to obtain the interleaving sequence.

17. The apparatus of claim 11, wherein the base pseudorandom sequence is used as the constructed pseudorandom sequence when the length of the base pseudorandom sequence is greater than the pre-defined length, and wherein the at least one processor is further configured to:

construct an interleaving sequence having the length of the base pseudorandom sequence by mapping values of the position between this pseudorandom sequence and the corresponding numerical digit random sequence; and modify the interleaving sequence having the same length of the base pseudorandom sequence to obtain an interleaving sequence having the pre-defined length.

18. The apparatus of claim 11, wherein the interleaving sequence comprise a plurality of interleaving sequences, and wherein the at least one processor is further configured to:

determine the largest pre-defined length of a plurality of interleaving sequences to be constructed;

construct a plurality of pseudorandom sequences according to the largest pre-defined length; and for each of other pre-defined lengths other than the largest pre-defined length, extracting sequences having the each of other pre-defined lengths from the pseudorandom sequences constructed according to the largest pre-defined length, to serve as a pseudorandom sequence corresponding to the each of other pre-defined lengths.

* * * * *